US009812463B2

United States Patent
Sharangpani et al.

(10) Patent No.: US 9,812,463 B2
(45) Date of Patent: *Nov. 7, 2017

(54) THREE-DIMENSIONAL MEMORY DEVICE CONTAINING VERTICALLY ISOLATED CHARGE STORAGE REGIONS AND METHOD OF MAKING THEREOF

(71) Applicant: SANDISK TECHNOLOGIES LLC, Plano, TX (US)

(72) Inventors: Rahul Sharangpani, Fremont, CA (US); Raghuveer S. Makala, Campbell, CA (US); Senaka Kanakamedala, Milpitas, CA (US); Fei Zhou, Milpitas, CA (US); Somesh Peri, San Jose, CA (US); Masanori Tsutsumi, Yokkaichi (JP); Keerti Shukla, Saratoga, CA (US); Yusuke Ikawa, Yokkaichi (JP); Kiyohiko Sakakibara, Yokkaichi (JP); Eisuke Takii, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/250,185

(22) Filed: Aug. 29, 2016

(65) Prior Publication Data
US 2017/0278859 A1    Sep. 28, 2017

Related U.S. Application Data

(63) Continuation-in-part of application No. 15/158,954, filed on May 19, 2016.
(Continued)

(51) Int. Cl.
*H01L 21/00*    (2006.01)
*H01L 27/11582*    (2017.01)
(Continued)

(52) U.S. Cl.
CPC .... *H01L 27/11582* (2013.01); *H01L 21/0214* (2013.01); *H01L 21/0217* (2013.01);
(Continued)

(58) Field of Classification Search
CPC ........... H01L 27/11582; H01L 21/0214; H01L 21/0217; H01L 21/02247; H01L 21/02326;
(Continued)

(56) References Cited

U.S. PATENT DOCUMENTS

| 5,084,417 | A | 1/1992 | Joshi et al. |
| 5,563,105 | A | 10/1996 | Dobusinsky et al. |

(Continued)

FOREIGN PATENT DOCUMENTS

| JP | 2009-289950 A | 12/2009 |
| WO | WO 02/15277 A2 | 2/2002 |

(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Nicholas Tobergte
(74) *Attorney, Agent, or Firm* — The Marbury Law Group PLLC

(57) ABSTRACT

A memory opening can be formed through an alternating stack of insulating layers and sacrificial material layers provided over a substrate. Annular etch stop material portions are provided at each level of the sacrificial material layers around the memory opening. The annular etch stop material portions can be formed by conversion of surface portions of the sacrificial material layers into dielectric
(Continued)

material portion, or by recessing the sacrificial material layers around the memory opening and filling indentations around the memory opening. After formation of a memory stack structure, the sacrificial material layers are removed from the backside. The annular etch stop material portions are at least partially converted to form charge trapping material portions. Vertical isolation of the charge trapping material portions among one another around the memory stack structure minimizes leakage between the charge trapping material portions located at different word line levels.

26 Claims, 39 Drawing Sheets

Related U.S. Application Data

(60) Provisional application No. 62/313,234, filed on Mar. 25, 2016.

(51) Int. Cl.
*H01L 29/51* (2006.01)
*H01L 21/02* (2006.01)
*H01L 27/11573* (2017.01)

(52) U.S. Cl.
CPC .. *H01L 21/02247* (2013.01); *H01L 21/02326* (2013.01); *H01L 27/11573* (2013.01); *H01L 29/513* (2013.01); *H01L 29/518* (2013.01)

(58) Field of Classification Search
CPC . H01L 27/11573; H01L 29/513; H01L 29/518
See application file for complete search history.

(56) References Cited

U.S. PATENT DOCUMENTS

| | | | |
|---|---|---|---|
| 5,807,788 A | 9/1998 | Brodsky et al. |
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,691,442 B2 | 4/2010 | Gandikota et al. |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 7,906,392 B2 | 3/2011 | Dunton et al. |
| 8,008,710 B2 | 8/2011 | Fukuzumi |
| 8,053,829 B2 | 11/2011 | Kang et al. |
| 8,084,819 B2 | 12/2011 | Kim et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,461,641 B2 | 6/2013 | Alsmeier et al. |
| 8,610,194 B2 | 12/2013 | Aritome |
| 8,658,499 B2 | 2/2014 | Makala et al. |
| 8,735,962 B2 | 5/2014 | Whang et al. |
| 8,767,465 B2 | 7/2014 | Chang et al. |
| 8,823,076 B2 | 9/2014 | Lee et al. |
| 8,853,765 B2 | 10/2014 | Lee et al. |
| 8,877,590 B1 | 11/2014 | Lee |
| 8,884,357 B2 | 11/2014 | Wang et al. |
| 8,981,457 B2 | 3/2015 | Lee et al. |
| 8,987,089 B1 | 3/2015 | Pachamuthu et al. |
| 8,987,119 B2 | 3/2015 | Dunton et al. |
| 9,023,719 B2 | 5/2015 | Pachamuthu et al. |
| 9,230,973 B2 | 1/2016 | Pachamuthu et al. |
| 9,252,151 B2 | 2/2016 | Chien et al. |
| 9,397,093 B2 | 7/2016 | Makala et al. |
| 9,412,790 B1 | 8/2016 | Clark et al. |
| 9,443,861 B1 | 9/2016 | Pachamuthu et al. |
| 2007/0029607 A1 | 2/2007 | Kouznetzov |
| 2007/0210338 A1 | 9/2007 | Orlowski |
| 2007/0252201 A1 | 11/2007 | Kito et al. |
| 2009/0230454 A1 | 9/2009 | Pekny |
| 2009/0230458 A1 | 9/2009 | Ishiduki et al. |
| 2009/0283819 A1 | 11/2009 | Ishikawa et al. |
| 2010/0044778 A1 | 2/2010 | Seol |
| 2010/0059811 A1 | 3/2010 | Sekine et al. |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0163968 A1 | 7/2010 | Kim et al. |
| 2010/0181610 A1 | 7/2010 | Kim et al. |
| 2010/0207194 A1 | 8/2010 | Tanaka et al. |
| 2010/0207195 A1 | 8/2010 | Fukuzumi et al. |
| 2010/0213527 A1 | 8/2010 | Shim et al. |
| 2010/0320528 A1 | 12/2010 | Jeong et al. |
| 2011/0018047 A1 | 1/2011 | Komiya |
| 2011/0076819 A1 | 3/2011 | Kim et al. |
| 2011/0133606 A1 | 6/2011 | Yoshida et al. |
| 2011/0156044 A1 | 6/2011 | Lee et al. |
| 2011/0266606 A1 | 11/2011 | Park et al. |
| 2011/0298013 A1 | 12/2011 | Hwang et al. |
| 2011/0309432 A1 | 12/2011 | Ishihara et al. |
| 2012/0001247 A1 | 1/2012 | Alsmeier |
| 2012/0001249 A1 | 1/2012 | Alsmeier |
| 2012/0012921 A1 | 1/2012 | Liu |
| 2012/0083077 A1 | 4/2012 | Yang et al. |
| 2012/0142180 A1 | 6/2012 | Matsushita et al. |
| 2012/0256247 A1 | 10/2012 | Alsmeier |
| 2012/0267699 A1 | 10/2012 | Kiyotoshi |
| 2012/0326221 A1 | 12/2012 | Sinha |
| 2013/0161726 A1 | 6/2013 | Kim et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0080309 A1 | 3/2014 | Park et al. |
| 2014/0131784 A1 | 5/2014 | Davis et al. |
| 2014/0175530 A1 | 6/2014 | Chien et al. |
| 2014/0191312 A1 | 7/2014 | Kim et al. |
| 2014/0220750 A1 | 8/2014 | Sohn et al. |
| 2014/0225181 A1 | 8/2014 | Makala et al. |
| 2014/0332873 A1 | 11/2014 | Yoo |
| 2015/0044833 A1 | 2/2015 | Lee et al. |
| 2015/0076584 A1 | 3/2015 | Pachamuthu et al. |
| 2015/0076585 A1 | 3/2015 | Pachamuthu et al. |
| 2015/0179660 A1 | 6/2015 | Yada et al. |
| 2015/0255481 A1 | 9/2015 | Baenninger et al. |
| 2015/0340274 A1 | 11/2015 | Ryan et al. |
| 2015/0371709 A1 | 12/2015 | Kai et al. |
| 2016/0071860 A1 | 3/2016 | Kai et al. |
| 2016/0071861 A1 | 3/2016 | Serov et al. |
| 2016/0071876 A1 | 3/2016 | Mizuno et al. |
| 2016/0086972 A1 | 3/2016 | Zhang et al. |
| 2016/0133642 A1 | 5/2016 | Jeon et al. |

FOREIGN PATENT DOCUMENTS

WO    WO2009084206 A1    7/2009
WO    WO 2012/052298 A1    4/2012

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

(56) References Cited

OTHER PUBLICATIONS

Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit NAND Flash Possible," Nikkei Electronics Asia, Sep. 17, 2009, 6pgs.
International Search Report & Written Opinion, PCT/US2011/042566, dated Jan. 17, 2012.
Invitation to Pay Additional Fees & Partial International Search Report, PCT/US2011/042566, dated Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/engjish/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", EDM-2010 Proceedings, Dec. 6-8, 2010, pp. 668-671.
Kim, Y.S. et al., "Direct Copper Electroless Deposition on a Tungsten Barrier Layer for Ultralarge Scale Integration," J. Electrochem. Soc., vol. 152, Issue 2, pp. C89-C95, (2005).
Au, Y. et al., "Filling Narrow Trenches by Iodine-Catalyzed CVD of Copper and Manganese on Managanese Nitride Barrier/Adhesion Layers," J. Electrochem. Soc., vol. 158, Issue 5, pp. D248-D253, (2011).
Williams, K.R. et al., "Etch Rates for Micromachining Processing," J. Microelectromechanical Systems, vol. 5, No. 4, pp. 256-269, (1996).
Williams, K.R. et al., "Etch Rates for Micromachining Processing," Part II, J. Microelectromechanical Systems, vol. 12, No. 6, pp. 761-778, (2003).
Claes, M. et al., "Selective Wet Etching of Hf-Based Layers," Abs. 549, 204$^{th}$ Meeting, The Electrochemical Society, Inc., 1 page, (2003).
Non Final Office Action for Corresponding U.S. Appl. No. 14/468,650, filed Aug. 26, 2014, 19 pages, dated Feb. 5, 2016.
Invitation to Pay Additional Fees and Partial International Search Report for PCT/US2015/046035, dated Jan. 22, 2016, 9 pages.
Kang, D. et al., "Improving the Cell Characteristics Using Low-k Gate Spacer in 1Gb NAND Flash Memory," Electron Devices Meeting, IEDM '06 International, IEEE, pp. 1-4, (2006).
International Search Report and Written Opinion for PCT/US2015/046035, dated Mar. 17, 2016, 20 pages.
International Search Report and written Opinion received in connection with international application No. PCT/US2014/045347; dated Oct. 2, 2014.
Office Communication for U.S. Appl. No. 14/748,670, 21 pages, dated Jul. 15, 2016.
International Search Report and Written Opinion for PCT/US2015/055559, dated Apr. 7, 2016, 19 pages.

Invitation to Pay Additional Fees and Communication Relating to the Results of the Partial International Search for PCT/US2015/055559, 10 pages, dated Jan. 26, 2016.
International Searching Report and Written Opinion of the International Searching Authority for PCT/US2015/042220, 24 pages, dated Jan. 18, 2016.
Office Communication for US Patent Application No. 14/748,575, 20 pages, dated Jul. 15, 2016.
Invitation to Pay Additional Fees and Annex to Form PCT/ISA/206 Communication Relating to Results of the Partial International Search for PCT/US2015/042220, dated Oct. 13, 2015.
Al-Shareef, H.N. et al., "Gate Dielectrics Formed by Remote Plasma Nitridation of Ultra Thin In-Situ Steam Generated (ISSG) Oxides," ECS Proc. p. 231, (2009).
Carr, E.C. et al., "N Depth Profiles in Thin SiO2 Grown of Processed in N2O: The Role of Atomic Oxygen," App. Phys. Lett. vol. 66, No. 12, pp. 1492-1494, (1995).
Hoff, A.M. et al., "Atomic Oxygen and the Thermal Oxidation of Silicon," Appl. Phys. Lett., vol. 52, No. 15, pp. 1264-1265, (1988).
Ludsteck, A. et al., "Optimization of Thin, Nitrogen-Rich Silicon Oxynitrides Grown by Rapid Thermal Nitridation," Journal of the Electrochemical Society, vol. 152, No. 5, pp. G334-G338, (2005).
Moslehi, M.M. et al., "Rapid Thermal Nitridation of SiO2 for Nitroxide Thin Dielectrics," Appl. Phys. Lett., vol. 47, No. 10, pp. 1113-1115, (1985).
Sundaresan, R. et al., "Rapid-Thermal Nitridation of SiO2 for Radiation-Hardened MOS Gate Dielectrics," IEEE Transactions on Nuclear Science, vol. NS-33, No. 6, pp. 1223-1227, (1986).
Wrazien, S. J. et al., "Characterization of SONOS Oxynitride Nonvolatile Semiconductor Memory Devices," Solid-State Electronics, vol. 47, No. 5, pp. 885-891, (2003).
Xu, D. et al., "Effects of Oxgen Content and Oxide Layer Thickness on Interface State Densities for Meta-Oxynitride-Oxide-Silicon Devices," J. App. Phys., No. 70, No. 3, pp. 1570-1574, (1991).
U.S. Appl. No. 14/282,567, filed May 20, 2014, SanDisk Technologies Inc.
U.S. Appl. No. 14/319,283, filed Jun. 30, 2004, SanDisk Technologies Inc.
U.S. Appl. No. 14/468,650, filed Aug. 26, 2014, SanDisk Technologies Inc.
U.S. Appl. No. 15/012,082, filed Feb. 1, 2016, SanDisk Technologies Inc.
U.S. Appl. No. 15/049,444, filed Feb. 22, 2016, SanDisk Technologies Inc.
U.S. Appl. No. 14/317,274, filed Jun. 27, 2014, SanDisk Technologies Inc.
U.S. Appl. No. 15/219,719, filed Jul. 26, 2016, SanDisk Technologies Inc.
U.S. Appl. No. 15/219,652, filed Jul. 26, 2016, SanDisk Technologies Inc.
Non Final Office Action for parent U.S. Appl. No. 15/158,954, dated Nov. 25, 2016, 11 pages.
Kennedy, G.P. et al., "Oxidation of Silicon Nitride Films in an Oxygen Plasma," Journal of Applied Physics, vol. 85, 6, pp. 3319-3326, (1999).
Invitation to Pay Additional Fees and Where Applicable, Protest Fee from the International Searching Authority for International Patent Application No. PCT/US2017/018211, dated May 4, 2017, 15 pages.
International Search Report and the Written Opinion of the International Searching Authority for International Patent Application No. PCT/US2017/018211, dated Jun. 29, 2017, 22 pages.

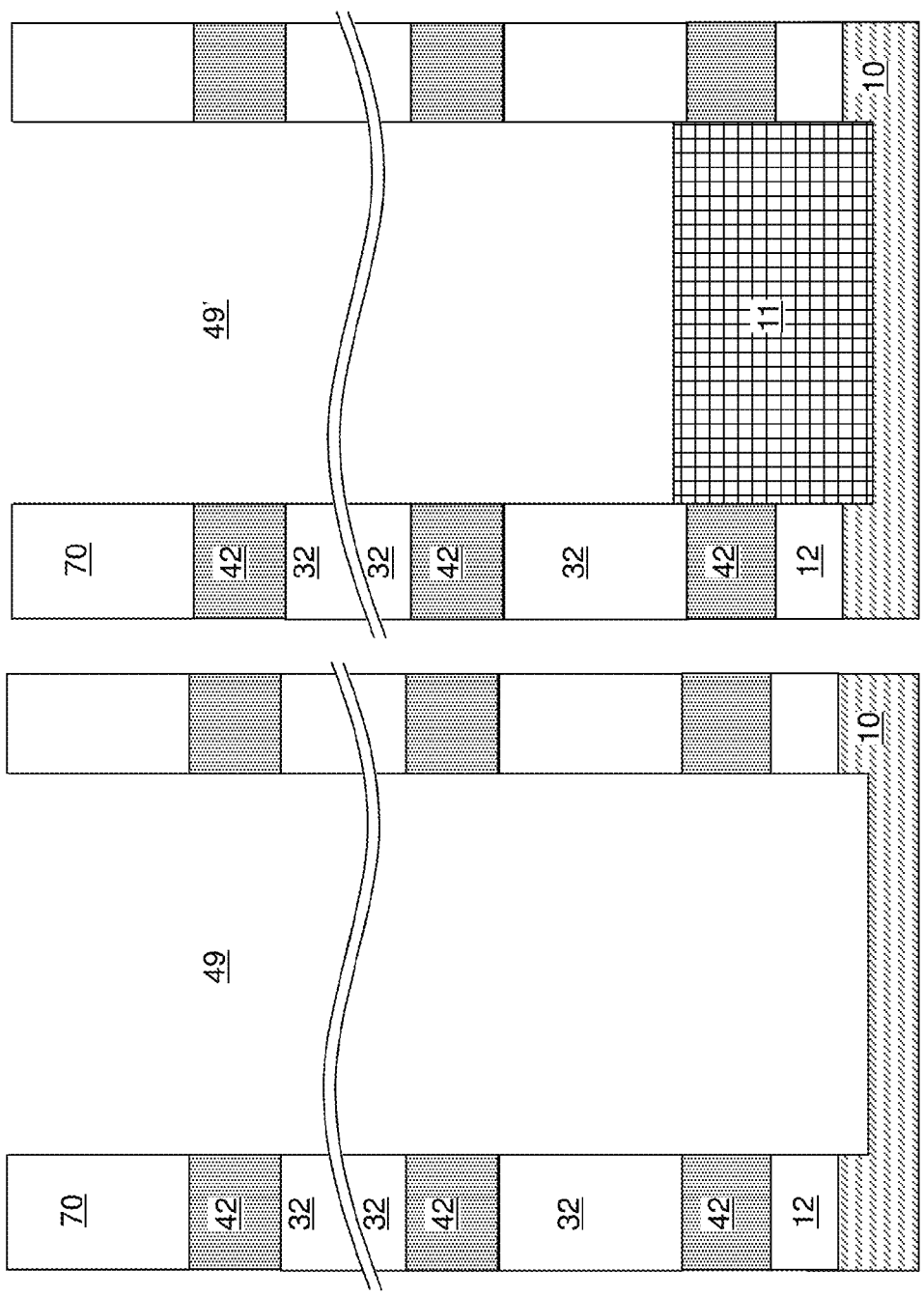

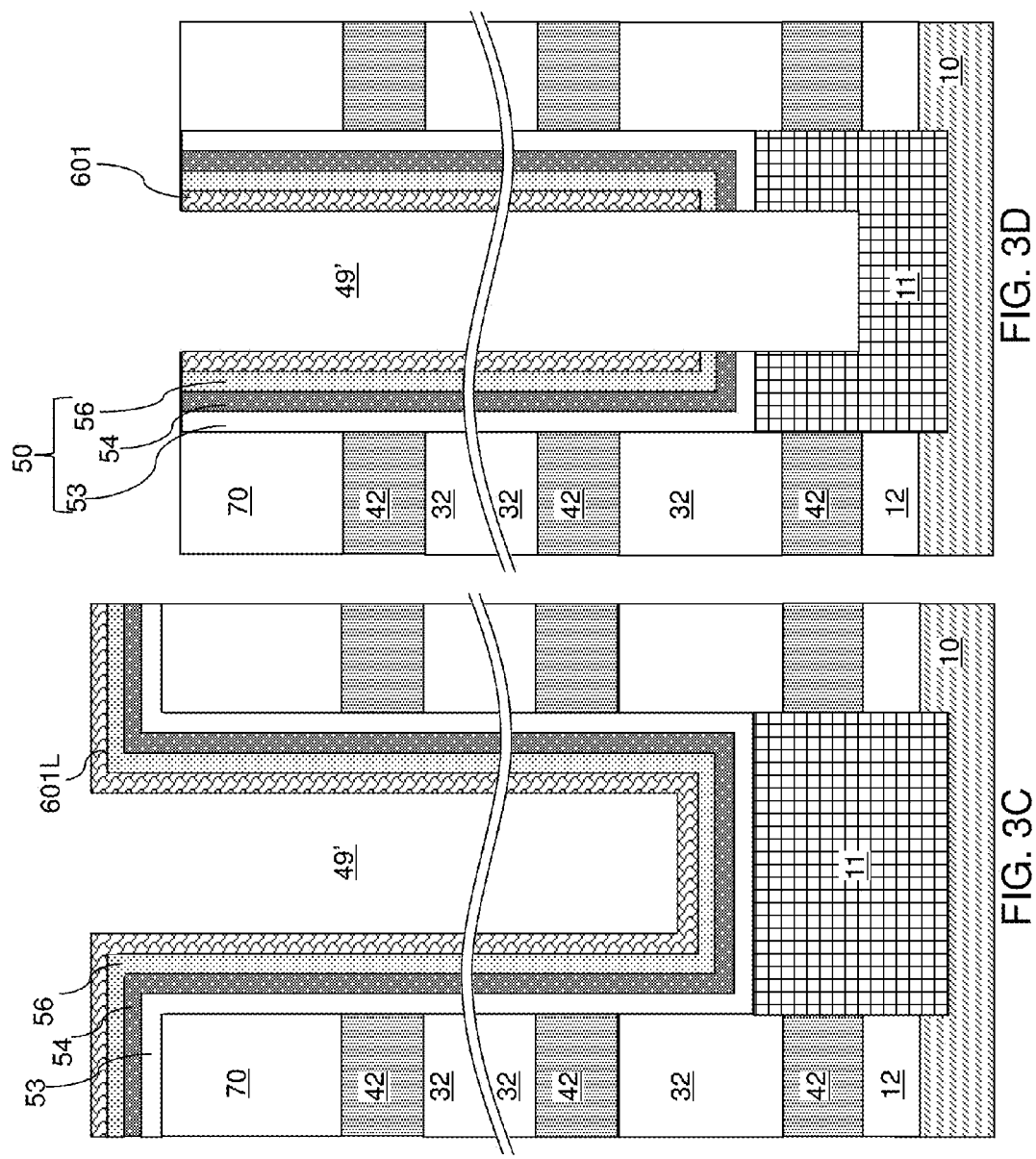

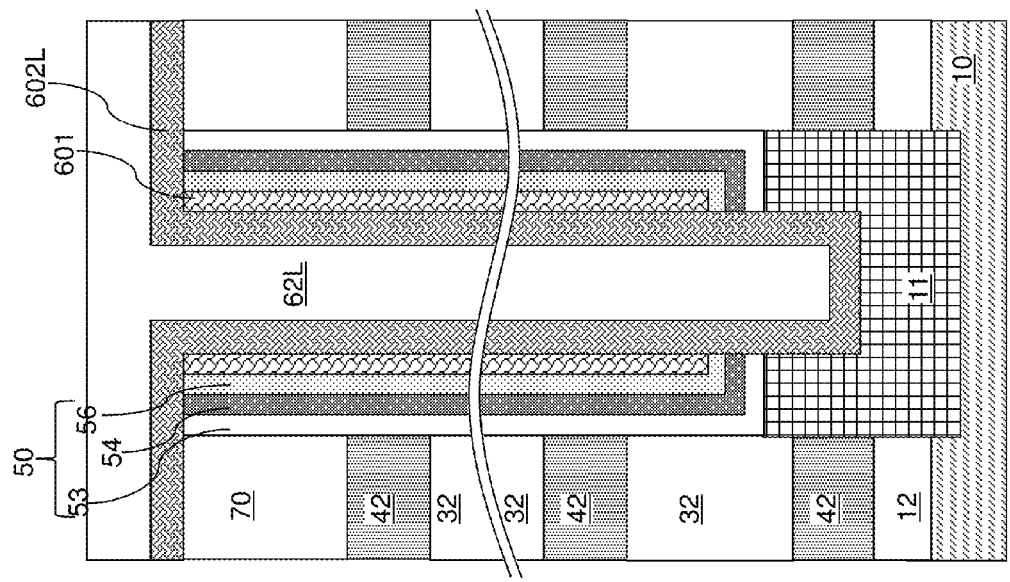
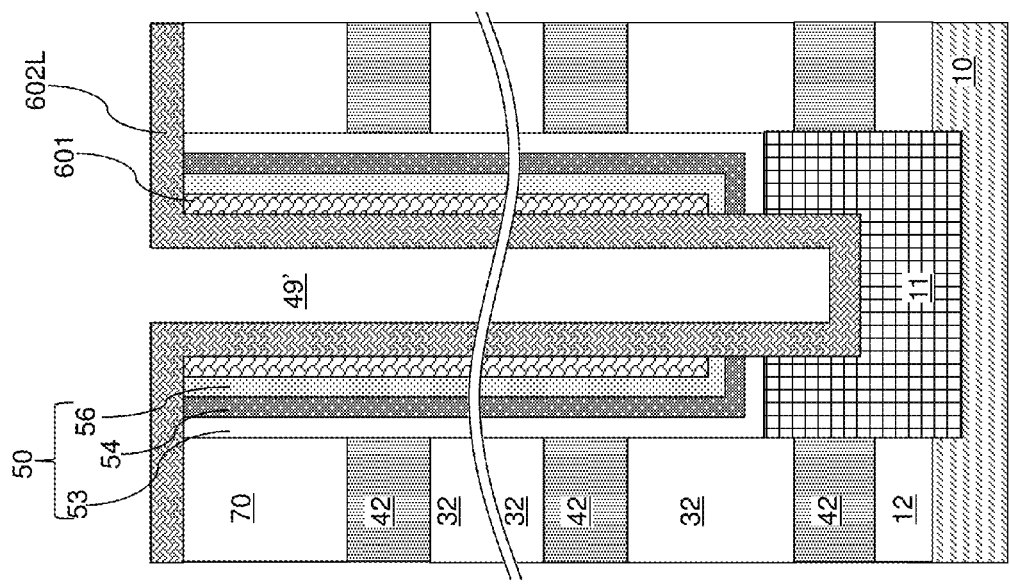

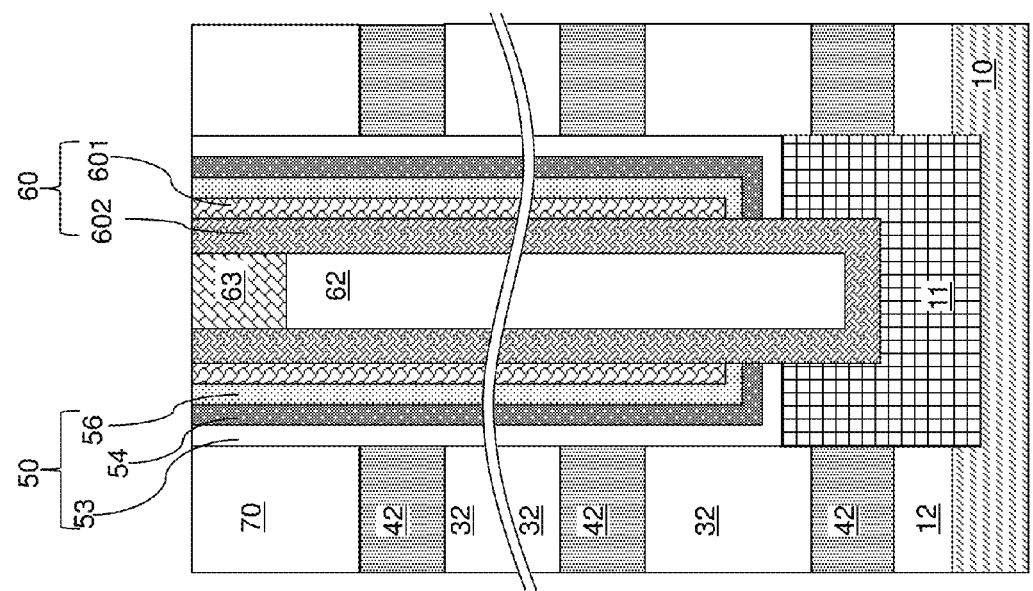
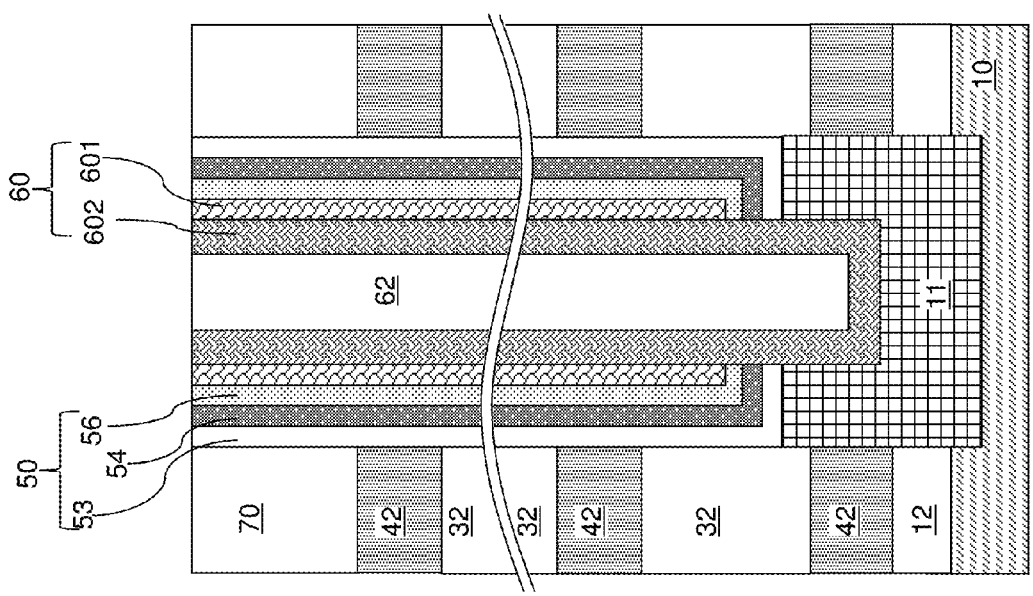

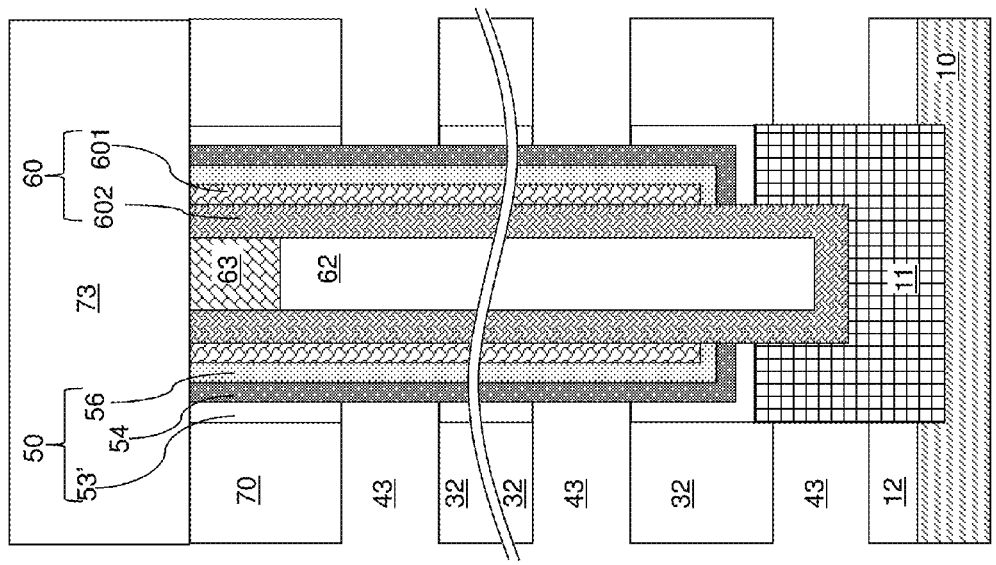
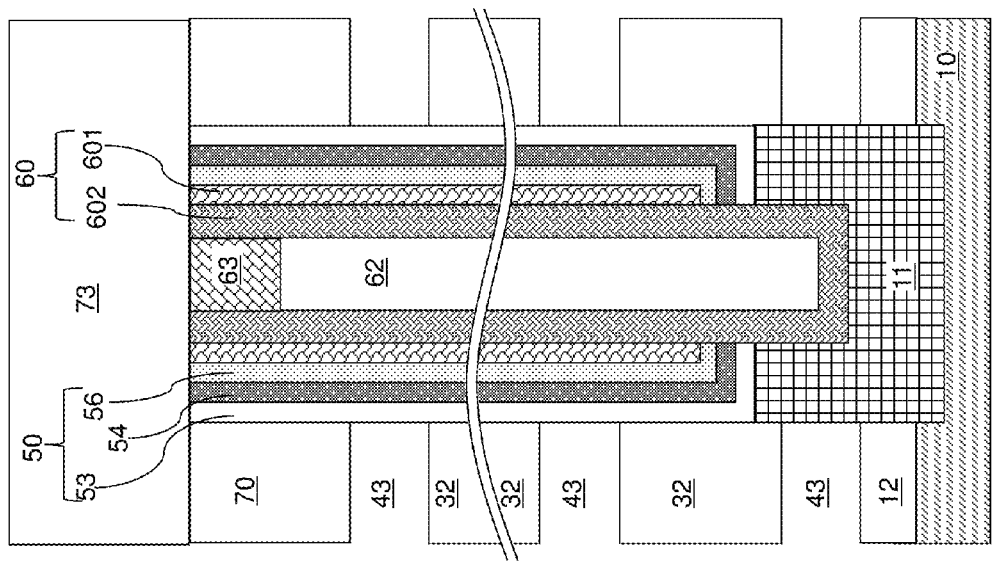

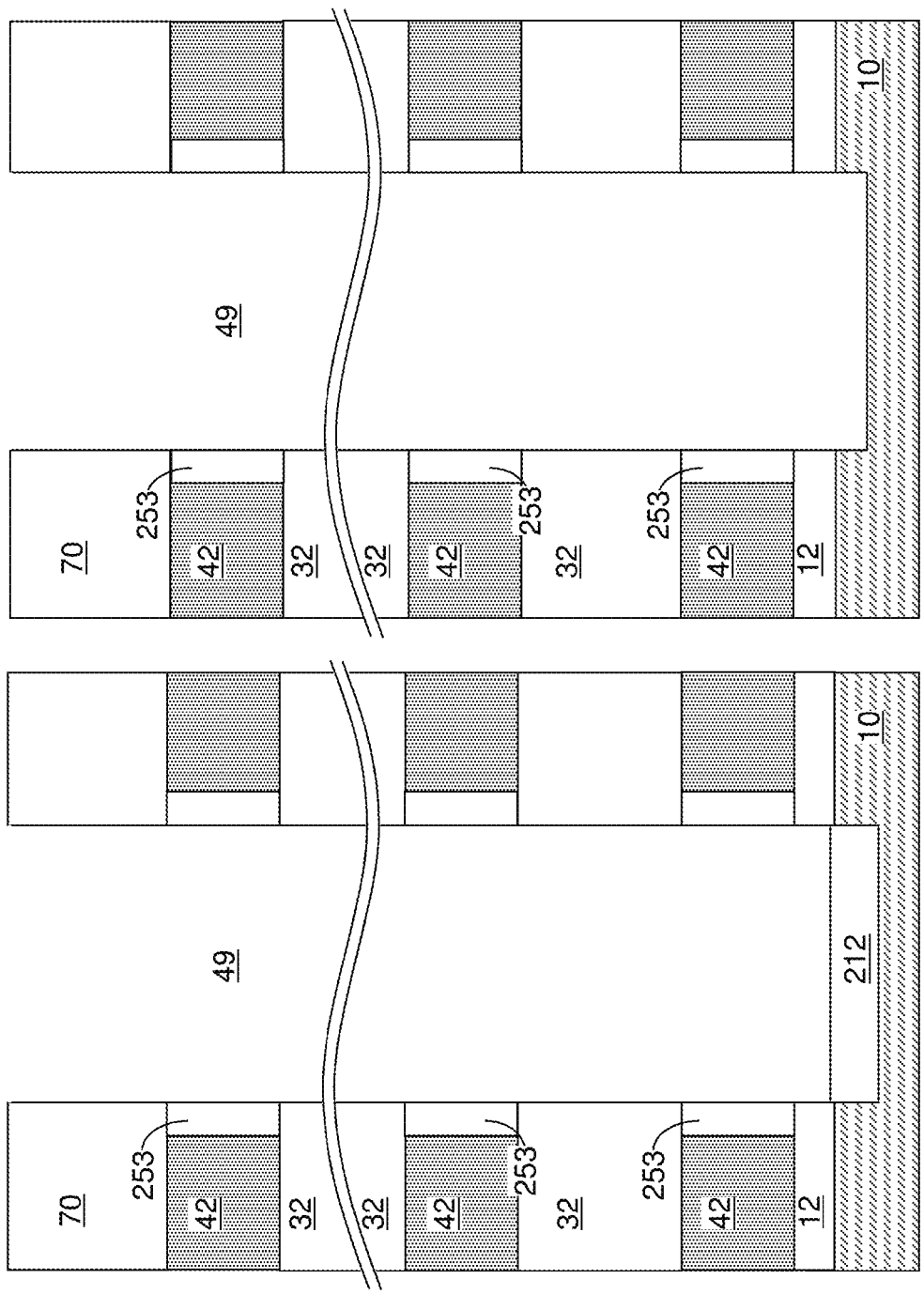

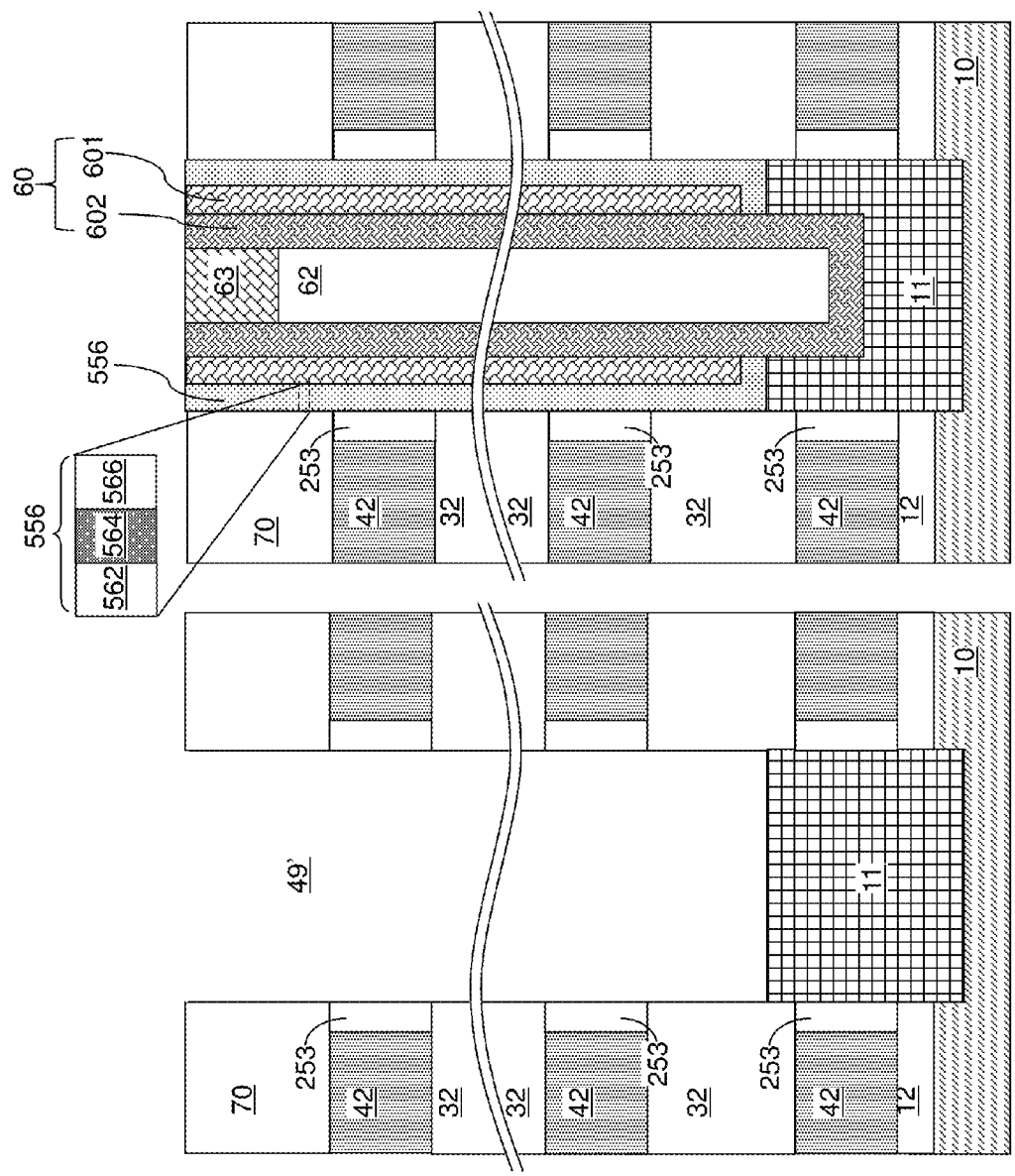

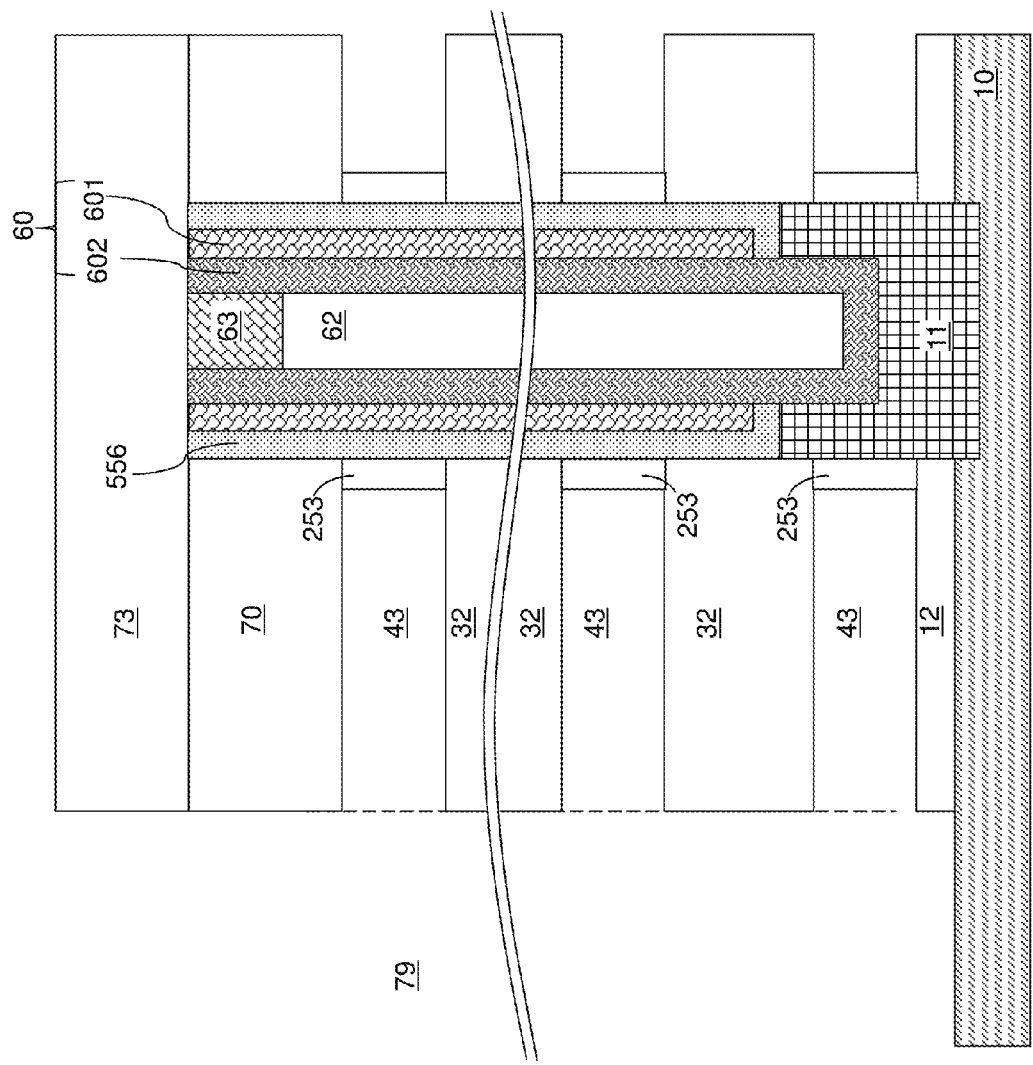

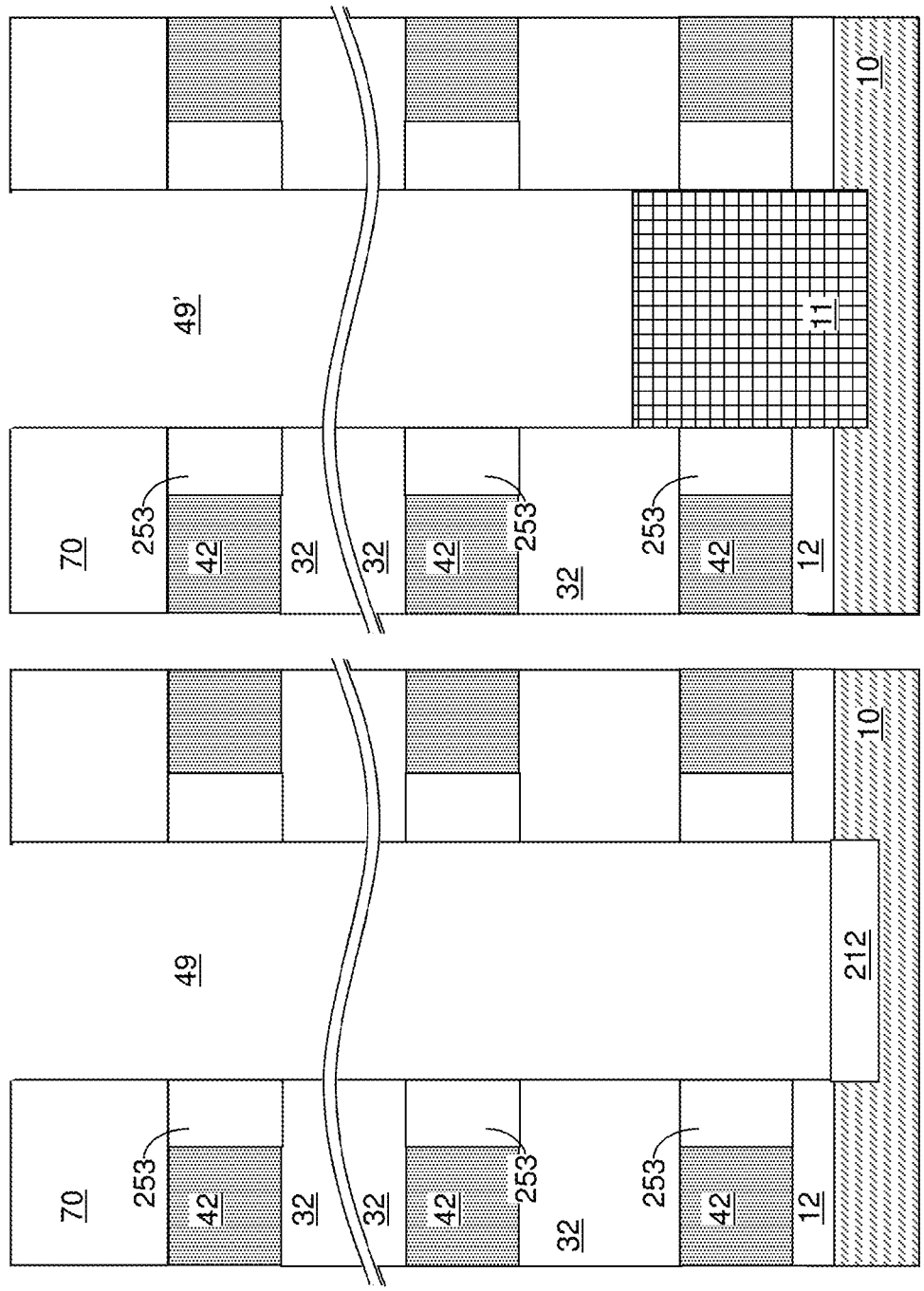

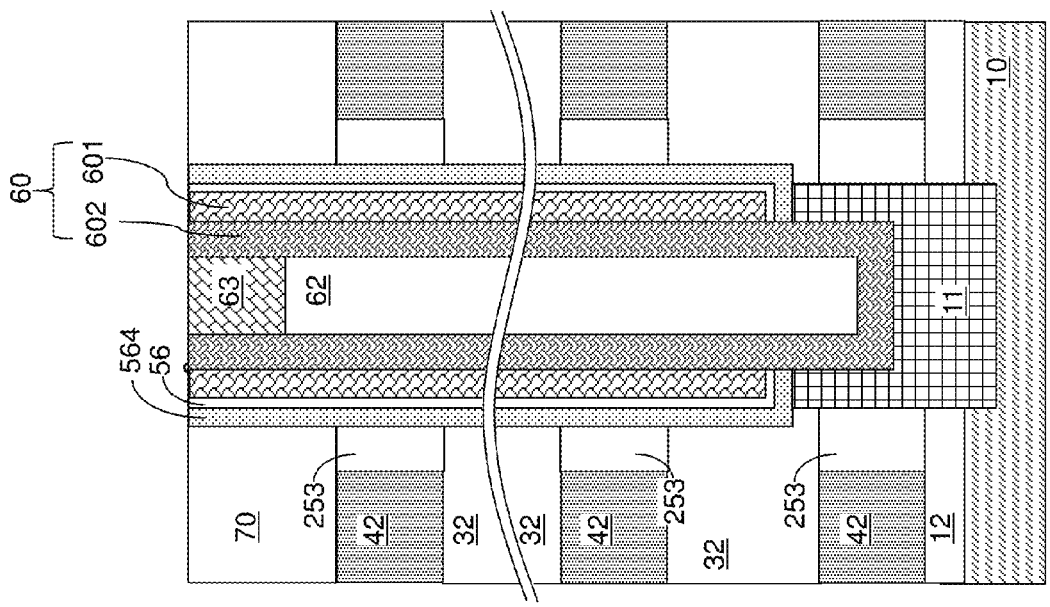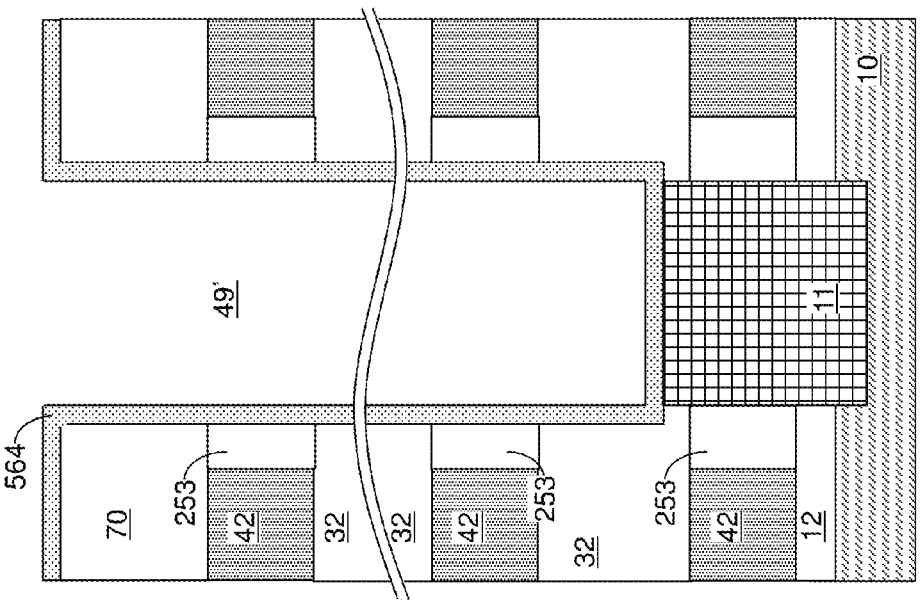

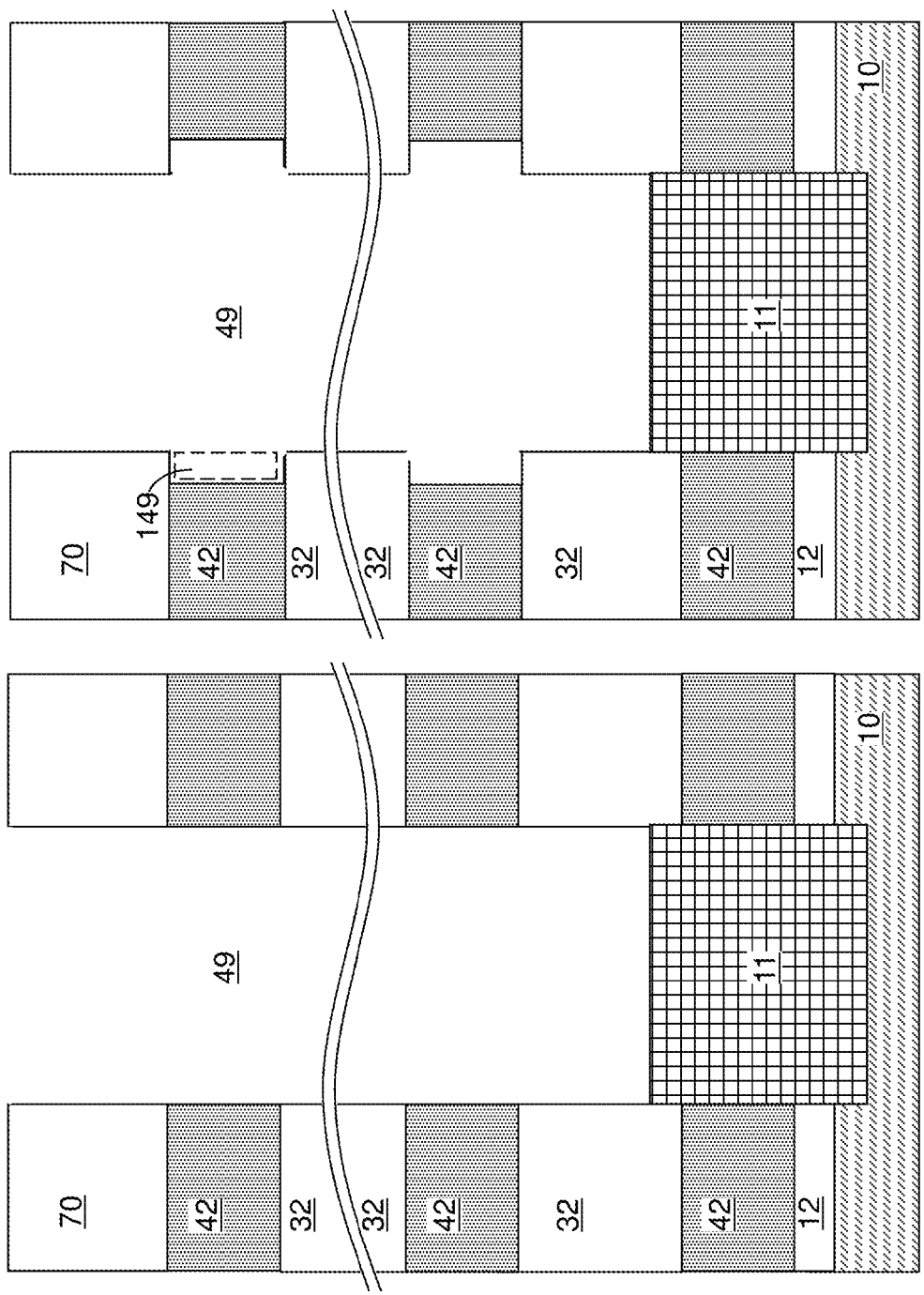

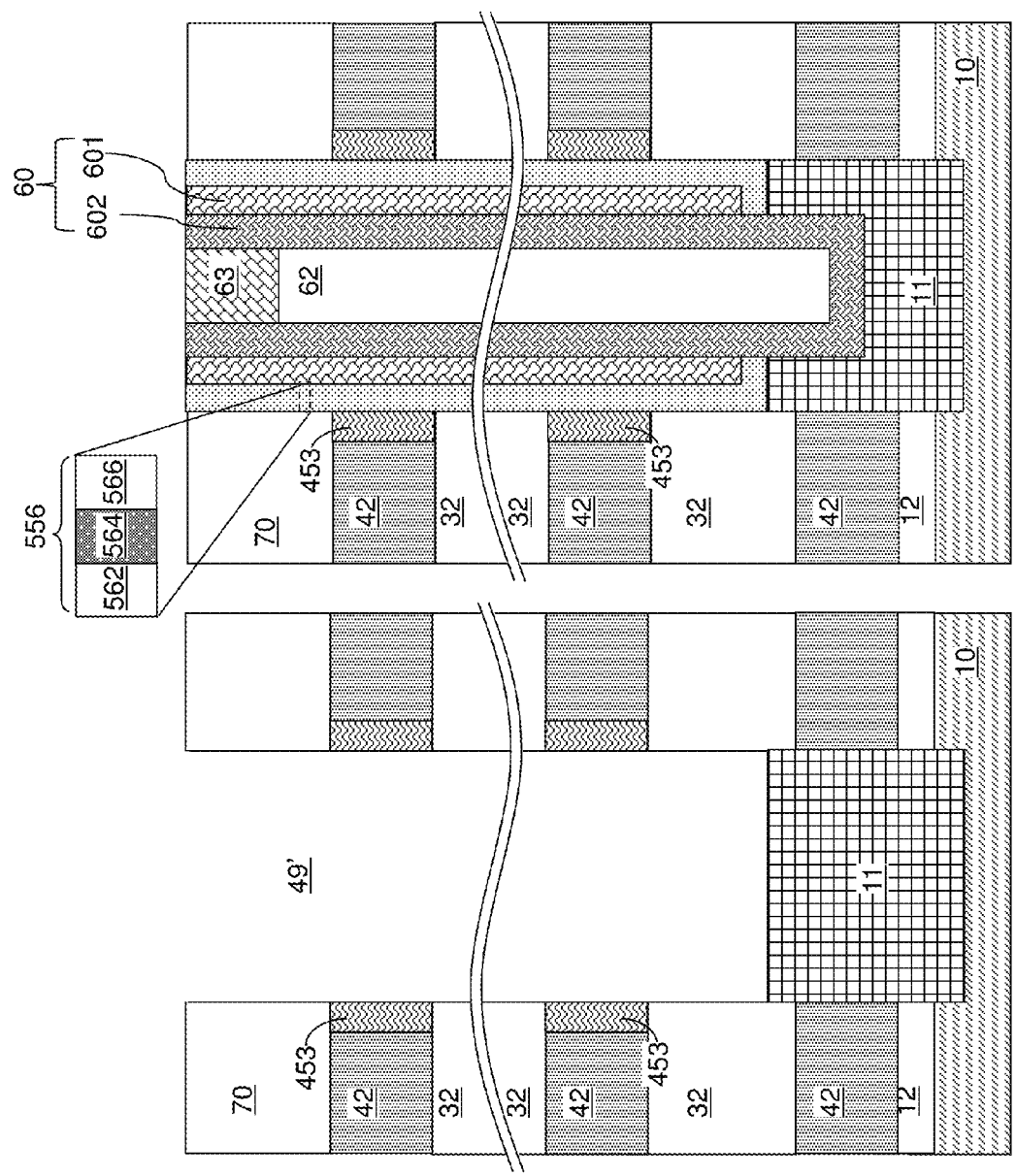

THREE-DIMENSIONAL MEMORY DEVICE CONTAINING VERTICALLY ISOLATED CHARGE STORAGE REGIONS AND METHOD OF MAKING THEREOF

RELATED APPLICATIONS

The present application is a continuation-in-part application of U.S. patent application Ser. No. 15/158,954 filed on May 19, 2016 which claims benefit of priority to U.S. Provisional Patent Application Ser. No. 62/313,234, filed on Mar. 25, 2016, the entire contents of which are incorporated herein by reference.

FIELD

The present disclosure relates generally to the field of three-dimensional memory devices and specifically to three-dimensional memory devices such as vertical NAND strings and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers located over a substrate; a memory stack structure extending through the alternating stack and comprising a tunneling dielectric layer and a vertical semiconductor channel, wherein first portions of an outer sidewall of the tunneling dielectric layer contact proximal sidewalls of the insulating layers; and [charge trapping material portions located at each level of the electrically conductive layers, comprising a dielectric compound including silicon and nitrogen, and contacting second portions of the outer sidewall of the tunneling dielectric layer.

According to another aspect of the present disclosure, a method of forming a three-dimensional memory device is provided. An alternating stack of insulating layers and sacrificial material layers is formed over a substrate. A memory opening is formed through the alternating stack. Annular etch stop material portions are formed at each level of the sacrificial material layers around the memory opening. A memory stack structure including at least one tunneling dielectric sublayer and a vertical semiconductor channel is formed within the memory opening. Backside recesses are formed by removing the sacrificial material layers selective to the annular etch stop material portions. The annular etch stop material portions are at least partially converted into charge trapping material portions including a dielectric compound comprising silicon and nitrogen by a nitridation process. A tunneling dielectric layer including the at least one tunneling dielectric sublayer contacts each of the charge trapping material portions. Electrically conductive layers are formed in the backside recesses.

BRIEF DESCRIPTION OF THE DRAWINGS

FIGS. 3A-3H are sequential vertical cross-sectional views of a memory opening within the first exemplary structure during various processing steps employed to form an in-process memory stack structure according to the first embodiment of the present disclosure.

FIGS. 7A-7E are sequential vertical cross-sectional views of a memory opening within the first exemplary structure during various processing steps employed to form a compositionally modulated charge storage layer, backside blocking dielectric layers, and electrically conductive layers according to the first embodiment of the present disclosure.

FIGS. 12A-12D are sequential vertical cross-sectional views of a memory opening within a second exemplary structure during various processing steps employed to form an in-process memory stack structure according to a second embodiment of the present disclosure.

FIGS. 13A-13D are sequential vertical cross-sectional views of a memory opening within the second exemplary structure during various processing steps employed to form a continuous charge trapping material layer, continuous backside blocking dielectric layers, and electrically conductive layers according to the second embodiment of the present disclosure.

FIGS. 15A-15D are sequential vertical cross-sectional views of a memory opening within a fourth exemplary structure during various processing steps employed to form an in-process memory stack structure according to a fourth embodiment of the present disclosure.

FIGS. 17A-17D are sequential vertical cross-sectional views of a memory opening within a fifth exemplary structure during various processing steps employed to form an in-process memory stack structure according to a fifth embodiment of the present disclosure.

DETAILED DESCRIPTION

Figure 1:
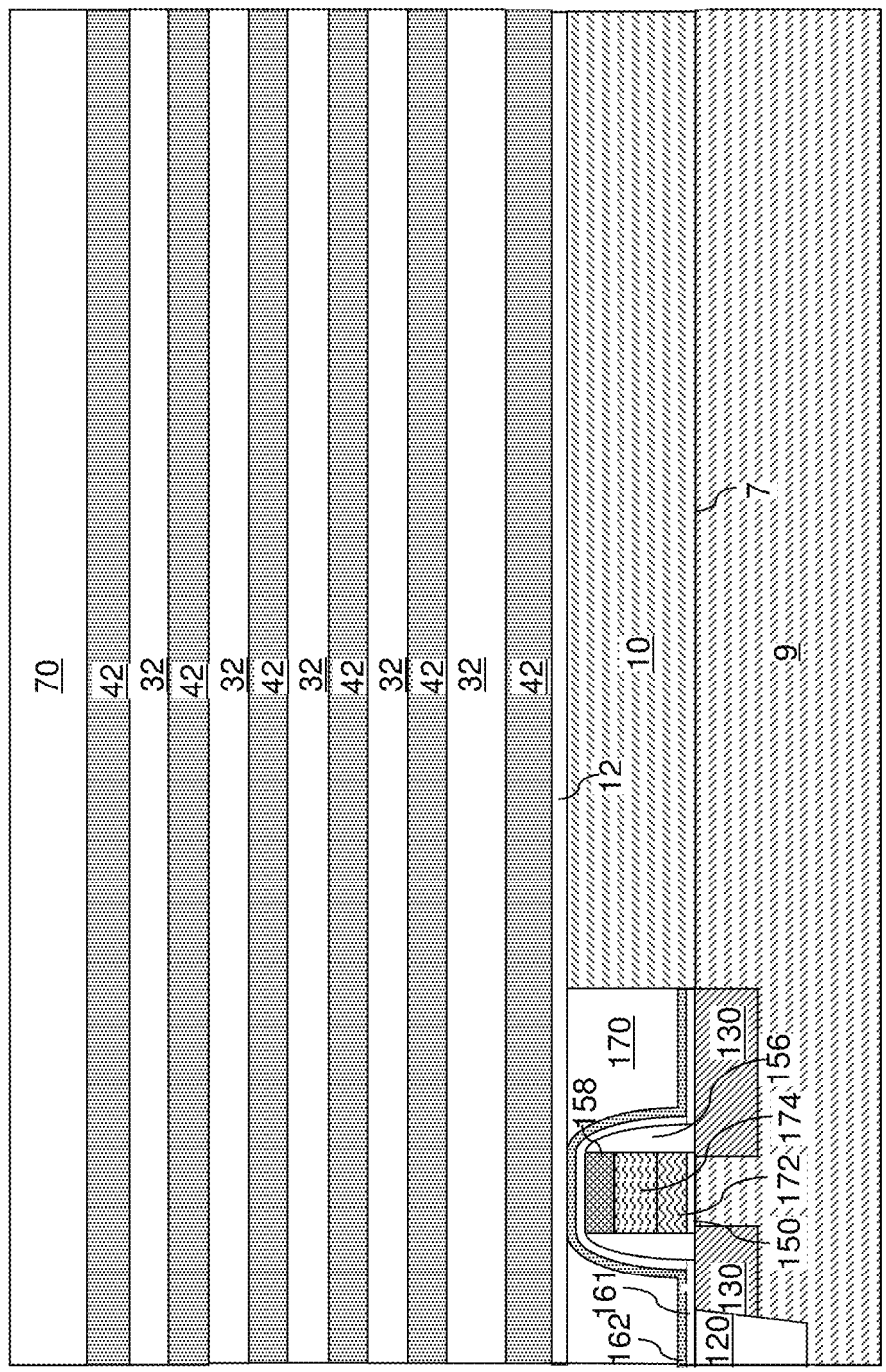
FIG. 1 is a vertical cross-sectional view of a first exemplary structure after formation of a stack including an alternating plurality of insulating layers and spacer material layers according to a first embodiment of the present disclosure.

As discussed above, the present disclosure is directed to three-dimensional memory devices and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 which can be a layer located on an underlying substrate or which can be the underlying substrate, such as a single crystal silicon wafer. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface. An optional semiconductor material layer 10 can located on the major surface 7 of the substrate semiconductor layer 9.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 172, 174, 158), each of which can include a gate dielectric 150, at least one gate electrode (172, 174), and a gate cap dielectric. A gate electrode (172, 174) may include a stack of a first gate electrode portion 172 and a second gate electrode portion 174. At least one gate spacer 156 can be formed around the at least one gate structure (150, 172, 174, 158) by depositing and anisotropically etching a dielectric liner. Active regions 130 can be formed in upper portions of the substrate semiconductor layer 9, for example, by introducing electrical dopants employing the at least one gate structure (150, 172, 174, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above, such as single crystal silicon. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed. In one embodiment, the dielectric pad layer 12 can include a gate dielectric material that can be employed as a gate dielectric for a source select gate electrode to be subsequently formed.

A stack of an alternating plurality of first material layers (which can be insulating layers 32) and second material layers (which can be sacrificial material layers 42) is formed over the top surface of the substrate, which can be, for example, on the top surface of the dielectric pad layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality of layers is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
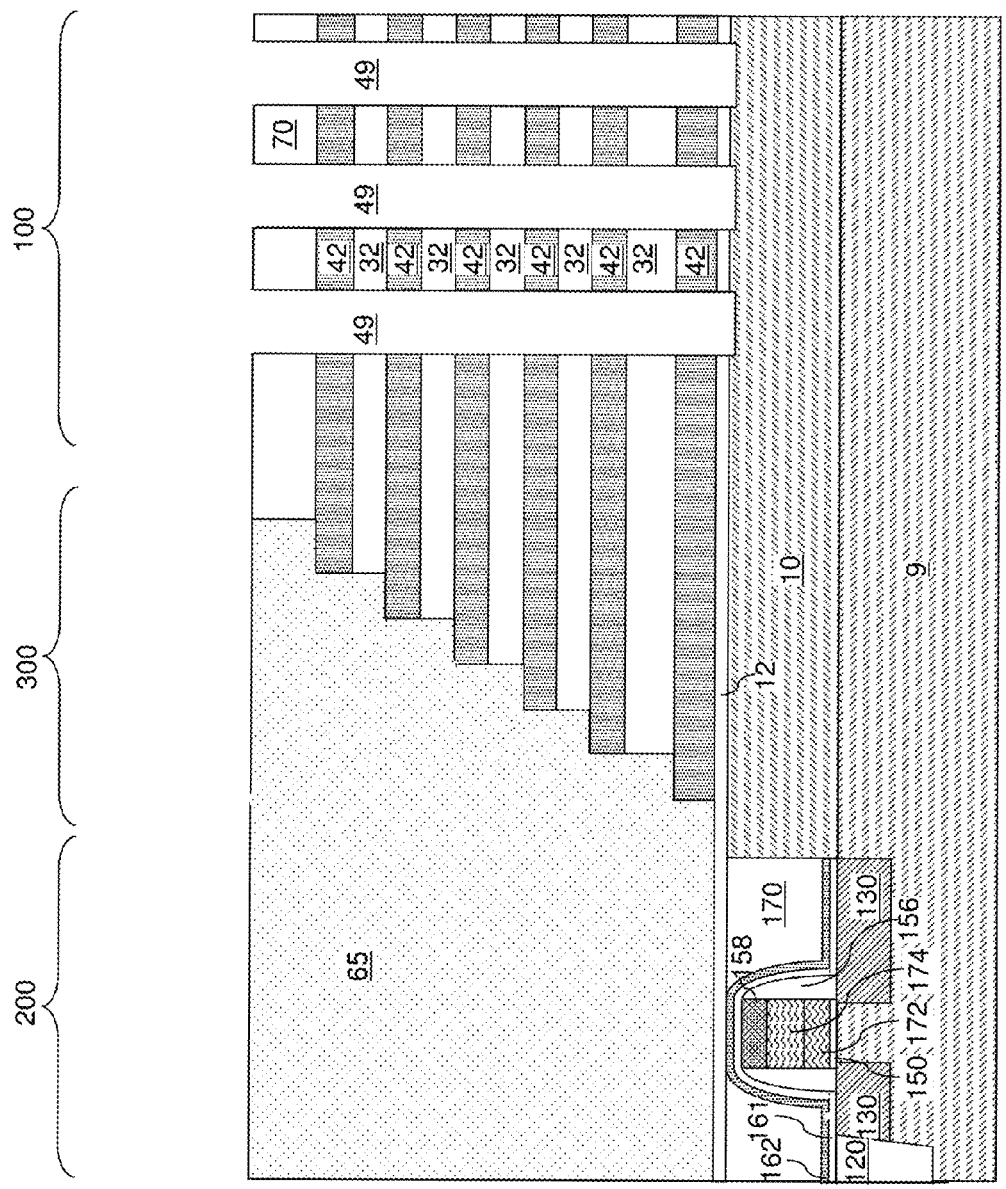
FIG. 2 is a vertical cross-sectional view of the first exemplary structure after formation of a retro-stepped dielectric material portion and memory openings extending through the stack according to the first embodiment of the present disclosure.

Referring to FIG. 2, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

Referring to FIG. 3A, a memory opening 49 in the exemplary device structure of FIG. 2 is illustrated. The memory opening 49 extends through the insulating cap layer 70, the alternating stack (32, 42), the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 3B, an optional epitaxial pedestal 11 can be formed at the bottom portion of each memory opening 49, for example, by selective epitaxy. Each epitaxial pedestal 11 comprises a single crystalline semiconductor material in epitaxial alignment with the single crystalline semiconductor material of the semiconductor material layer 10. In one embodiment, the epitaxial pedestal 11 can be doped with electrical dopants of the same conductivity type as the semiconductor material layer 10. In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer. The epitaxial pedestal 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial pedestal 11. In one embodiment, the epitaxial pedestal 11 can comprise single crystalline silicon. In one embodiment, the epitaxial pedestal 11 can have a doping of the first conductivity type, which is the same as the conductivity type of the semiconductor material layer 10 that the epitaxial pedestal contacts. If a semiconductor material layer 10 is not present, the epitaxial pedestal 11 can be formed directly on the substrate semiconductor layer 9, which can have a doping of the first conductivity type.

Referring to FIG. 3C, a stack of layers including an etch stop layer 53, an oxygen-containing dielectric silicon compound layer 54, a tunneling dielectric layer 56, and an optional first semiconductor channel layer 601L can be sequentially deposited in the memory openings 49.

The etch stop layer 53 preferably comprises a different material than that of the sacrificial material layers 42 and the same material as that the insulating layers 32. For example, the etch stop layer 53 may comprise a silicon oxide layer 53 which includes stoichiometric $SiO_2$ or non-stoichiometric silicon oxide. The silicon oxide layer 53 can be deposited employing a conformal deposition process such as chemical vapor deposition or atomic layer deposition. The thickness of the silicon oxide layer 53 can be in a range from 1 nm to 4 nm, such as from 1.5 nm to 3 nm, although lesser and greater thicknesses can also be employed.

The oxygen-containing dielectric silicon compound layer 54 includes a silicon oxynitride material or a silicon oxide material having a greater etch resistance to hydrofluoric acid than the silicon oxide layer 53. In one embodiment, the thickness of the oxygen-containing dielectric silicon compound layer 54 can be in a range from 2 nm to 6 nm. As used herein, silicon oxynitride refers to a material composition of $Si_{(1+/-\delta)}O_{2(1-x)}N_{4x/3}$ in which $\delta$ is in a range from, and including, 0 to 0.1, and x is greater than 0.02 and less than 0.98. In one embodiment, x can be in a range from 0.1 to 0.9. In another embodiment, x can be in a range from 0.2 to 0.8. In yet another embodiment, x can be in a range from 0.3 to 0.7. In case the oxygen-containing dielectric silicon compound layer 54 is a silicon oxynitride layer, the silicon oxynitride layer can be formed by deposition of a conformal silicon oxide layer and partial conversion of the silicon oxide material into a silicon oxynitride material by thermal nitridation or thermal oxidation, by deposition of a conformal silicon nitride layer and partial conversion of the silicon nitride material into a silicon oxynitride material by thermal oxidation or thermal nitridation, by deposition of a silicon oxynitride layer from a silicon, oxygen and nitrogen containing precursors, or by deposition of a silicon oxynitride material by alternating deposition of silicon oxide layers and silicon nitride layers and interdiffusion of the silicon oxide layers and silicon nitride layers to form a silicon oxynitride layer having a substantially uniform material composition.

In another embodiment, the silicon oxide layer 53 can be deposited as a doped silicon oxide layer including doped silicate glass (such as borosilicate glass, phosphosilicate glass, or borophosphosilicate glass), and the oxygen-containing dielectric silicon compound layer 54 can be deposited as an undoped silicate glass. Alternatively, the silicon oxide layer 53 can be formed as a low density silicon oxide layer, and the oxygen-containing dielectric silicon compound layer 54 can be formed as a high density silicon oxide layer. Alternatively, the silicon oxide layer 53 and the oxygen-containing dielectric silicon compound layer 54 can be silicon oxide layers formed by different depositions methods such that layers 53 and 54 have different etch characteristics when exposed to the same etching medium. Silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using TEOS and ozone sources based silicon oxides, high density plasma (HDP) CVD based silicon oxides, tetraethyl orthosilicate (TEOS) based silicon oxides and borosilicate glass (BSG) or borophosphosilicate glass (BPSG). Selective etching of silicon oxide materials may be performed by chemical dry etching or wet etching techniques. Example silicon oxide combinations suitable for use with selective dry etching techniques are summarized in Table 1 below while combinations suitable for use with wet etching techniques are summarized in Table 2 below. Table 3 below summarizes the process parameters (i.e., reactor type, temperature, pressure, reactant gases and flow ratios) suitable for deposition of the above described silicon oxide materials.

TABLE 1

| | Etch Selectivity | Etching Method |
|---|---|---|
| DCS Oxide:DS Oxide | 5:1-32:1 (tunable) | CDE (Chemical Dry Etching) |
| HARP:HDP Oxide | 230:1 | CDE (Chemical Dry Etching) |

TABLE 2

| | Wet etch Method |
|---|---|
| Etch Selectivity (BPSG:TEOS) | 99.7% Acetic acid:49% HF ratio |
| 27:1 | 200:1 |
| 42:1 | 100:1 |
| 55:1 | 50:1 |

TABLE 3

| Oxide Type | CVD Reactor Type | Temperature | Pressure | Reactant gases & flow ratio |
|---|---|---|---|---|
| DCS Oxide | LPCVD | 700-900° C. | 125 mT-1 T | DCS:$N_2$O = 0.25-1 |
| DS Oxide | PECVD | ~300° C. | 700 mT | DS:$N_2$O = 3:1 |
| HARP (TEOS + Ozone) | Non-plasma based CVD | ~400° C. | 760 T (atmospheric) | TEOS and $O_3$ |
| HDP Oxide | PECVD | 300-400° C. | 2-10 T | Ar, TEOS(Si$H_4$) & $O_2$ |
| TEOS | PECVD | <450° C. | 2-10 T | TEOS:$O_2$ = 1:10-1:20 |
| BPSG | PECVD | 300-500° C. | | $B_2H_6$, Phosphine & Si$H_4$ |
| BPSG | APCVD | 300-500° C. | 760 T | $B_2H_6$, Phosphine & Si$H_4$ |

In one embodiment, the sacrificial material layers 42 and the insulating layers 32 can have vertically coincident sidewalls, and the oxygen-containing dielectric silicon compound layer 54 can be formed as a single contiguous layer. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down. In another embodiment, the sacrificial material layers 42 can be laterally recessed with respect to the sidewalls of the insulating layers 32 prior to formation of the silicon oxide layer 53, and the oxygen-containing dielectric silicon compound layer 54 can be formed as a single continuous material layer that laterally protrudes outward at each level of the sacrificial material layers 42.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (53, 54, 56, 601L).

Referring to FIG. 3D, the optional first semiconductor channel layer 601L, the tunneling dielectric layer 56L, the oxygen-containing dielectric silicon compound layer 54, the silicon oxide layer 53 are sequentially anisotropically etched employing at least one anisotropic etch process. The portions of the first semiconductor channel layer 601L, the tunneling dielectric layer 56, the oxygen-containing dielectric silicon compound layer 54, and the silicon oxide layer 53 located above the top surface of the insulating cap layer 70 can be removed by the at least one anisotropic etch process. Further, the horizontal portions of the first semiconductor channel layer 601L, the tunneling dielectric layer 56, the oxygen-containing dielectric silicon compound layer 54, and the silicon oxide layer 53 at a bottom of each cavity 49' can be removed to form openings in remaining portions thereof. Each of the first semiconductor channel layer 601L, the tunneling dielectric layer 56, the oxygen-containing dielectric silicon compound layer 54, and the silicon oxide layer 53 can be etched by anisotropic etch process.

Each remaining portion of the first semiconductor channel layer 601L constitutes a first semiconductor channel portion 601. The remaining portion of the silicon oxide layer 53 includes a vertical portion contacting outer sidewalls of the oxygen-containing dielectric silicon compound layer 54 and an annular portion contacting an epitaxial channel portion 11 (or a top surface of the semiconductor material layer 10 in case epitaxial channel portions 11 are not formed). The remaining portion of layer 53 comprises a vertical etch stop layer.

A surface of the epitaxial channel portion 11 (or a surface of the semiconductor material layer 10 in case the epitaxial channel portions 11 are not employed) can be physically exposed underneath the opening through the first semiconductor channel portion 601, the tunneling dielectric layer 56, the oxygen-containing dielectric silicon compound layer 54, and the silicon oxide layer 53. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor material layer 10 in case epitaxial channel portions 11 are not employed) by a recess distance. A tunneling dielectric layer 56 is located over the oxygen-containing dielectric silicon compound layer 54. A set of silicon oxide layer 53, an oxygen-containing dielectric silicon compound layer 54, and a tunneling dielectric layer 56 in a memory opening 49 constitutes a memory film 50, which includes a plurality of charge storage regions (as embodied as the oxygen-containing dielectric silicon compound layer 54) that are insulated from surrounding materials by the silicon oxide layer 53 and the tunneling dielectric layer 56. In one embodiment, the first semiconductor channel portion 601, the tunneling dielectric layer 56, the oxygen-containing dielectric silicon compound layer 54, and the silicon oxide layer 53 can have vertically coincident sidewalls.

Referring to 3E, a second semiconductor channel layer 602L can be deposited directly on the semiconductor surface of the epitaxial channel portion 11 or the semiconductor material layer 10 if the epitaxial channel portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 3F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 3G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A tunneling dielectric layer 56 is surrounded by an oxygen-containing dielectric silicon compound layer 54, and laterally surrounds a portion of the vertical semiconductor channel 60. Each adjoining set of a silicon oxide layer 53, an oxygen-containing dielectric silicon compound layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Referring to FIG. 3H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 4:
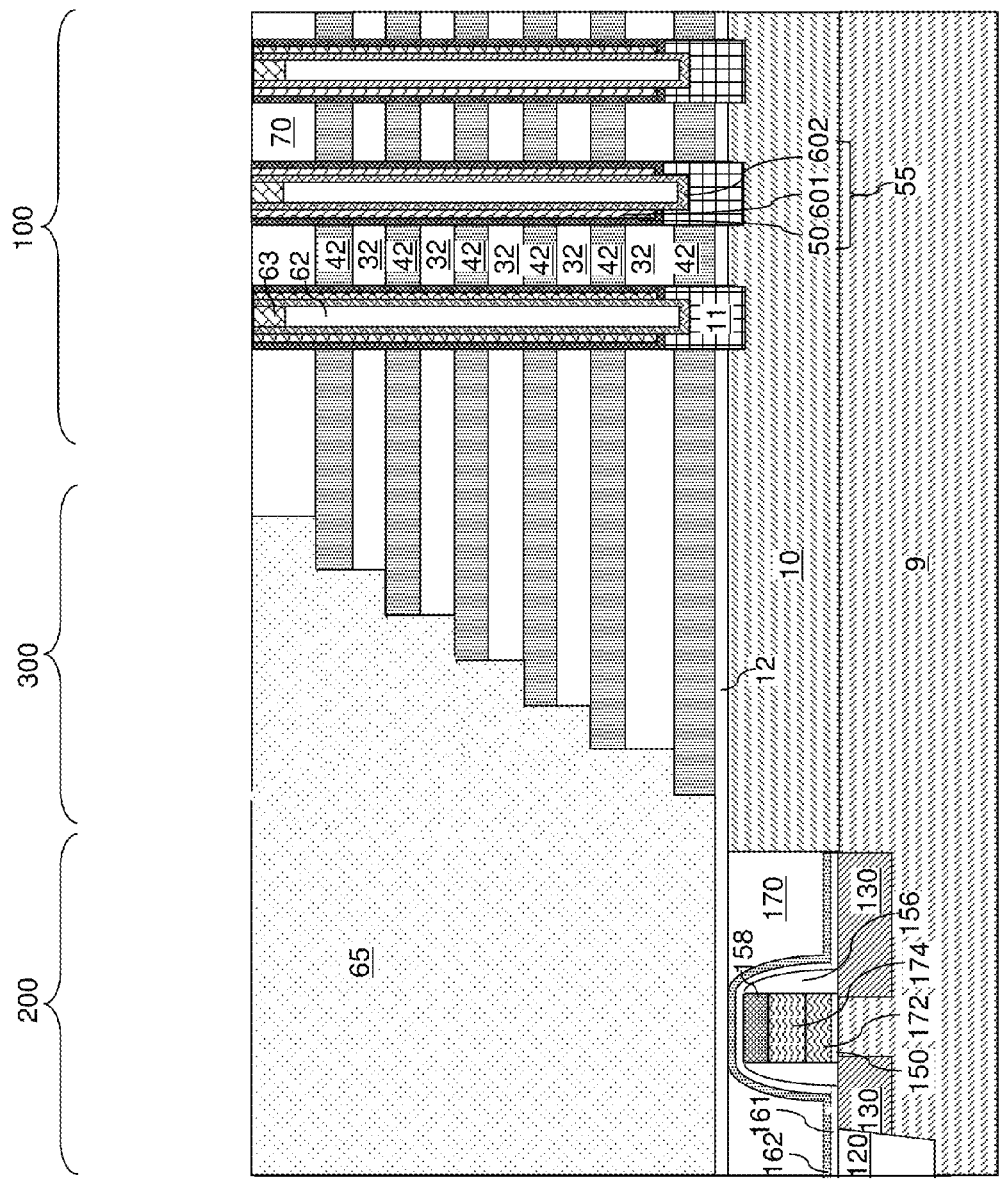
FIG. 4 is a vertical cross-sectional view of the first exemplary structure after formation of memory stack structures according to the first embodiment of the present disclosure.

Each combination of a memory film 50 and a vertical semiconductor channel 60 in a memory opening 49 constitutes a memory stack structure 55. The memory stack structures 55 are in-process memory stack structures that are subsequently modified. The exemplary memory stack structure 55 can be embedded into the first exemplary structure illustrated in FIG. 2. FIG. 4 illustrates the first exemplary structure that incorporates multiple instances of the exemplary memory stack structure of FIG. 3H. Each exemplary memory stack structure 55 includes a vertical semiconductor channel 60 (e.g., 601, 602); a tunneling dielectric layer 56 laterally surrounding the vertical semiconductor channel 60 (e.g., 601, 602); an oxygen-containing dielectric silicon compound layer 54; and a silicon oxide layer 53. The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a silicon oxide layer 53 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. Each memory stack structure 55 can be formed on a top surface of an epitaxial channel portion 11 within a respective memory opening 49.

Figure 5A:
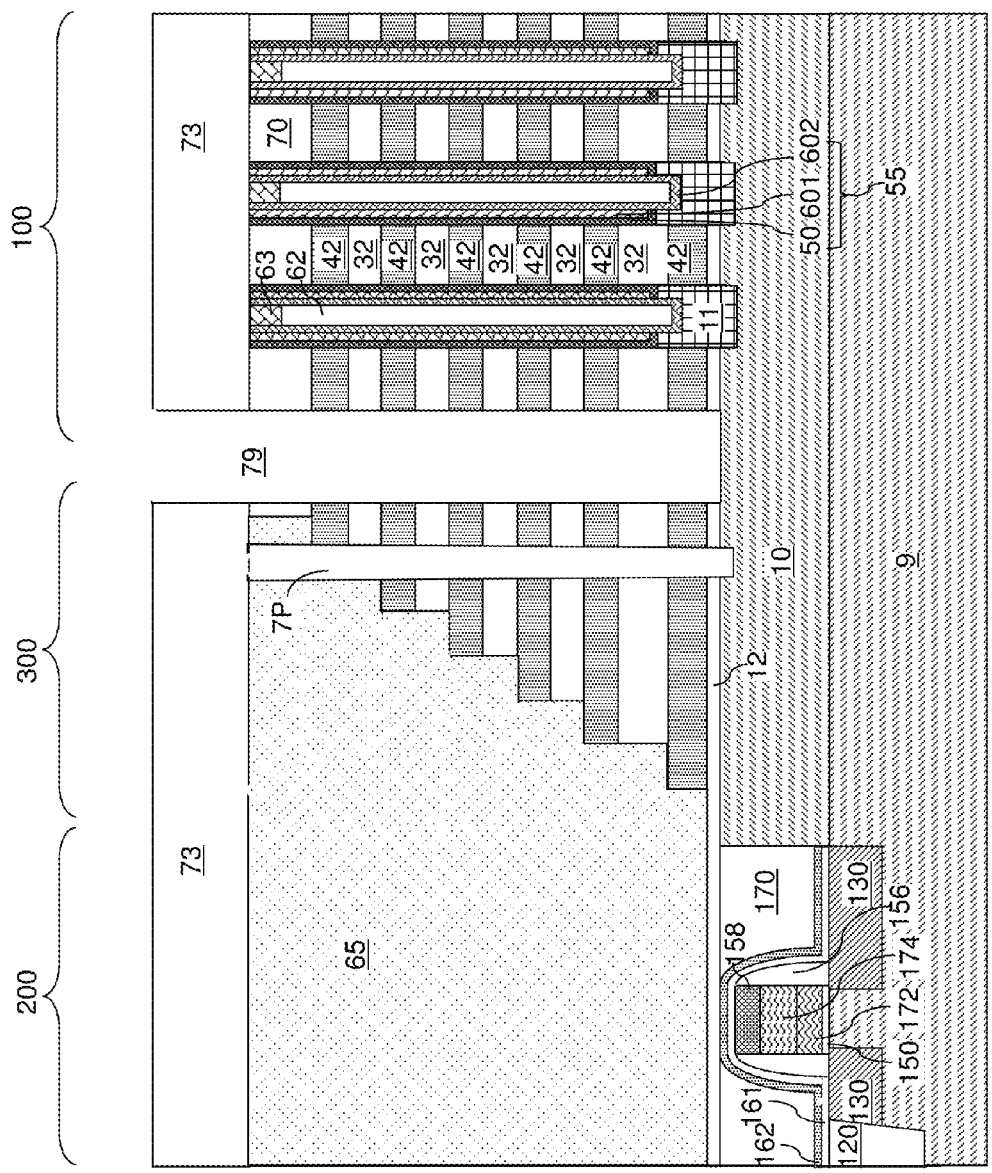
FIG. 5A is a vertical cross-sectional view of the first exemplary structure after formation of a backside trench according to the first embodiment of the present disclosure.
Figure 5B:
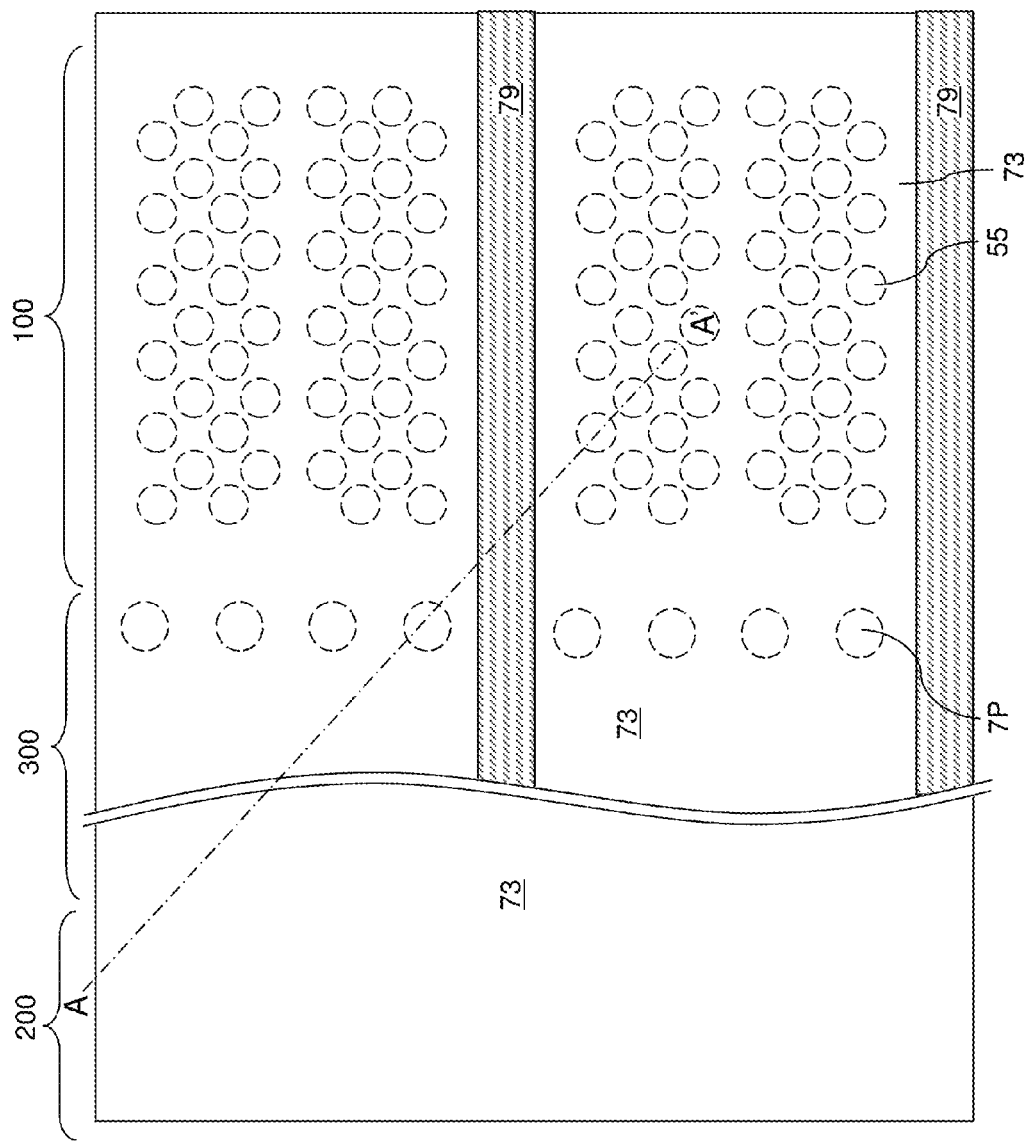
FIG. 5B is a partial see-through top-down view of the first exemplary structure of FIG. 5A. The vertical plane A-A' is the plane of the vertical cross-sectional view of FIG. 5A.

Referring to FIGS. 5A and 5B, at least one support pillar 7P may be optionally formed through the retro-stepped dielectric material portion 65 and/or through the insulating cap layer 70 and/or through the alternating stack (32, 42). The plane A-A' in FIG. 5B corresponds to the plane of the schematic vertical cross-sectional view of FIG. 5A. In one embodiment, the at least one support pillar 7P can be formed in the contact region 300, which is located adjacent to the memory array region 100. The at least one support pillar 7P can be formed, for example, by forming an opening extending through the retro-stepped dielectric material portion 65 and/or through the alternating stack (32, 42) and at least to the top surface of the substrate (9, 10), and by filling the opening with a material that is resistant to the etch chemistry to be employed to remove the sacrificial material layers 42.

In one embodiment, the at least one support pillar 7P comprises a dummy memory stack structure which contains the memory film 50, semiconductor channel 60 and core dielectric 62 which are formed at the same time as the memory stack structures 55. However, the dummy memory stack structures 7P are not electrically connected to bit lines and are used as support pillars rather than as NAND strings. In another embodiment, the at least one support pillar 7P can include an insulating material, such as silicon oxide and/or a dielectric metal oxide such as aluminum oxide. In this embodiment, the portion of the dielectric material that is deposited over the insulating cap layer 70 concurrently with deposition of the at least one support pillar 7P can be present over the insulating cap layer 70 as a contact level dielectric layer 73. Each of the at least one support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single contiguous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

In an alternative embodiment, the at least one dielectric support pillars 7P can be formed during the processing steps that are employed to form the memory stack structures 55. For example, support openings (not shown) can be formed in the contact region 300 through the alternating stack (32, 42) and optionally through the retro-stepped dielectric material portion 65 simultaneously with formation of the memory openings 49. Lower portions of the support openings can be filled with additional epitaxial material portions that are formed simultaneously with formation of the epitaxial channel portions 11 in the memory openings 49, and upper portions of the support openings can be filled with support pillar structures that are formed simultaneously with formation of the memory films 50, the semiconductor channels 60, the dielectric cores 62, and the drain regions 63. Each support pillar structure can include an instance of an identical layer stack as a memory film 50 and a vertical semiconductor channel 60, an instance of a dielectric material portion having a same material composition as a dielectric core 62, and a dummy drain region having a same material composition as a drain region 63.

A photoresist layer (not shown) can be applied over the alternating stack (32, 42), and is lithographically patterned to form at least one elongated openings in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Figure 6:
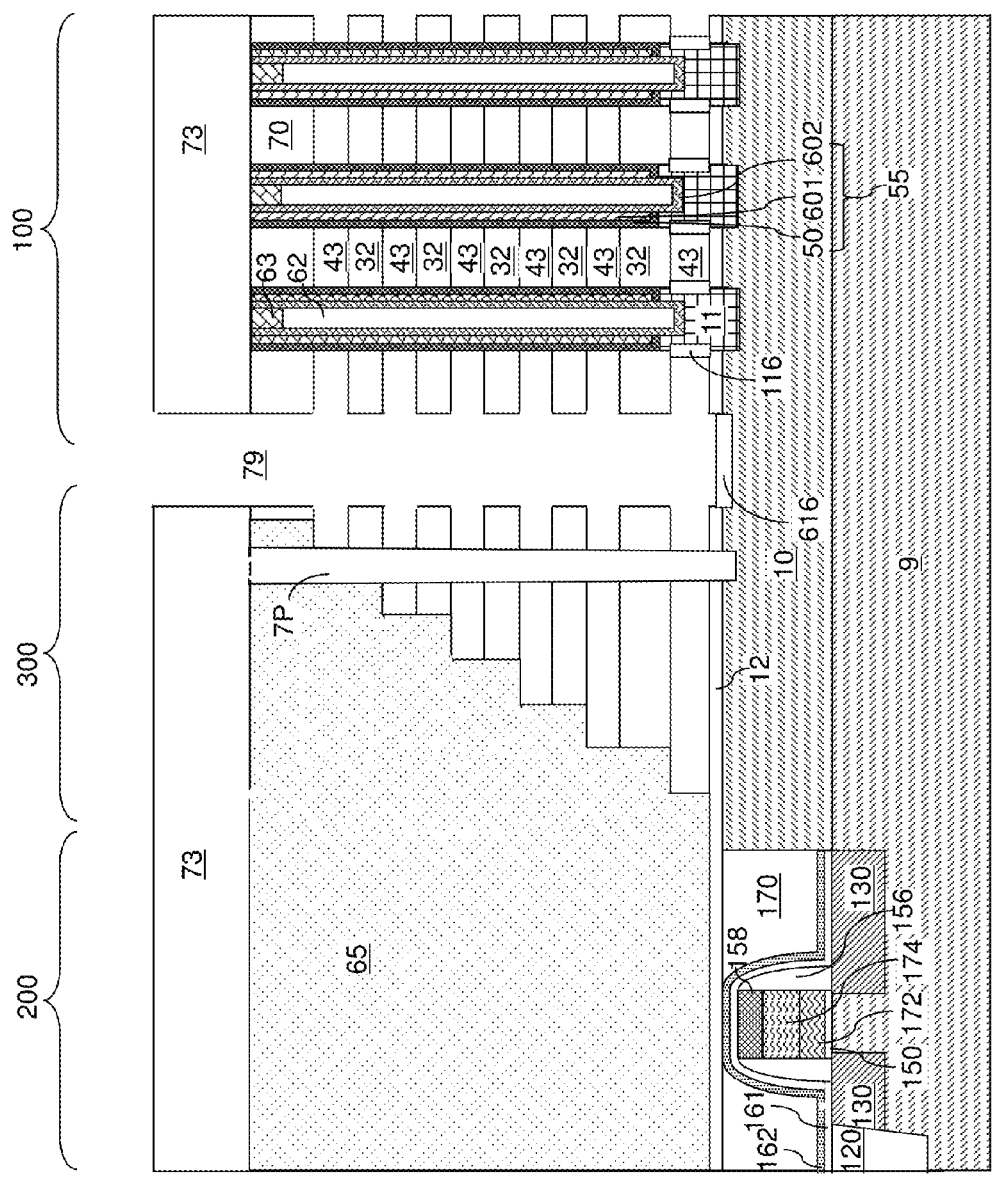
FIG. 6 is a vertical cross-sectional view of the first exemplary structure after formation of backside recesses according to the first embodiment of the present disclosure.

Referring to FIGS. 6 and 7A, an etchant that selectively etches the second material of the sacrificial material layers 42 with respect to the first material of the insulating layers 32 can be introduced into the at least one backside trench 79, for example, employing an etch process. FIG. 7A shows a region around a memory stack structure 55 within the first exemplary structure of FIG. 6. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the silicon oxide layer 53 within each memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, the etch stop layer 53, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor material layer 10.

The etch process that removes the second material of the sacrificial material layers 42 selective to the first material of the insulating layers 32 and the silicon oxide layers 53 of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42. The lateral etch is stopped on the etch stop layer 53.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality memory stack structures 55 and a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Referring to FIG. 7B, physically exposed portions of the silicon oxide layer 53 can be etched at each level of the backside recesses 43 selective to the oxygen-containing dielectric silicon compound layer 54 after removal of the spacer material layers, i.e., the sacrificial material layers 42. For example, an isotropic etch such as a wet etch employing dilute hydrofluoric acid can be employed to remove portions of the silicon oxide layer 53 located at the levels of the backside recesses 43. In one embodiment, the nitrogen content in the oxygen-containing dielectric silicon compound layer 54 can be at a level that provides sufficient etch selectivity with respect to silicon oxide in the silicon oxide layer 53, and to prevent any substantial etching of the oxygen-containing dielectric silicon compound material of the oxygen-containing dielectric silicon compound layer 54. In one embodiment, the composition of the oxygen-containing dielectric silicon compound layer 54 can be $Si_{(1+/-\delta)}O_{2(1-x)}N_{4x/3}$ in which $\delta$ is in a range from, and including, 0 to 0.1, and x is in a rage greater than 0.2 and less than 1.0.

Upon removal of the portions of the silicon oxide layer 53 from the levels of the lateral recesses 43, outer sidewalls of the oxygen-containing dielectric silicon compound layer 54 are physically exposed at each level of the backside recesses 43. If the insulating layers 32 include silicon oxide, surface portions of the insulating layers 32 can be collaterally recessed to expand the volume of each backside recess 43 during etching of the portions of the silicon oxide layer 53 at the levels of the backside recesses 43. Each remaining portions of the silicon oxide layer 53 is an annular silicon oxide portion 53'. An annular silicon oxide portion 53' can be located at each level of the insulating layers 32. In one embodiment, annular silicon oxide portions 53' can laterally surround respective oxygen-containing dielectric silicon compound portions 54', and can be laterally surrounded by respective insulating layers 32. In one embodiment, the insulating layers 32 can be deposited by chemical vapor deposition employing TEOS as a precursor and include carbon at a higher concentration than the annular silicon oxide portions 53', which are derived from the silicon oxide layer that can be deposited with lesser carbon content therein employing atomic layer deposition or in another chemical vapor deposition process.

Figure 7C:
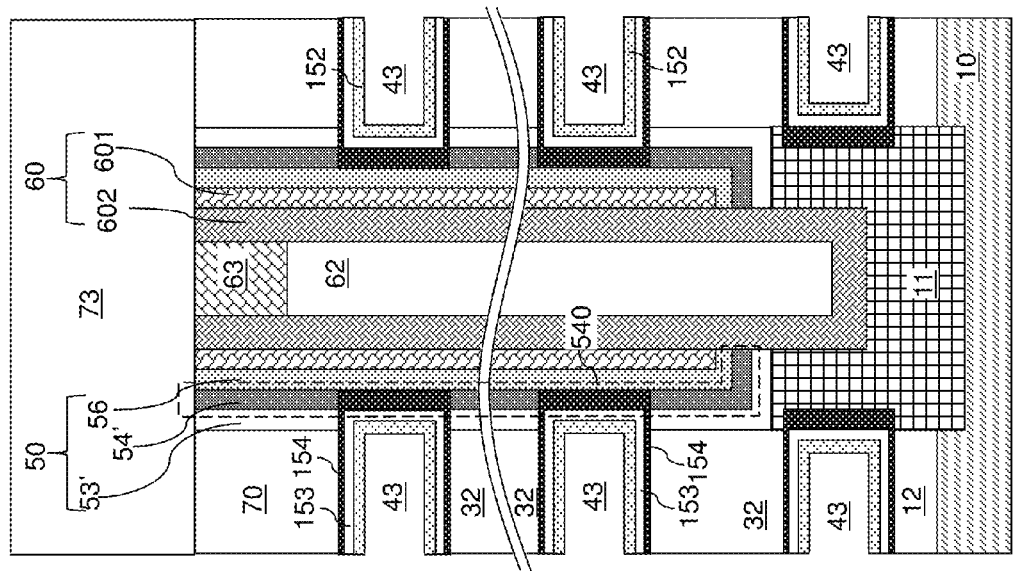

Referring to FIG. 7C, a continuous silicon nitride layer 154 can be formed from surface portions of the insulating layers 32 and portions of the oxygen-containing dielectric silicon compound layers 54 located at the levels of the backside recesses 43. Specifically, physically exposed surface portions of the insulating layers 32 and the portions of the oxygen-containing dielectric silicon compound layer 54 can be simultaneously converted into the continuous silicon nitride layer 154, which is a continuous silicon nitride material portion that extends from a bottommost insulating layer 32 to a topmost insulating layer 32. Conversion of the surface portions of the insulating layers 32 and the portions of the oxygen-containing dielectric silicon compound layer 54 into the silicon nitride portions of the continuous silicon nitride layer 154 can be performed by a nitridation process. The nitridation can be selected from a process selected from a thermal nitridation process and a plasma nitridation process.

In one embodiment, the horizontal portions 254 of the silicon nitride layer 154 may have a lower nitrogen content than the vertical portions 354 of the silicon nitride layer 154. Thus, the horizontal portions 254 may comprise oxygen doped silicon nitride and the vertical portions 354 may comprise silicon nitride having unavoidable oxygen concentration or oxygen doped silicon nitride having a lower oxygen content than the horizontal portions. In this case, conversion of the vertical portions 354 of the oxygen-containing dielectric silicon compound layer 54 at the levels of the backside recesses 43 into silicon nitride can proceed at a greater rate than conversion of the surface portions of the insulating layers 32 into silicon nitride (e.g., into the horizontal portions 254 and additional vertical portions on the back side of the insulating layers 32 exposed in the trench 79). The thickness of the vertical portions 354 of the continuous silicon nitride layer 154 derived from the oxygen-containing dielectric silicon compound layer 54 can be greater than, or can be substantially the same as, the horizontal portions 254 of the continuous silicon nitride layer 154 derived from surface portions of the insulating layers 32. In one embodiment, the vertical portions 354 of the continuous silicon nitride layer 154 can have a thickness in a range from 1 nm to 10 nm such as from 2 nm to 6 nm. The horizontal portions 254 of the continuous silicon nitride layer 154 overlying or underlying a backside recess 43 can be in a range from 20% to 80% of the thickness of the vertical portions of the continuous silicon nitride layer 154.

The portions of the oxygen-containing dielectric silicon compound layer 54 that are converted into vertical portions 354 of the silicon nitride layer 154 are charge storage elements of a memory device. The remaining portions of the oxygen-containing dielectric silicon compound layer 54 form oxygen-containing dielectric silicon compound portions 54' located at the levels of the insulating layers 32 and vertically spaced from one another. The vertical portions of the silicon nitride layer 154 on the tunneling dielectric layer 56 at the levels of the backside recesses 43 and the oxygen-containing dielectric silicon compound portions 54' located at the levels of the insulating layers 32 collectively constitute a compositionally modulated charge storage layer 540. The ability to retain electrical charges in the compositionally modulated charge storage layer 540 vertically modulates with nitrogen concentration therein. Thus, the silicon nitride portions (which are vertical portions of the continuous silicon nitride layer 154 that contacts the tunneling dielectric layer 56) of the compositionally modulated charge storage layer 540 has a greater capacity to trap charge carriers (such as electrons or holes) than the oxygen-containing dielectric silicon compound portions 54' of the compositionally modulated charge storage layer 540.

In one embodiment, an epitaxial channel portion 11 can be provided at the bottom of the memory stack structure 55. The epitaxial channel portion 11 comprises a single crystalline semiconductor material (e.g., single crystal silicon) that is epitaxially aligned to another single crystalline semiconductor material (e.g., single crystal silicon) in the substrate (9, 10). A portion of the continuous silicon nitride layer 154 can contact a sidewall of the epitaxial channel portion 11.

Figure 7D:
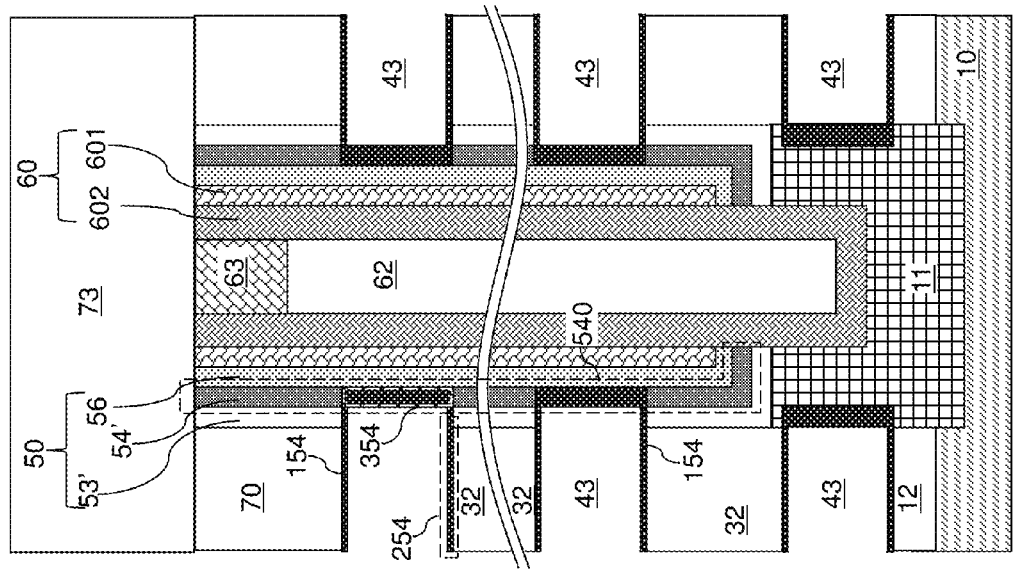

Referring to FIG. 7D, at least one backside blocking dielectric layer (153, 152) can be formed on the continuous silicon nitride layer 154, for example, employing one or more conformal deposition methods. For example, a continuous silicon oxide layer 153 and a continuous dielectric metal oxide layer 152 can be sequentially formed in the backside recesses 43, over the sidewalls of the backside trench 79, and over the contact level dielectric layer 73. The continuous silicon oxide layer 153 can have a thickness in a range from 1 nm to 6 nm, although lesser and greater thicknesses can also be employed. The continuous dielectric metal oxide layer 152 includes a dielectric metal oxides such as aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, or stacks thereof. The continuous dielectric metal oxide layer 152 can have a thickness in a range from 1 nm to 6 nm, although lesser and greater thicknesses can also be employed. The layer stack of the continuous silicon nitride layer 154 and the continuous silicon oxide layer 153 collectively constitutes a backside blocking dielectric layer (152, 153).

Figure 7E:
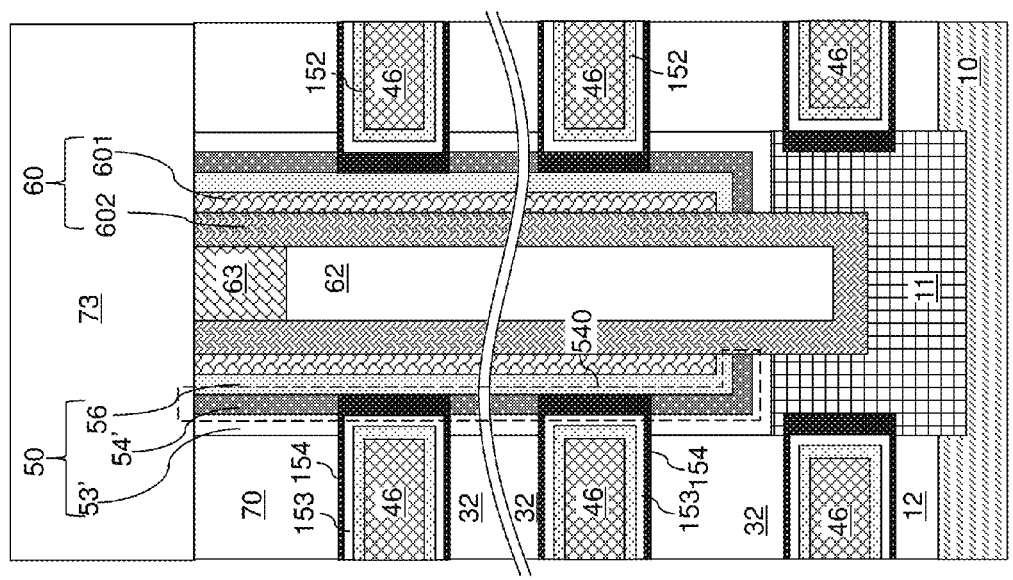
Figure 8:
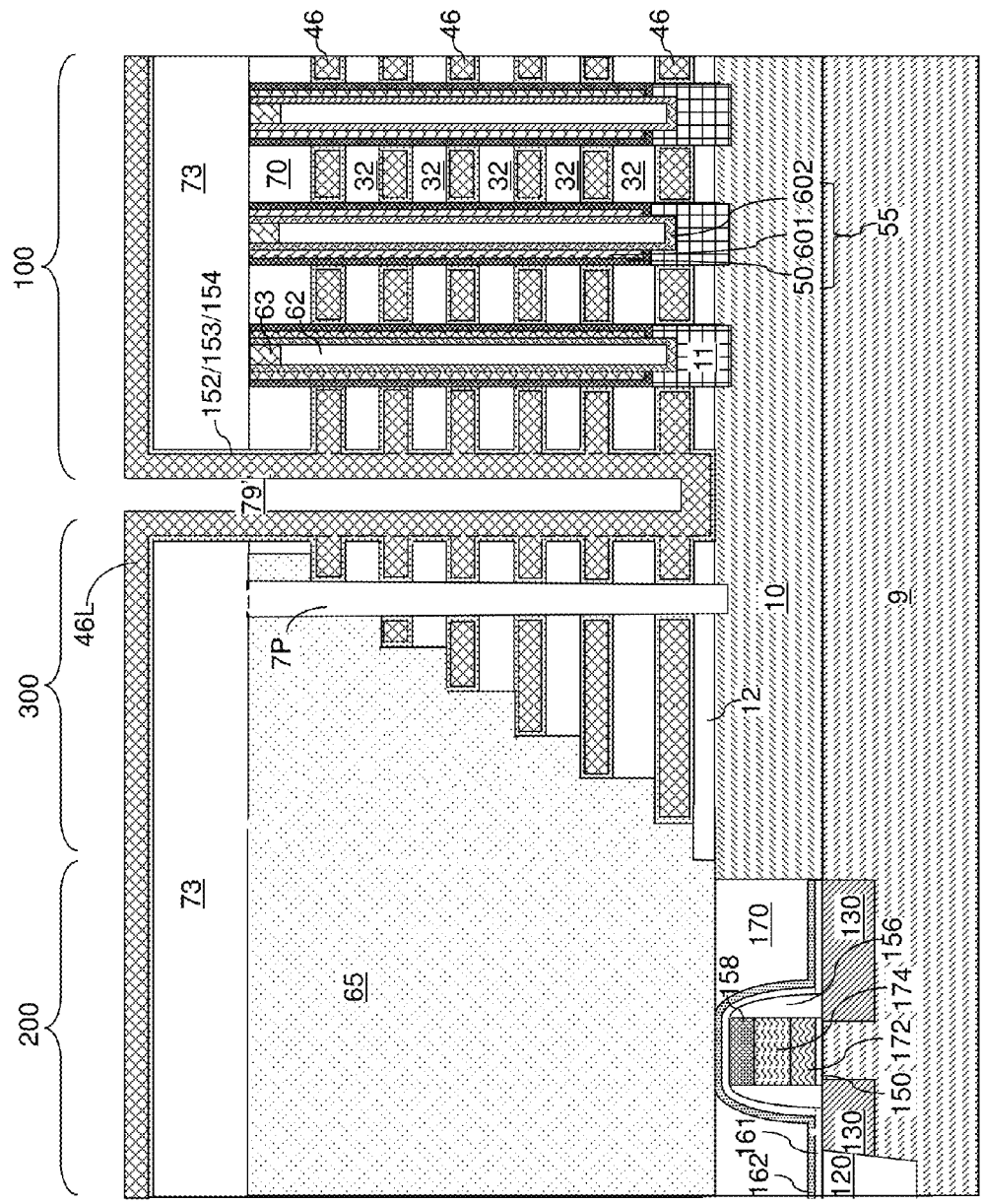
FIG. 8 is a vertical cross-sectional view of the first exemplary structure after formation of electrically conductive layers according to the first embodiment of the present disclosure.

Referring to FIGS. 7E and 8, at least one metallic material can be deposited in the unfilled volumes of the backside recesses 43, over the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer (152, 153), the continuous silicon nitride layer 154, and the contiguous metallic material layer 46L.

Figure 9:
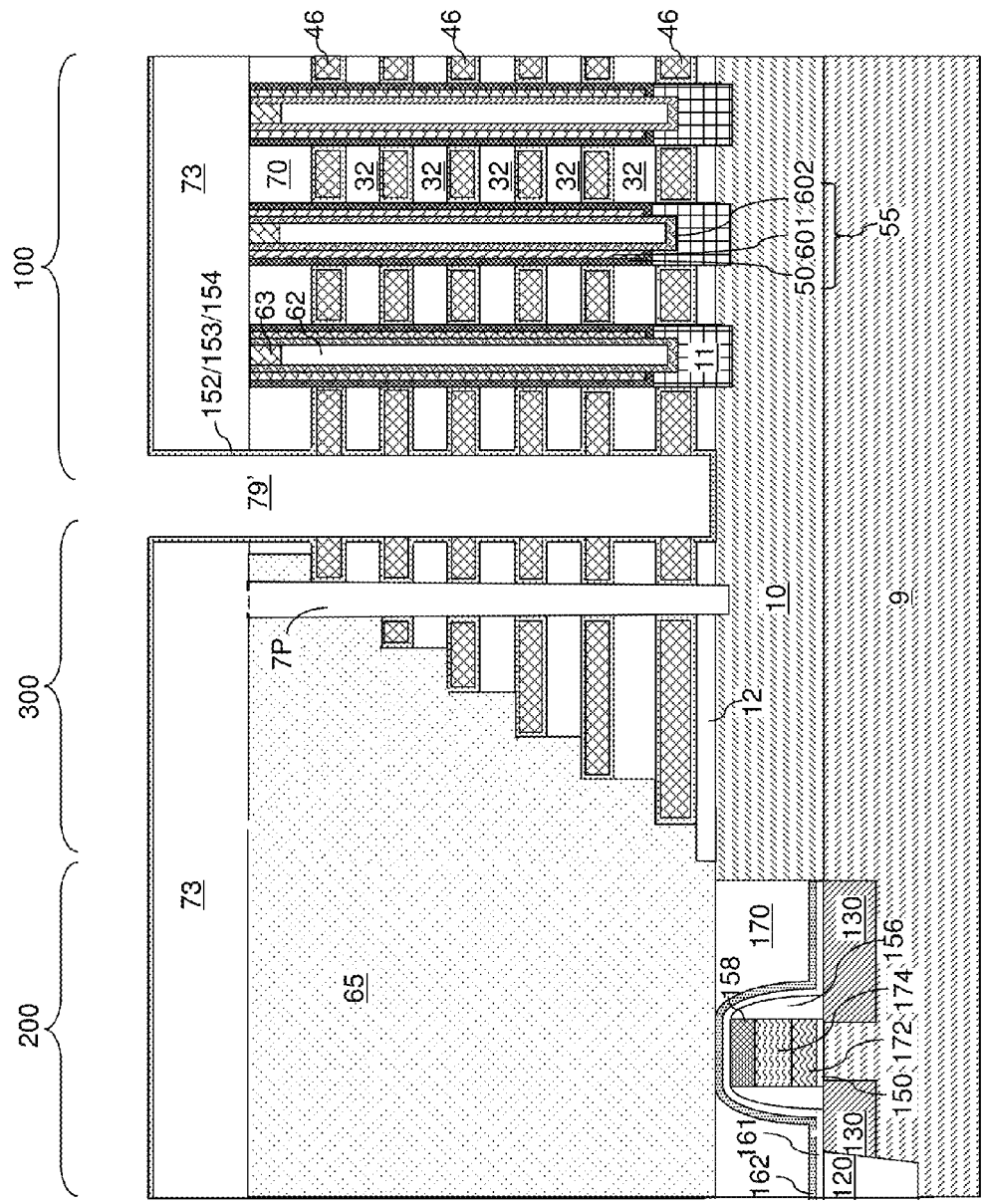
FIG. 9 is a vertical cross-sectional view of the first exemplary structure after removal of a deposited conductive material from within the backside trench according to the first embodiment of the present disclosure.

Referring to FIG. 9, the deposited metallic materials of the contiguous electrically conductive material layer 46L is etched back from the sidewalls of each backside contact trench 79 and from above the contact level dielectric layer 73, for example, by an anisotropic or isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 10:
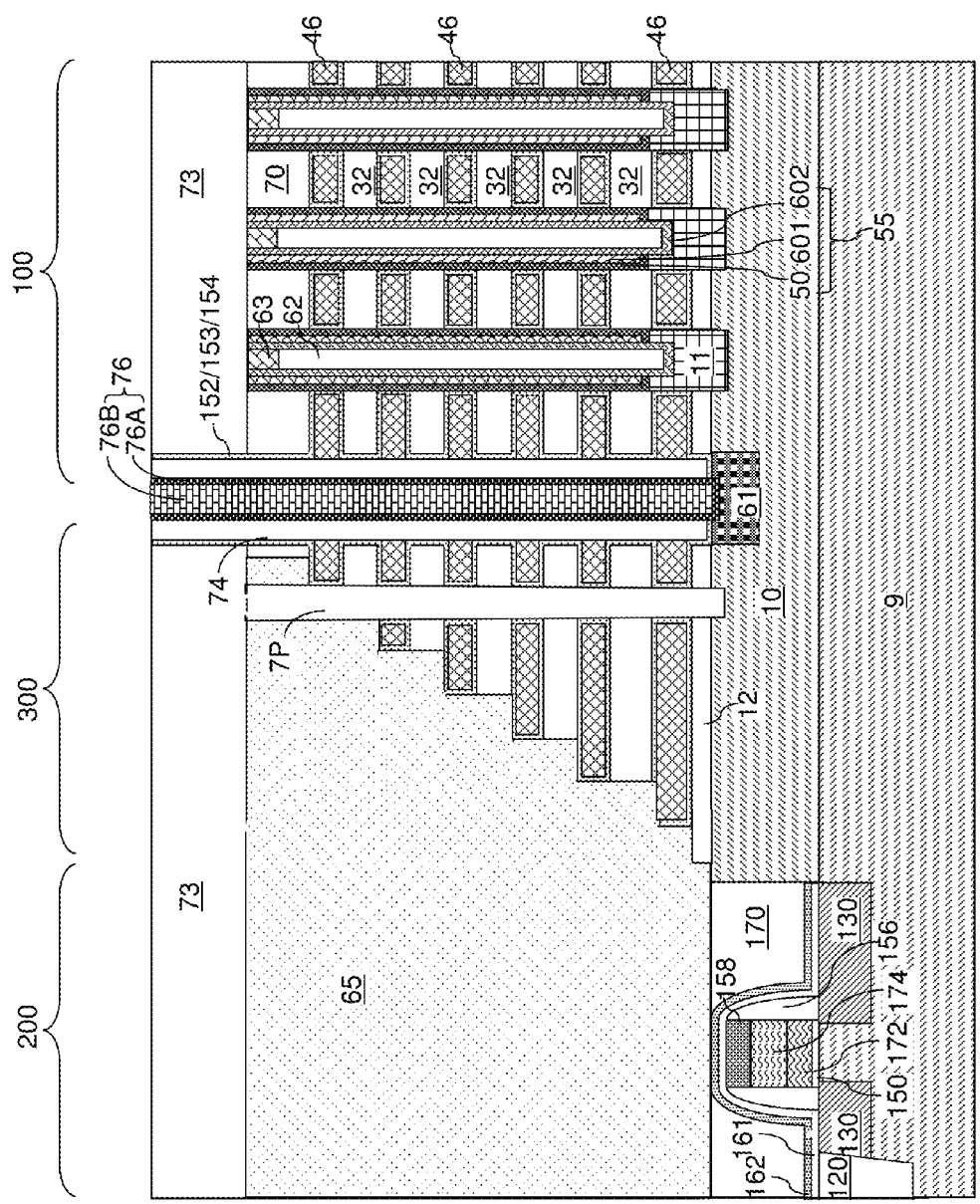
FIG. 10 is a vertical cross-sectional view of the first exemplary structure after formation of an insulating spacer, a source region, and a backside contact trench according to the first embodiment of the present disclosure.

Referring to FIG. 10, an insulating spacer 74 can be formed by deposition of a conformal insulating material layer and an anisotropic etch that removes horizontal portions of the conformal insulating material layer. A source region 61 can be formed at the bottom of each cavity 79' by implantation of electrical dopants into surface portions of the semiconductor material layer 10 that underlie an opening through the insulating spacer 74. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

A contact via structure 76 can be formed within each cavity 79'. Each contact via structure 76 can fill a respective cavity 79'. Each contact via structure 76 can be formed inside an insulating spacer 74 located within a respective backside contact trench 79. The contact via structures 76 can be formed by depositing at least one conductive material in each remaining unfilled volume (i.e., the cavities 79') of the backside contact trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof. Alternatively, the portions 76A and 76B may comprise a metal, such as W, and doped polysilicon.

The at least one conductive material can be planarized, for example, by chemical mechanical planarization (CMP). Each remaining continuous portion of the at least one conductive material in the backside contact trenches 79 constitutes a backside contact via structure 76. Each contact via structure 76 can be formed directly on a top surface of a source region 61.

Figure 11:
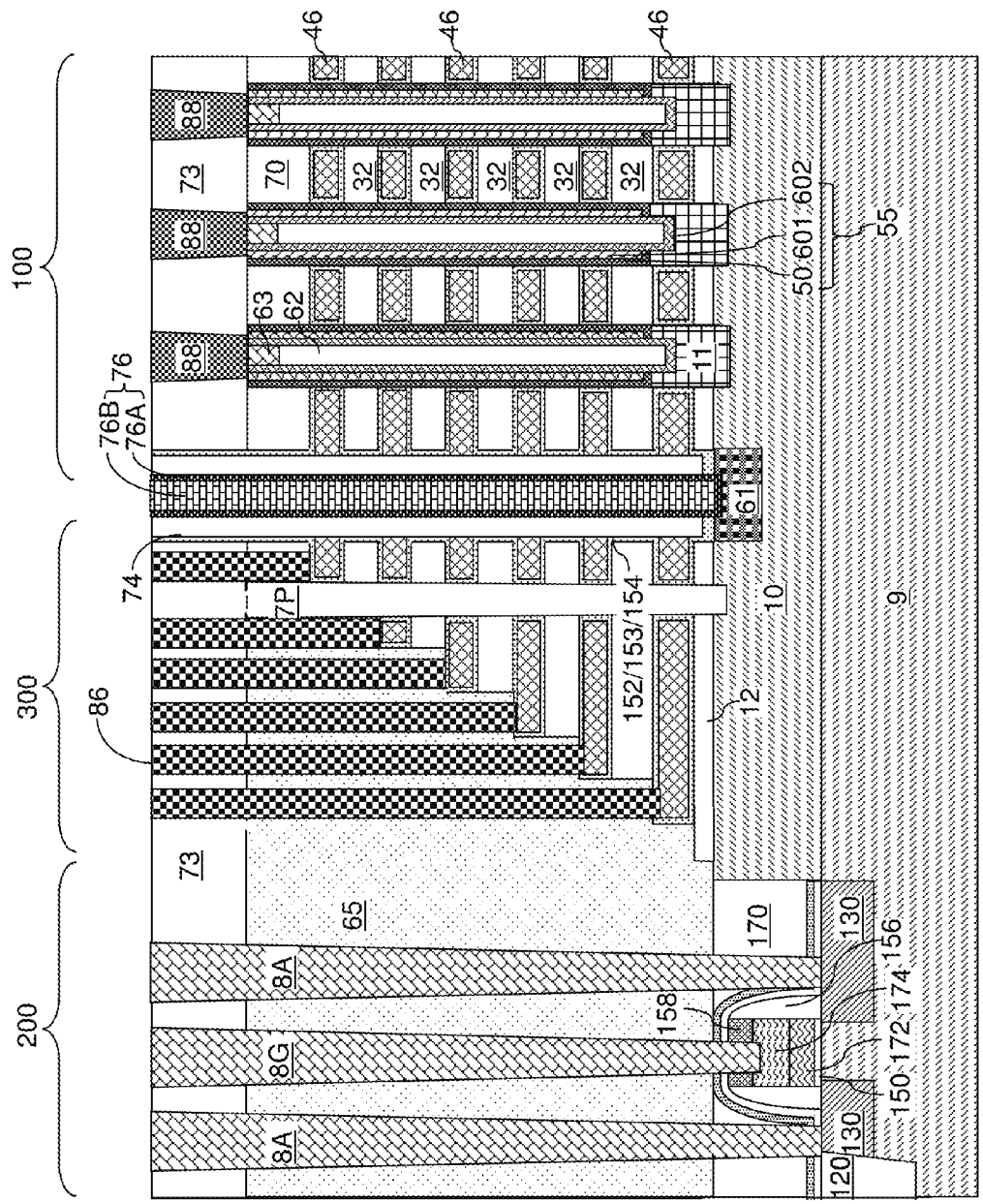
FIG. 11 is a vertical cross-sectional view of the first exemplary structure after formation of additional contact via structures according to the first embodiment of the present disclosure.

Referring to FIG. 11, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Bit lines (not shown) are subsequently formed in electrical contact with the structures 88. Word line contact via structures 86 can be formed on the electrically conductive layers 46 through the contact level dielectric layer 73 and through the retro-stepped dielectric material portion 65. Peripheral gate contact via structures 8G and peripheral active region contact via structures 8A can be formed through the retro-stepped dielectric material portion 65 directly on respective nodes of the peripheral devices.

The first exemplary structure of the present disclosure includes a three-dimensional memory device. The three-dimensional memory device can include an alternating stack of insulating layers 32 and electrically conductive layers 46 located over a substrate (9, 10); and a memory stack structure 55 extending through the alternating stack (32, 42) and comprising a compositionally modulated charge storage layer 540, a tunneling dielectric layer 56, and a vertical semiconductor channel 60. The compositionally modulated charge storage layer 540 comprises a vertically alternating stack of silicon nitride portions (i.e., vertical portions of the continuous silicon nitride layer 154) and oxygen-containing dielectric silicon compound portions 54'.

In one embodiment, each silicon nitride portion of the compositionally modulated charge storage layer 540 can be a vertical portion of a continuous silicon nitride layer 154 that extends from a bottommost level of the electrically conductive layers 46 to a topmost level of the electrically conductive layers 46. In one embodiment, horizontal portions of the continuous silicon nitride layer can have a lesser thickness than the silicon nitride portions of the compositionally modulated charge storage layer 540.

In one embodiment, at least one backside blocking dielectric layer (152, 153) can be located between the continuous silicon nitride layer 154 and each of the electrically conductive layers 46. In one embodiment, the at least one backside blocking dielectric layer (152, 153) can comprise a stack of a continuous silicon oxide layer 153 and a continuous dielectric metal oxide layer 152.

In one embodiment, the insulating layers 32 can comprise silicon oxide, and each horizontal interface region between horizontal portions of the continuous silicon nitride layer 154 and the insulating layers 32 can have a vertical nitrogen concentration gradient induced by the nitridation process. This is because the diffusion of nitrogen atoms into the insulating layers 32 is stochastic and forms a finite-thickness region having a finite nitrogen concentration gradient.

In one embodiment, the tunneling dielectric layer 56 can contact substantially vertical inner sidewalls of the compositionally modulated charge storage layer 540, which include inner sidewalls of the oxygen-containing dielectric silicon compound portions 54' and the inner sidewalls of the silicon nitride portions 354 of the continuous silicon nitride layer 154. In one embodiment, the oxygen-containing dielectric silicon compound portions 54' can be discrete structures that are vertically spaced apart among one another by the silicon nitride portions 354 and located at each level of the insulating layers 32.

In one embodiment, the silicon nitride portions 354 can be located at each level of the electrically conductive layers 46, and the oxygen-containing dielectric silicon compound portions 54' can be located at each level of the insulating layers 32. In one embodiment, inner sidewalls of the silicon oxide portions 53' can be vertically coincident with inner sidewalls of the oxygen-containing dielectric silicon compound portions 54'. In one embodiment, at least one bottommost oxygen-containing dielectric silicon compound portion 54' among the oxygen-containing dielectric silicon compound portions 54' can contact an outer sidewall of the vertical semiconductor channel 60 (e.g., the outer surface of the second vertical semiconductor channel 602), and all oxygen-containing dielectric silicon compound portions 54' except the at least one bottommost oxygen-containing dielectric silicon compound portion 54' can be laterally spaced from the vertical semiconductor channel 60 by the tunneling dielectric layer 56.

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels 60 (e.g., 601, 602). At least one end portion of each of the plurality of semiconductor channels 60 (e.g., 601, 602) extends substantially perpendicular to a top surface of the substrate (9, 10). In one embodiment, the plurality of semiconductor channels can be connected in a parallel connection to a common horizontal semiconductor channel portion that is a portion of the semiconductor material layer 10 between a source region 61 and the epitaxial channel portions 11, the epitaxial channel portions 11, and the vertical semiconductor channels 60 that are portions of the memory stack structures 55. The array of monolithic three-dimensional NAND strings can comprise a plurality of charge storage elements (which can be embodied as sections of an oxygen-containing dielectric silicon compound layer 54 that is present within each memory stack structure 55). Each charge storage element can be located adjacent to a respective one of the plurality of semiconductor channels, i.e., adjacent to a respective vertical semiconductor channel 60 (e.g., 601, 602). The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The compositionally modulated charge storage layer 540 includes a vertical stack of charge storage regions that are embodied as the vertical portions 354 of the continuous silicon nitride layer 154 located in the memory opening 49. The vertical portions 354 of the continuous silicon nitride layer 154 store electrical charges upon programming. The vertical stack of charge storage regions laterally surrounds the tunneling dielectric layer 56. The vertical portions of the continuous silicon nitride layer 154 provide superior electrical charge trapping characteristics relative to the oxygen-containing dielectric silicon compound portions 54'. Since the oxygen-containing dielectric silicon compound portions 54' trap less electrical charges, vertical diffusion of electrical charges stored in the vertical portions 354 of the continuous silicon nitride layer 154 can be reduced due to reduced charge trapping property in the oxygen-containing dielectric silicon compound portions 54'. In other words, the charge trapping characteristics of the charge trapping material layer is enhanced at each level of the electrically conductive layers 46 (i.e., in each memory cell), and is suppressed at each level of the insulating layers 32 (i.e., between memory cells). By suppressing or reducing vertical diffusion of trapped electrical charges, charge retention characteristics of the three-dimensional NAND memory device can be enhanced.

According to another aspect of the present disclosure, the memory stack structures 55, the backside blocking dielectric layer (152, 153), and the continuous silicon nitride layer 154 of the first exemplary structure can be modified or replaced with different elements to form additional exemplary structures.

Referring to FIG. 12A, a second exemplary structure according to a second embodiment of the present disclosure can be derived from the first exemplary structure at the processing steps of FIG. 3A. Specifically, the first exemplary structure illustrated in FIG. 3A can be modified by performing an oxidation process to provide the second exemplary structure. The oxidation process converts the surface portions of the sacrificial material layers 42 around each memory opening 49 to form annular etch stop material portions 253. The oxidation process can be a thermal oxidation process or a plasma oxidation process, such as an in-situ steam generation ("ISSG") or a $N_2O$ plasma oxidation. In one embodiment, the insulating layers 32 can include silicon oxide, and the sacrificial material layers 42 can include silicon nitride. The thickness of the annular etch stop material portions 253, as measured along a radial direction from a geometrical center axis of the memory opening 49, can be in a range from 3 nm to 10 nm, such as from 4 nm to 6 nm, although lesser and greater thicknesses can also be employed. The annular etch stop material portions 253 have a different material composition than the sacrificial material layers 42 due to incorporation of oxygen atoms, and functions as etch stop structures during a subsequent etch process employed to remove the sacrificial material layers selective to the insulating layers 32.

For example, if the sacrificial material layers 42 include silicon nitride, the annular etch stop material portions 253 can include silicon oxynitride or silicon oxide. In one embodiment, a very sharp interface (e.g., having a thickness less than 1 nm) is located between the oxide annular etch stop material portions 253 and nitride sacrificial material layers 42. As discussed above, silicon oxynitride refers to a material composition of $Si_{(1+/-\delta)}O_{2(1-x)}N_{4x/3}$ in which δ is in a range from, and including, 0 to 0.1, and x is greater than 0.02 and less than 0.98. Silicon oxide refers to a material composition of $Si_{(1+/-\delta)}O_{2(1-x)}N_{4x/3}$ or a doped derivative therefrom that is doped with atoms other than Si, O, and N, and in which δ is in a range from, and including, 0 to 0.1, and x is either zero or a positive number not greater than 0.02. Silicon nitride refers to a material composition of $Si_{(1+/-\delta)}O_{2(1-x)}N_{4x/3}$, and in which δ is in a range from, and including, 0 to 0.1, and x is in a range from 0.98 to 1.

In one embodiment, the annular etch stop material portions 253 can have a material composition of $Si_{(1+/-\delta)}O_{2(1-x)}N_{4x/3}$ in which x can be in a range from 0 to 0.2. In another embodiment, x can be in a range from 0 to 0.1. In yet another embodiment, x can be in a range from 0 to 0.02 and the annular etch stop material portions 253 can include silicon oxide. In still another embodiment, x can be greater than 0.02 and less than 0.05 and the annular etch stop material portions 253 can include silicon oxynitride. If the number 1+/−δ is greater than 1.0, then the silicon oxynitride is silicon rich. If the number 1+/−δ is less than 1.0, then the silicon oxynitride is silicon deficient. If the number δ is zero, then the silicon oxynitride is stoichiometric. If the number x does not exceed 0.02, the compound is considered to be a silicon oxide.

The annular etch stop material portions 253 are formed at each level of the sacrificial material layers around the memory opening. As used herein, an "annular" element refers to an element that includes a single opening therethrough. The each of the annular etch stop material portions 253 can have an inner sidewall that is physically exposed to the memory opening 49, an outer sidewall contacting a respective sacrificial material layer, an annular top surface adjoining an upper periphery of the inner sidewall and an upper periphery of the outer sidewall, and an annular bottom surface adjoining a lower periphery of the inner sidewall and a lower periphery of the outer sidewall. A dielectric semiconductor oxide plate 212 can be collaterally formed during the oxidation process by conversion of a surface portion of the semiconductor material layer 10 at the bottom of each memory opening 49. If the semiconductor material layer 10 includes silicon, the dielectric semiconductor oxide plate 212 can include silicon oxide.

Referring to FIG. 12B, an anisotropic etch process can be performed to remove the dielectric semiconductor oxide plate 212. By employing highly directional plasma during the anisotropic etch process, collateral damages to the inner sidewalls of the annular etch stop material portions 253 can be minimized Plasma of a hydrofluorocarbon gas can be employed to etch the dielectric semiconductor oxide plate 212. A top surface of the semiconductor material layer 10 can be physically exposed at the bottom of each memory opening 49 after removal of the dielectric semiconductor oxide plates 212. As used herein, a surface is "physically exposed" if the surface is in physical contact with vacuum, a gaseous environment, or a plasma environment.

Referring to FIG. 12C, the processing steps of FIG. 3B can be optionally performed to form an epitaxial pedestal 11 at the bottom of each memory opening 49. A cavity 49' is present in the unfilled portion of the memory opening 49 above the epitaxial pedestal 11.

Referring to FIG. 12D, a tunneling dielectric layer 556 can be deposited on the sidewalls of each memory opening 49. The tunneling dielectric layer 556 includes at least one tunneling dielectric sublayer (562, 564, 566). As used herein, a "sublayer" refers to a layer that is a component of another layer. In one embodiment, each layer within the at least one tunneling dielectric sublayer (562, 564, 566) may be formed within a volume entirety within the memory opening 49 at least by deposition of a respective material within the memory opening 49. In one embodiment, the at least one tunneling dielectric sublayer (562, 564, 566) can include multiple tunneling dielectric sublayers.

In one embodiment, the tunneling dielectric layer 556 cam include a layer stack that that includes an outer silicon oxide layer 562, a silicon nitride layer 564, and an inner silicon oxide layer 566, which is herein referred to as an "ONO stack." The outer silicon oxide layer 562 and the inner silicon oxide layer 566 include silicon oxide. The silicon nitride layer 564 includes silicon nitride, i.e., has a composition of $Si_{(1+/-\eta)}O_{2(1-z)}N_{4z/3}$ in which η is in a range from, and including, 0 to 0.1, and z is in a range from 0.98 to 1. The thickness of the outer silicon oxide layer 562 can be in a range from 1 nm to 3 nm, the thickness of the silicon nitride layer 564 can be in a range from 2 nm to 5 nm, and the thickness of the inner silicon oxide layer 566 can be in a range from 1 nm to 3 nm, although lesser and greater thicknesses can also be employed for each of the layers within the tunneling dielectric layer 556.

Subsequently, the optional first semiconductor channel layer can be deposited employing the processing steps of FIG. 3C. An anisotropic etch process can be performed to remove horizontal portions of the optional first semiconductor channel layer and the tunneling dielectric layer 556. Each remaining portion of the first semiconductor channel layer in the memory openings 49 constitutes a first semiconductor channel portion 601. Horizontal portions of the tunneling dielectric layer 556 are removed from above the insulating cap layer 70 and from within the areas of openings through the first semiconductor channel portions 601. A surface of the epitaxial channel portion 11 (or a surface of the semiconductor material layer 10 in case the epitaxial channel portions 11 are not employed) can be physically exposed underneath the opening through the first semiconductor channel portion 601 and the tunneling dielectric layer 556 within each memory opening 49.

The processing steps of FIGS. 3E-3F can be sequentially performed to form a second semiconductor channel portion 602, a dielectric core 62, and a drain region 63 within each memory opening 49. Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A set of a vertical semiconductor channel 60, a tunneling dielectric layer 556, and all annular etch stop material portions 253 contacting the tunneling dielectric layer 556 collectively constitutes an in-process memory stack structure (60, 556, 253), which is subsequently modified to form a memory stack structure.

Subsequently, the processing steps of FIGS. 5A and 5B can be performed to form backside contact trenches 79.

Referring to FIG. 13A, the processing steps of FIG. 6 can be performed to form backside recesses 43. Specifically, the backside recesses 43 are formed by removing the sacrificial material layers 42 selective to the annular etch stop material portions 253, the insulating layers 32, and the semiconductor material layer 10. In one embodiment, the sacrificial material layers 42 can include silicon nitride, the annular etch stop material portions 253 can include silicon oxide or silicon oxynitride, and the sacrificial material layers 42 can be removed by a wet etch employing phosphoric acid.

Figure 13B:
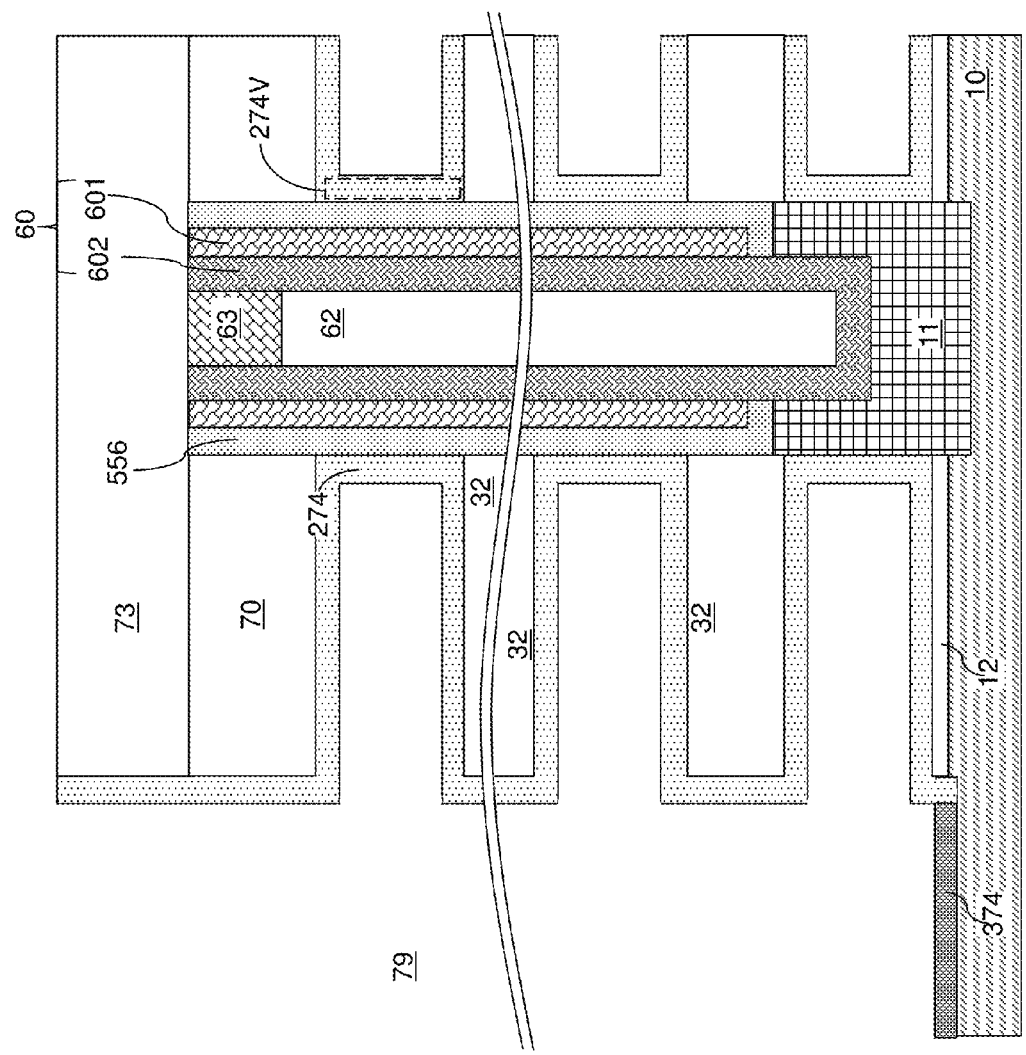

Referring to FIG. 13B, the annular etch stop material portions 253 can be at least partially converted into charge trapping material portions 274V including a dielectric compound comprising silicon and nitrogen by a nitridation process. The nitridation process can form a continuous charge trapping material layer 274 by nitridation of physically exposed surfaces of the insulating layers 32 and the annular etch stop material portions 253. The continuous charge trapping material layer 274 includes the dielectric compound comprising silicon and nitrogen, and continuously extends from the bottommost insulating layer 32 to the topmost insulating layer 32.

The nitridation process can be a thermal nitridation process or a plasma nitridation process. A nitrogen-containing gas such as $NH_3$ or $N_2$ can be employed during the thermal nitridation process or the plasma nitridation process to convert surface portions of silicon-containing materials into silicon oxynitride portions or silicon nitride portions. For example, the insulating layers 32, the insulating cap layer 70, and the contact level dielectric layer 73 can include silicon oxide, the semiconductor material layer 10 can include silicon, and the annular etch stop material portions 253 can include silicon oxide or silicon oxynitride. In this case, the continuous charge trapping material layer 274 can include a continuous silicon oxynitride layer. In one embodiment, a semiconductor nitride portion 374 can be formed by nitridation of a surface portion of the semiconductor material layer 10 underneath each backside contact trench 79 concurrently with formation of the continuous charge trapping material layer 274. A portion of the gate dielectric layer 12 may be converted into a portion of the continuous charge trapping material layer 274.

In one embodiment, the process parameters of the nitridation process can be selected such that the entirety of each annular etch stop material portion 253 can be converted into vertical portions of the continuous charge trapping material layer 274 within an increase in nitrogen concentration. In this case, the continuous charge trapping material layer 274 can include horizontal portions located between each vertically neighboring pair of a lateral recess 43 and an insulating layer 32, vertical portions contacting a respective tunneling dielectric layer 556, and additional vertical portions that contact each distal sidewall of the insulating layers 32. As used herein, a proximal sidewall of an insulating layer 32 refers to a sidewall of an insulating layer 32 that contacts an in-process memory stack structure or a memory stack structure, or is physically exposed to a memory opening 49. As used herein, a distal sidewall of an insulating layer 32 refers to a sidewall of an insulating layer 32 that does not contact any in-process memory stack structure, does not contact any memory stack structure, and is not physically exposed to a memory opening 49.

Each vertical portion of the continuous charge trapping material layer 274 that contacts a respective tunneling dielectric layer 556 constitutes a charge trapping material portion 274V. In one embodiment, the sacrificial material layers 42 can include silicon nitride layers, the annular etch stop material portions 253 can be formed by conversion of surface portions of the silicon nitride layers (of the sacrificial material layers 42) into dielectric oxygen-containing silicon compound portions that include a material selected from silicon oxide and silicon oxynitride, and the nitridation process can convert the entirety of each annular etch stop material portions 253 into the charge trapping material portions 274V.

In one embodiment, the annular etch stop material portions 253 can include silicon oxynitride prior to conversion into the charge trapping material portions, and the insulating layers 32 can consist essentially of silicon oxide prior to formation of the continuous charge trapping material layer 274. In this case, the higher nitrogen content in the annular etch stop material portions 253 than in the insulating layers 32 can result in a higher nitrogen content in the charge trapping material portions 274V than in portions of the continuous charge trapping material layer 274 derived from the insulating layers 32. In one embodiment, the charge trapping material portions 274V can comprise a first silicon oxynitride material, and horizontal portions of the continuous silicon oxynitride layer 274 can comprise a second silicon oxynitride material having a lesser average nitrogen concentration than the first silicon oxynitride material. The tunneling dielectric layer 556 contacts each charge trapping material portion 274V that laterally surrounds the tunneling dielectric layer 556.

Figure 13C:
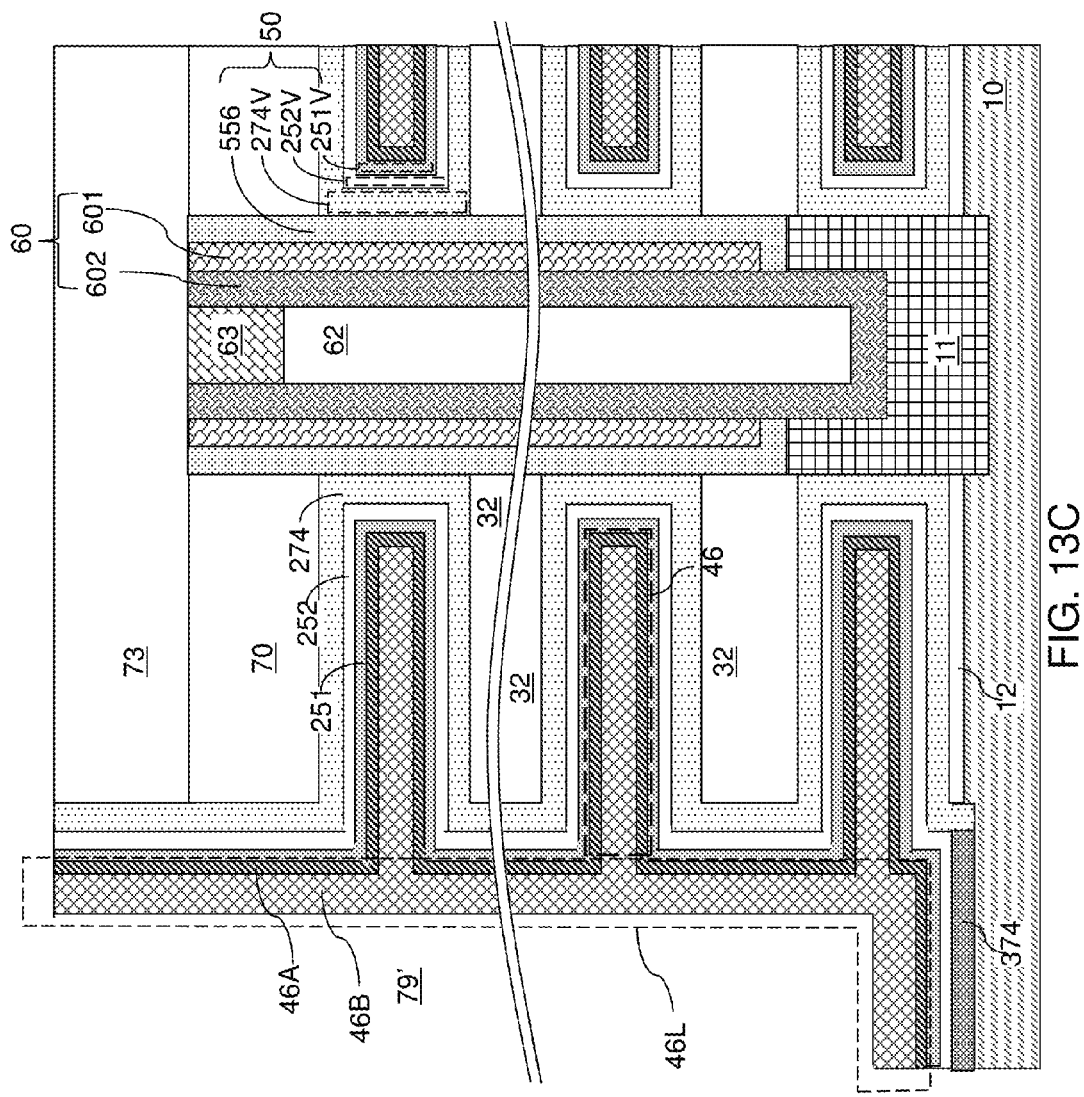

Referring to FIG. 13C, at least one continuous backside blocking dielectric layer (252, 251) can be formed in the backside recesses 43 and the backside contact trenches 79 by at least one conformal deposition process. For example, the at least one continuous backside blocking dielectric layer (252, 251) can include a continuous dielectric silicon compound layer 252 and a continuous dielectric metal oxide layer 251. In one embodiment, the continuous dielectric silicon compound layer 252 can be a silicon oxide layer having a thickness in a range from 1 nm to 6 nm, although lesser and greater thicknesses can also be employed. The continuous dielectric metal oxide layer 251 can be an aluminum oxide layer having a thickness in a range from 1.5 nm to 6 nm, although lesser and greater thicknesses can also be employed. Each of the continuous dielectric silicon compound layer 252 and the continuous dielectric metal oxide layer 251 can have a respective uniform thickness throughout, and can be deposited by a respective conformal deposition process such as chemical vapor deposition (CVD) or atomic layer deposition (ALD). Each of the at least one continuous backside blocking dielectric layer (252, 251) continuously extends from the bottommost insulating layer 32 to the topmost insulating layer 32, and can extend from the gate dielectric layer 12 to the contact level dielectric layer 73.

At least one electrically conductive material layer (46A, 46B) can be subsequently deposited on the at least one continuous backside blocking dielectric layer (252, 251). The at least one electrically conductive material layer (46A, 46B) can include, for example, a conductive metallic liner 46A that includes a conductive metallic nitride (such as TiN, TaN, or WN) and a conductive metal layer 46B that consists essentially of at least one metal. The at least one metal of the conductive metal layer 46B can be a single elemental metal (such as W, Co, Cu, or Al), or can be an intermetallic alloy of at least two elemental metals. Each of the conductive metallic liner 46A and the conductive metal layer 46B can be deposited by a conformal deposition process such as chemical vapor deposition or atomic layer deposition. The thickness of the conductive metallic liner 46A can be in a range from 1 nm to 6 nm, although lesser and greater thicknesses can also be employed. The thickness of the conductive metal layer 46B (as measured over a sidewall of a backside contact trench 79) can be selected such that the entirety of the backside recesses 43 is filled with deposited material layers that include the at least one continuous backside blocking dielectric layer (252, 251) and the at least one electrically conductive material layer (46A, 46B). Each continuous portion of the at least one electrically conductive material layer (46A, 46B) that fills a volume of a backside recess 43 constitutes an electrically conductive layer 46. The portions of the at least one electrically conductive material layer (46A, 46B) that do not belong to any of the electrically conductive layers 46 form a single continuous structure that are located within the backside contact trenches 79 or overlies the contact level dielectric layer 73, and are herein collectively referred to as a continuous conductive material layer 46L. A backside cavity 79' is present within each volume of the backside contact trenches 79 that is not filled with the continuous conductive material layer 46L.

Around each memory opening 49, a set of a tunneling dielectric layer 556, all charge trapping material portions 274V (i.e., charge storage regions) contacting the tunneling dielectric layer 556, vertical dielectric silicon compound portions 252V (which are vertical portions of the dielectric silicon compound layer 252) and vertical dielectric metal oxide portions 251V (which are vertical portions of the dielectric metal oxide layer 251) constitutes a memory film 50. Each adjoining set of a memory film 50 and a vertical semiconductor channel 60 constitutes a memory stack structure (50, 60).

Figure 13D:
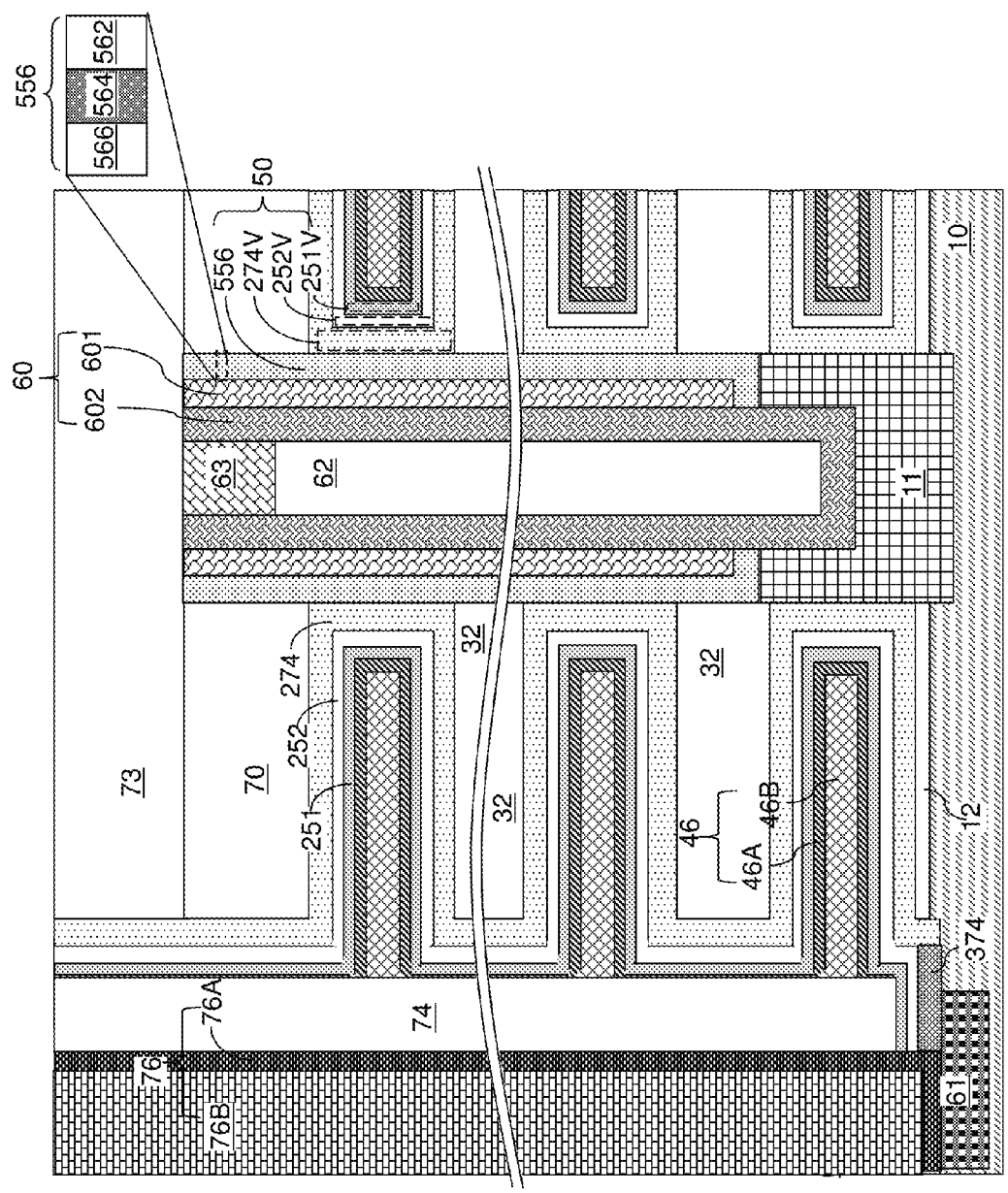

Referring to FIG. 13D, the processing steps of FIG. 9 can be performed to remove the continuous conductive material layer 46L from inside the backside contact trenches 79 and from above the contact level dielectric layer 73. Subsequently, the processing steps of FIG. 10 can be performed. Specifically, an insulating spacer 74 can be formed by deposition of a conformal insulating material layer and an anisotropic etch that removes horizontal portions of the conformal insulating material layer. The anisotropic etch can remove portions of the at least one continuous backside blocking dielectric layer (252, 251) and the semiconductor nitride portions 374 that underlie the backside cavities 79', i.e., within the areas of the openings defined by the insulating spacers 74.

A source region 61 can be formed at the bottom of each backside cavity 79' by implantation of electrical dopants into surface portions of the semiconductor material layer 10 that underlie an opening through the insulating spacer 74. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can underlie a respective insulating spacer 74.

A contact via structure 76 can be formed within each cavity 79'. Each contact via structure 76 can fill a respective cavity 79'. Each contact via structure 76 can be formed inside an insulating spacer 74 located within a respective backside contact trench 79. The contact via structures 76 can be formed by depositing at least one conductive material in each remaining unfilled volume (i.e., the cavities 79') of the backside contact trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof. Alternatively, the portions 76A and 76B may comprise a metal, such as W, and doped polysilicon.

The at least one conductive material can be planarized, for example, by chemical mechanical planarization (CMP). Each remaining continuous portion of the at least one conductive material in the backside contact trenches 79 constitutes a backside contact via structure 76. Each contact via structure 76 can be formed directly on a top surface of a source region 61.

Subsequently, the processing steps of FIG. 11 can be performed to form various additional contact via structures as in the first embodiment.

In the second exemplary structure, the charge trapping material portions 274V are vertical portions of a continuous charge trapping material layer 274 that extends through an alternating stack (32, 46) of insulating layers 32 and electrically conductive layers 46. The continuous charge trapping material layer 274 includes horizontal portions located between each vertically neighboring pair of an electrically conductive layer 46 and an insulating layer 32 within the alternating stack (32, 46). The continuous charge trapping material layer 274 includes additional vertical portions that contact each distal sidewall of the insulating layers 32. In one embodiment, the continuous charge trapping material layer 274 comprises a continuous silicon oxynitride layer. In one embodiment, the tunneling dielectric layer 556 comprises an ONO stack that includes at least one silicon oxide portion (such as the outer silicon oxide layer 562), a silicon nitride layer 564, and a silicon oxide layer (such as the inner silicon oxide layer 566) that contacts the vertical semiconductor channel 60.

The outer sidewall of the outer inner silicon oxide layer 566 can include first portions of outer sidewalls of the tunneling dielectric layer 556 that contacts the proximal sidewalls of the insulating layers 32, and second portions of the outer sidewall of the tunneling dielectric layer that are located at each level of the electrically conductive layer 46. In one embodiment, the charge trapping material portions 274V comprise a first silicon oxynitride material, and horizontal portions of the continuous silicon oxynitride layer 274 comprise a second silicon oxynitride material having a lesser average nitrogen concentration than the first silicon oxynitride material.

Figure 14A:
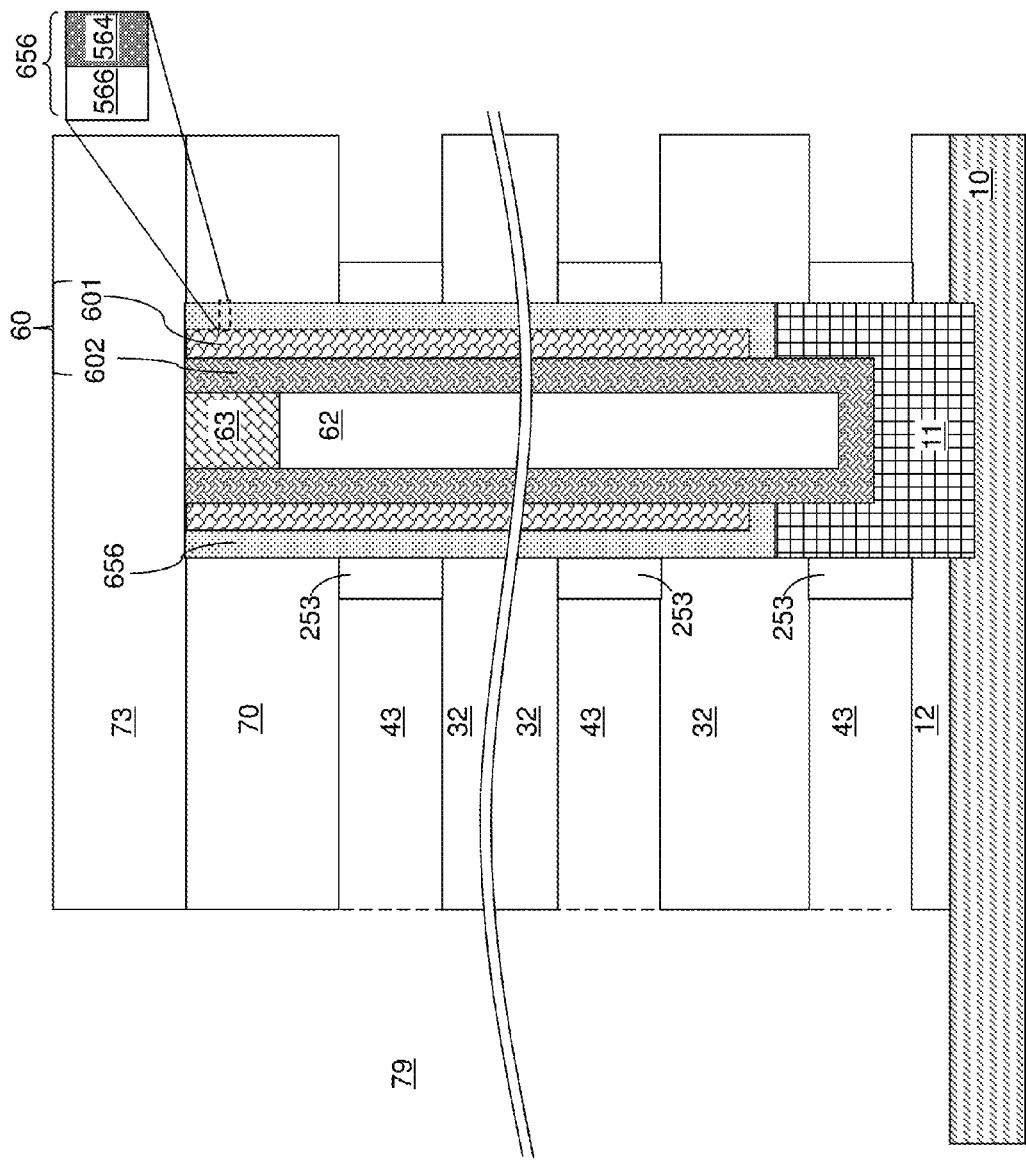
FIGS. 14A-14D are sequential vertical cross-sectional views of a memory opening within a third exemplary structure during various processing steps employed to form a continuous charge trapping material layer, continuous backside blocking dielectric layers, and electrically conductive layers according to a third embodiment of the present disclosure.

Referring to FIGS. 14A-14D, a third exemplary structure according to a third embodiment of the present disclosure can be derived from the second exemplary structure of FIG. 12D by replacing the tunneling dielectric layer 556 of the second exemplary structure with a tunneling dielectric sublayer stack 656, which includes a stack of a silicon nitride layer 564 and an inner silicon oxide layer 566. Referring to FIG. 14A, formation of the outer silicon oxide layer 562 is omitted in the third exemplary structure at the processing step of formation of the tunneling dielectric layer 556. Thus, the tunneling dielectric sublayer stack 656 consisting of the silicon nitride layer 564 and the inner silicon oxide layer 566 can be employed in the third exemplary structure in lieu of the tunneling dielectric layer 556 of the second embodiment. The tunneling dielectric sublayer stack 656 is a stack of a silicon nitride layer and a silicon oxide layer, and is herein referred to as a NO stack.

Optionally, the thickness of the annular etch stop material portions 253 can be increased in the third exemplary structure with respect to the annular etch stop material portions 253 of the second embodiment. For example, the duration of the oxidation process during formation of the annular etch stop material portions 253 can be increased so that the thickness of the annular etch stop material portions 253, as measured along a radial direction from a geometrical center axis of the memory opening 49, can be in a range from 4 nm to 12 nm, such as from 5 nm to 8 nm, although lesser and greater thicknesses can also be employed.

After formation of the tunneling dielectric sublayer stack 656, a first semiconductor channel portion 601, a second semiconductor channel portion 602, a dielectric core 62, and a drain region 63 can be formed within each memory opening 49 as in the first and second embodiments.

Subsequently, the processing steps of FIGS. 5A and 5B can be performed to form backside contact trenches 79 as in the first and second embodiments. The processing steps of FIG. 6 can be performed to form backside recesses 43 as in the second embodiment.

Figure 14B:
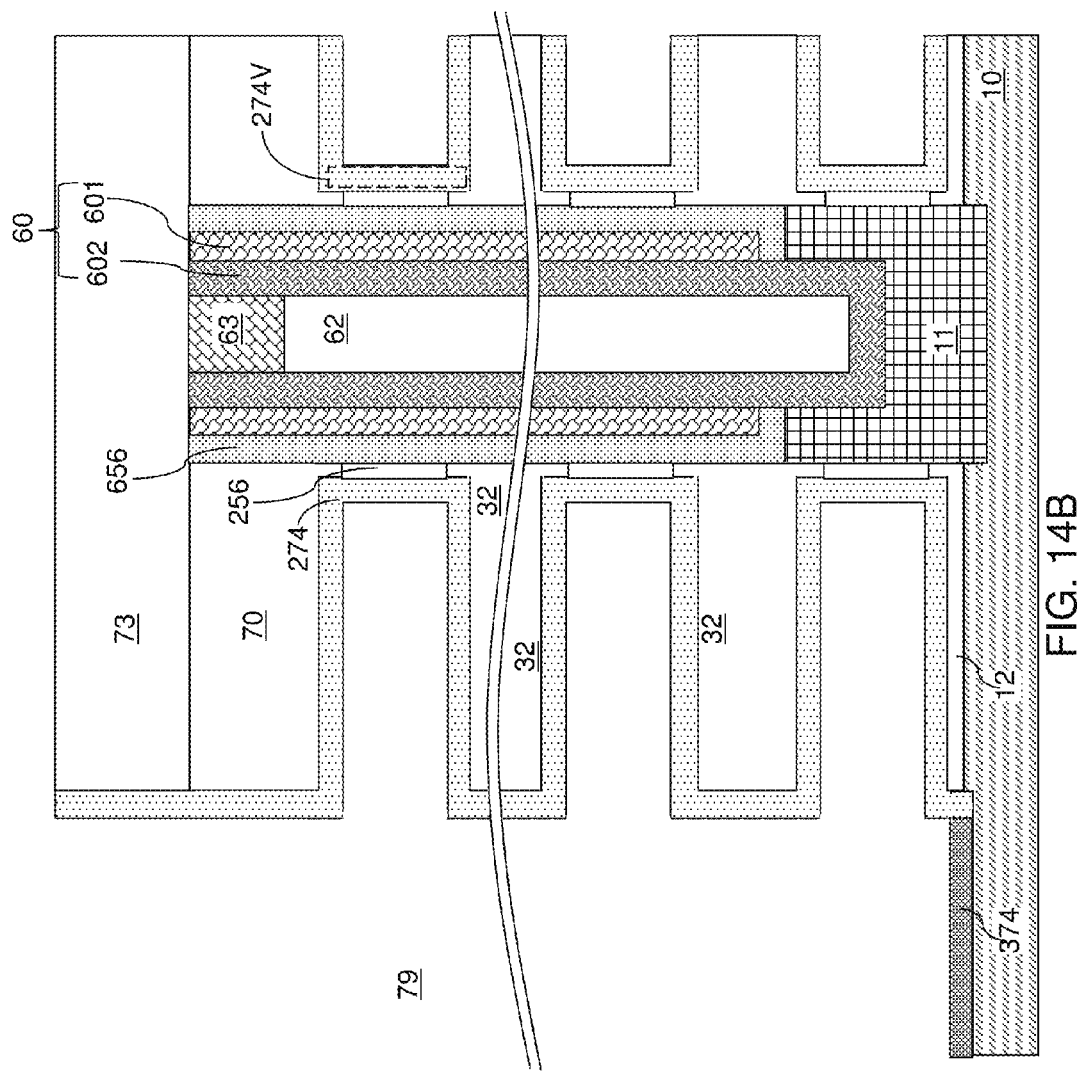

Referring to FIG. 14B, the annular etch stop material portions 253 can be partially converted into charge trapping material portions 274V including a dielectric compound comprising silicon and nitrogen by a nitridation process. The nitridation process can form a continuous charge trapping material layer 274 by nitridation of physically exposed surfaces of the insulating layers 32 and the annular etch stop material portions 253. The continuous charge trapping material layer 274 includes the dielectric compound comprising silicon and nitrogen, and continuously extends from the bottommost insulating layer 32 to the topmost insulating layer 32.

The nitridation process can be a thermal nitridation process or a plasma nitridation process as in the second embodiment. For example, the insulating layers 32, the insulating cap layer 70, and the contact level dielectric layer 73 can include silicon oxide, the semiconductor material layer 10 can include silicon, and the annular etch stop material portions 253 can include silicon oxide or silicon oxynitride. In this case, the continuous charge trapping material layer 274 can include a continuous silicon oxynitride layer. In one embodiment, a semiconductor nitride portion 374 can be formed by nitridation of a surface portion of the semiconductor material layer 10 underneath each backside contact trench 79 concurrently with formation of the continuous charge trapping material layer 274. A portion of the gate dielectric layer 12 may be converted into a portion of the continuous charge trapping material layer 274.

In one embodiment, the process parameters of the nitridation process can be selected such that only outer regions of each annular etch stop material portion 253 can be converted into vertical portions of the continuous charge trapping material layer 274 with an increase in nitrogen concentration, while the nitrogen concentration of the inner region of each annular etch stop material portion 253 remains substantially the same, i.e., does not change by more than 10%. In this case, each inner region of the annular etch stop material portions 253 can be an annular silicon oxide portion which functions as an outer tunneling dielectric sublayer material of a tunneling dielectric layer. As such, the annular silicon oxide portions are referred to as outer tunneling dielectric portions 256.

In this case, the continuous charge trapping material layer 274 can include horizontal portions located between each vertically neighboring pair of a lateral recess 43 and an insulating layer 32, vertical portions contacting a respective outer tunneling dielectric portion 256, and additional vertical portions that contact each distal sidewall of the insulating layers 32.

Each vertical portion of the continuous charge trapping material layer 274 that contacts a respective outer tunneling dielectric portion 256 constitutes a charge trapping material portion 274V. In one embodiment, the sacrificial material layers 42 can include silicon nitride layers, the annular etch stop material portions 253 can be formed by conversion of surface portions of the silicon nitride layers (of the sacrificial material layers 42) into silicon oxide, and the nitridation process can convert the outer portion of each annular etch stop material portions 253 into the charge trapping material portions 274V.

Each set of a tunneling dielectric sublayer stack 656 and all outer tunneling dielectric portions 256 that contact the tunneling dielectric sublayer stack 656 constitutes a tunneling dielectric layer (656, 256). The tunneling dielectric layer (656, 256) contacts each charge trapping material portion 274V that laterally surrounds the tunneling dielectric layer (656, 256).

Figure 14C:
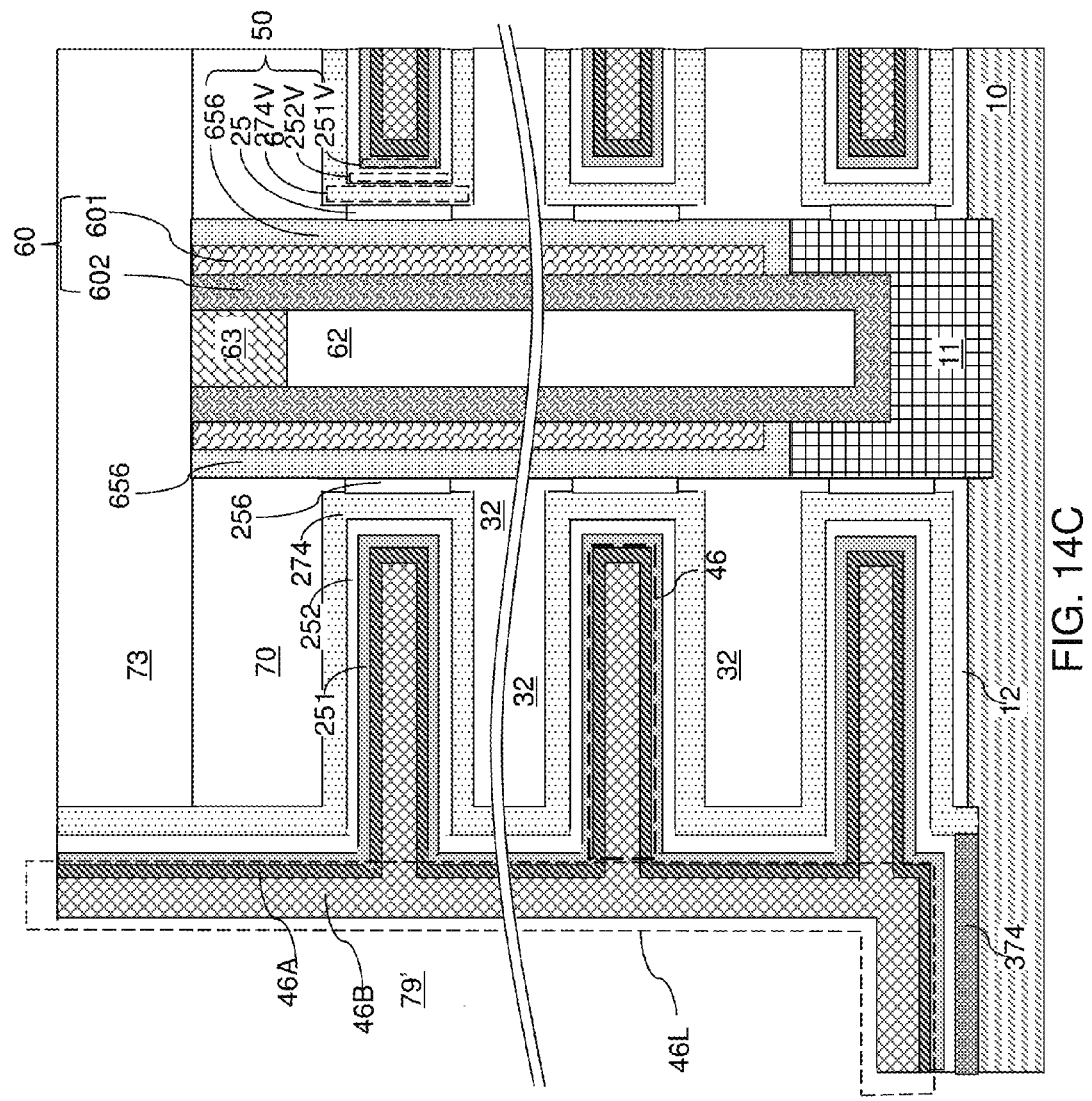

Referring to FIG. 14C, the processing steps of FIG. 13C can be performed to form at least one continuous backside blocking dielectric layer (252, 251) and at least one electrically conductive material layer (46A, 46B). Each continuous portion of the at least one electrically conductive material layer (46A, 46B) that fills a volume of a backside recess 43 constitutes an electrically conductive layer 46. The portions of the at least one electrically conductive material layer (46A, 46B) that do not belong to any of the electrically conductive layers 46 form a single continuous structure that are located within the backside contact trenches 79 or overlies the contact level dielectric layer 73, and are herein collectively referred to as a continuous conductive material layer 46L. A backside cavity 79' is present within each volume of the backside contact trenches 79 that is not filled with the continuous conductive material layer 46L.

Figure 14D:
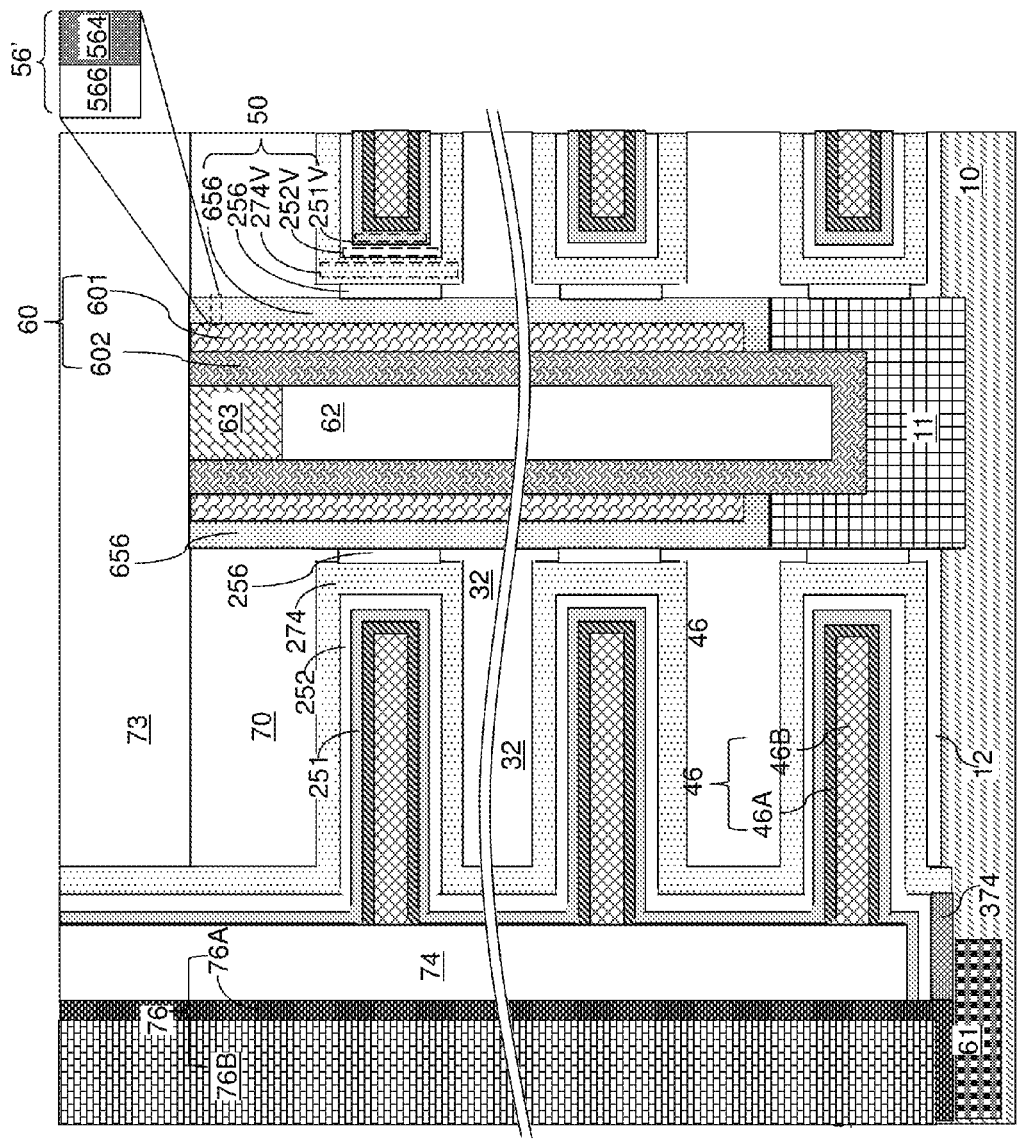

Referring to FIG. 14D, the processing steps of FIG. 9 can be performed to remove the continuous conductive material layer 46L from inside the backside contact trenches 79 and from above the contact level dielectric layer 73. Subsequently, the processing steps of FIG. 10 can be performed to form an insulating spacer 74, a source region 61, and a backside contact via structure 76 within, and underneath, each backside contact trench 79 as in the second embodiment.

In the third exemplary structure, the charge trapping material portions 274V are vertical portions of a continuous charge trapping material layer 274 that extends through an alternating stack (32, 46) of insulating layers 32 and electrically conductive layers 46. The continuous charge trapping material layer 274 includes horizontal portions located between each vertically neighboring pair of an electrically conductive layer 46 and an insulating layer 32 within the alternating stack (32, 46). The continuous charge trapping material layer 274 includes additional vertical portions that contact each distal sidewall of the insulating layers 32. In one embodiment, the continuous charge trapping material layer 274 comprises a continuous silicon oxynitride layer. In one embodiment, the tunneling dielectric layer (656, 256) comprises an ONO stack that includes at least one silicon oxide portion (such as the outer tunneling dielectric portions 256), a silicon nitride layer 564, and a silicon oxide layer (such as the inner silicon oxide layer 566) that contacts the vertical semiconductor channel 60.

In the third embodiment, the nitridation process converts an outer region of each annular etch stop material portion 253 into the charge trapping material portions 274V. Each remaining inner region of the annular etch stop material portions 253 constitutes an outer tunneling dielectric portion 256 contacting the at least one tunneling dielectric sublayer (such as the tunneling dielectric sublayer stack 656). The at least one tunneling dielectric sublayer 656 and the outer tunneling dielectric portions 256 collectively constitute the tunneling dielectric layer (656, 256). Each layer within the at least one tunneling dielectric sublayer 656 is formed within a volume entirety within the memory opening 49 at least by deposition of a respective material within the memory opening 49. Thus, the tunneling dielectric layer comprises a middle silicon nitride sublayer 564 and inner silicon oxide sublayer 566 which extend continuously through the entire height of the memory opening 49 above pedestal 11, as well as outer portions 256 which comprise discrete segments located between the insulating layers 32.

The tunneling dielectric layer (656, 256) can include a plurality of discrete silicon oxide portions comprising the outer tunneling dielectric portions 256. The outer sidewall of the tunneling dielectric sublayer stack 656 can include first portions of sidewalls of the tunneling dielectric layer (656, 256) that contact the proximal sidewalls of the insulating layers 32. The outer sidewalls of the outer tunneling dielectric portions 256 can include second portions of the outer sidewall of the tunneling dielectric layer (656, 256) that are located at each level of the electrically conductive layer 46. The outer tunneling dielectric portions 256 do not vertically extend into levels of the insulating layers 32.

In case the tunneling dielectric layer (656, 256) includes an ONO stack, the outer sidewalls of the silicon nitride layer 564 within the ONO stack comprise the first portions of the outer sidewall of the tunneling dielectric layer (656, 256) that contact the proximal sidewalls of the insulating layers 32. The silicon nitride layer 564 within the ONO stack contacts inner sidewalls of each of the plurality of discrete silicon oxide portions, i.e., the outer tunneling dielectric portions 256.

Referring to FIG. 15A, a fourth exemplary structure according to a fourth embodiment of the present disclosure can be derived from the second exemplary structure at the processing step of FIG. 12A by forming the annular etch stop material portions 253 with a greater thickness. For example, the duration of the oxidation process during formation of the annular etch stop material portions 253 can be increased so that the thickness of the annular etch stop material portions 253, as measured along a radial direction from a geometrical center axis of the memory opening 49, can be in a range from 6 nm to 20 nm, such as from 8 nm to 12 nm, although lesser and greater thicknesses can also be employed. A dielectric semiconductor oxide plate 212 can be formed at the bottom of each memory opening 49.

Referring to FIG. 15B, the processing steps of FIG. 12B can be performed to anisotropically etch the dielectric semiconductor oxide plate 212. Optionally, the processing steps of FIG. 12C can be performed to form an epitaxial pedestal 11 in each memory opening 49.

Referring to FIG. 15C, a silicon nitride layer 564 can be formed by nitridation of inner portions of the insulating layers 32 and the annular etch stop material portions 253. A nitridation process can be performed to convert in inner annular region of each annular etch stop material portion 253, surface portions underlying physically exposed surfaces of the insulating layers 32 and the insulating cap layer 70, and surface portions of the epitaxial pedestals 11 into a silicon nitride layer 564. A thermal nitridation process or a plasma nitridation process can be employed. The thickness of the silicon nitride layer 564 can be in a range from 1.5 nm to 6 nm (such as from 2 nm to 4 nm), although lesser and greater thicknesses can also be employed. The silicon nitride layer 564 is a continuous layer that covers the entire inner surfaces of the memory openings 49 and extends over the insulating cap layer 70. The silicon nitride layer 564 functionally replaces the silicon nitride layer 564 of the second and third exemplary structures, and as such, is a tunneling dielectric sublayer.

Referring to FIG. 15D, an inner silicon oxide layer 566 can be formed on the silicon nitride layer 564. The inner silicon oxide layer 566 includes silicon oxide, and is employed as a tunneling dielectric sublayer. The silicon inner silicon oxide layer 566 can be formed by a process selected from deposition of a silicon oxide material and oxidation of an inner surface region of the silicon nitride layer 564. The thickness of the inner silicon oxide layer 566 can be in a range from 1 nm to 3 nm, although lesser and greater thicknesses can also be employed. The inner silicon oxide layer 566 and the silicon nitride layer 564 collectively constitute a tunneling dielectric sublayer stack (564, 566), and is herein referred to as a NO stack.

Subsequently, the optional first semiconductor channel layer can be deposited employing the processing steps of FIG. 3C. An anisotropic etch process can be performed to remove horizontal portions of the optional first semiconductor channel layer and the tunneling dielectric layer (564, 566). Each remaining portion of the first semiconductor channel layer in the memory openings 49 constitutes a first semiconductor channel portion 601. Horizontal portions of the tunneling dielectric layer are removed from above the insulating cap layer 70 and from within the areas of openings through the first semiconductor channel portions 601. A surface of the epitaxial channel portion 11 (or a surface of the semiconductor material layer 10 in case the epitaxial channel portions 11 are not employed) can be physically exposed underneath the opening through the first semiconductor channel portion 601 and the tunneling dielectric layer within each memory opening 49.

The processing steps of FIGS. 3E-3F can be sequentially performed to form a second semiconductor channel portion 602, a dielectric core 62, and a drain region 63 within each memory opening 49. Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A set of a vertical semiconductor channel 60, an inner silicon oxide layer 566 contacting the vertical semiconductor channel 60, a silicon nitride layer 564 contacting the inner silicon oxide layer 566, and all annular etch stop material portions 253 contacting the silicon nitride layer 564 collectively constitutes an in-process memory stack structure (60, 566, 564, 253), which is subsequently modified to form a memory stack structure.

Subsequently, the processing steps of FIGS. 5A and 5B can be performed to form backside contact trenches 79.

Figure 16A:
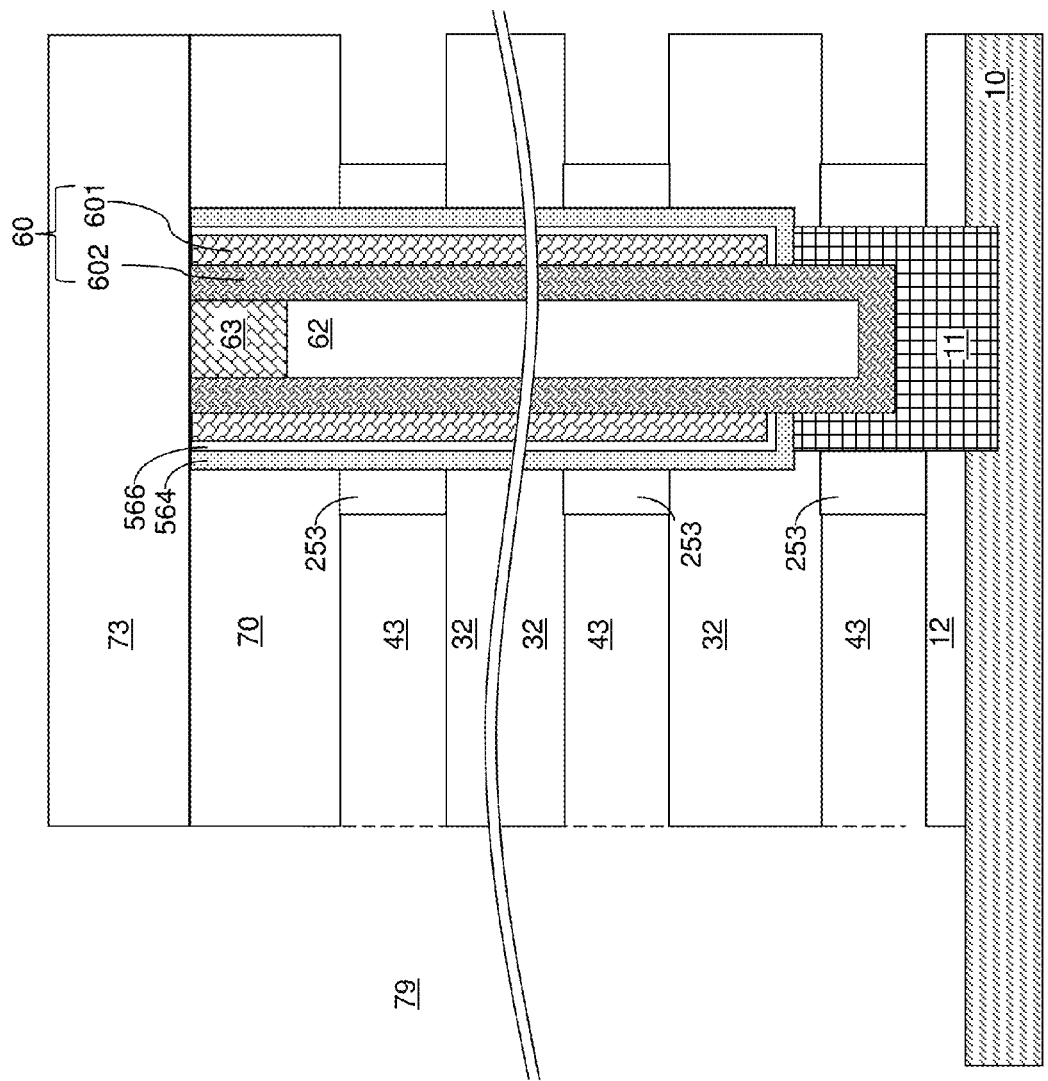
FIGS. 16A-16D are sequential vertical cross-sectional views of a memory opening within the fourth exemplary structure during various processing steps employed to form a continuous charge trapping material layer, continuous backside blocking dielectric layers, and electrically conductive layers according to the fourth embodiment of the present disclosure.

Referring to FIG. 16A, the processing steps of FIG. 6 can be performed to form backside recesses 43 as in the second embodiment.

Figure 16B:
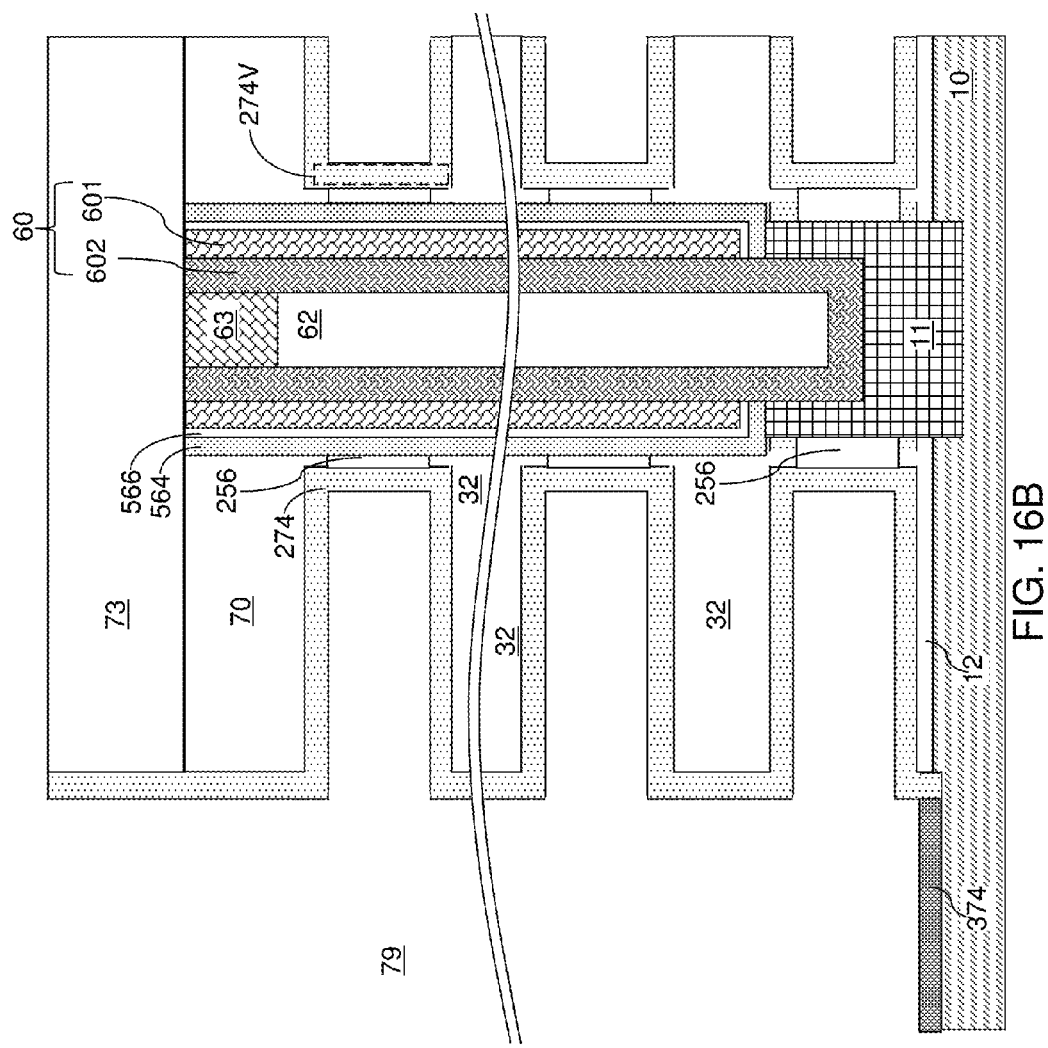

Referring to FIG. 16B, the annular etch stop material portions 253 can be partially converted into charge trapping material portions 274V including a dielectric compound comprising silicon and nitrogen by a nitridation process. The nitridation process can form a continuous charge trapping material layer 274 by nitridation of physically exposed surfaces of the insulating layers 32 and the annular etch stop material portions 253. The continuous charge trapping material layer 274 includes the dielectric compound comprising silicon and nitrogen, and continuously extends from the bottommost insulating layer 32 to the topmost insulating layer 32.

The nitridation process can be a thermal nitridation process or a plasma nitridation process as in the second embodiment. For example, the insulating layers 32, the insulating cap layer 70, and the contact level dielectric layer 73 can include silicon oxide, the semiconductor material layer 10 can include silicon, and the annular etch stop material portions 253 can include silicon oxide or silicon oxynitride. In this case, the continuous charge trapping material layer 274 can include a continuous silicon oxynitride layer. In one embodiment, a semiconductor nitride portion 374 can be formed by nitridation of a surface portion of the semiconductor material layer 10 underneath each backside contact trench 79 concurrently with formation of the continuous charge trapping material layer 274. A portion of the gate dielectric layer 12 may be converted into a portion of the continuous charge trapping material layer 274.

In one embodiment, the process parameters of the nitridation process can be selected such that only outer regions of each annular etch stop material portion 253 can be converted into vertical portions of the continuous charge trapping material layer 274 within an increase in nitrogen concentration, while the nitrogen concentration of the inner region of each annular etch stop material portion 253 remains substantially the same, i.e., does not change by more than 10%. In this case, each inner region of the annular etch stop material portions 253 can be annular silicon oxide portions and functions as an outer tunneling dielectric layer material of a tunneling dielectric layer. As such, the annular silicon oxide portions are referred to as outer tunneling dielectric portions 256.

In this case, the continuous charge trapping material layer 274 can include horizontal portions located between each vertically neighboring pair of a lateral recess 43 and an insulating layer 32, vertical portions contacting a respective outer tunneling dielectric portion 256, and additional vertical portions that contact each distal sidewall of the insulating layers 32.

Each vertical portion of the continuous charge trapping material layer 274 that contacts a respective outer tunneling dielectric portion 256 constitutes a charge trapping material portion 274V. In one embodiment, the sacrificial material layers 42 can include silicon nitride layers, the annular etch stop material portions 253 can be formed by conversion of surface portions of the silicon nitride layers (of the sacrificial material layers 42) into silicon oxide, and the nitridation process can convert the outer portion of each annular etch stop material portions 253 into the charge trapping material portions 274V.

Each set of a tunneling dielectric sublayer stack (566, 564) and all outer tunneling dielectric portion 256 that contact the tunneling dielectric sublayer stack (566, 564) constitutes a tunneling dielectric layer (566, 564, 256). The tunneling dielectric layer contacts each charge trapping material portion 274V that laterally surrounds the tunneling dielectric layer (566, 564, 256).

Figure 16C:
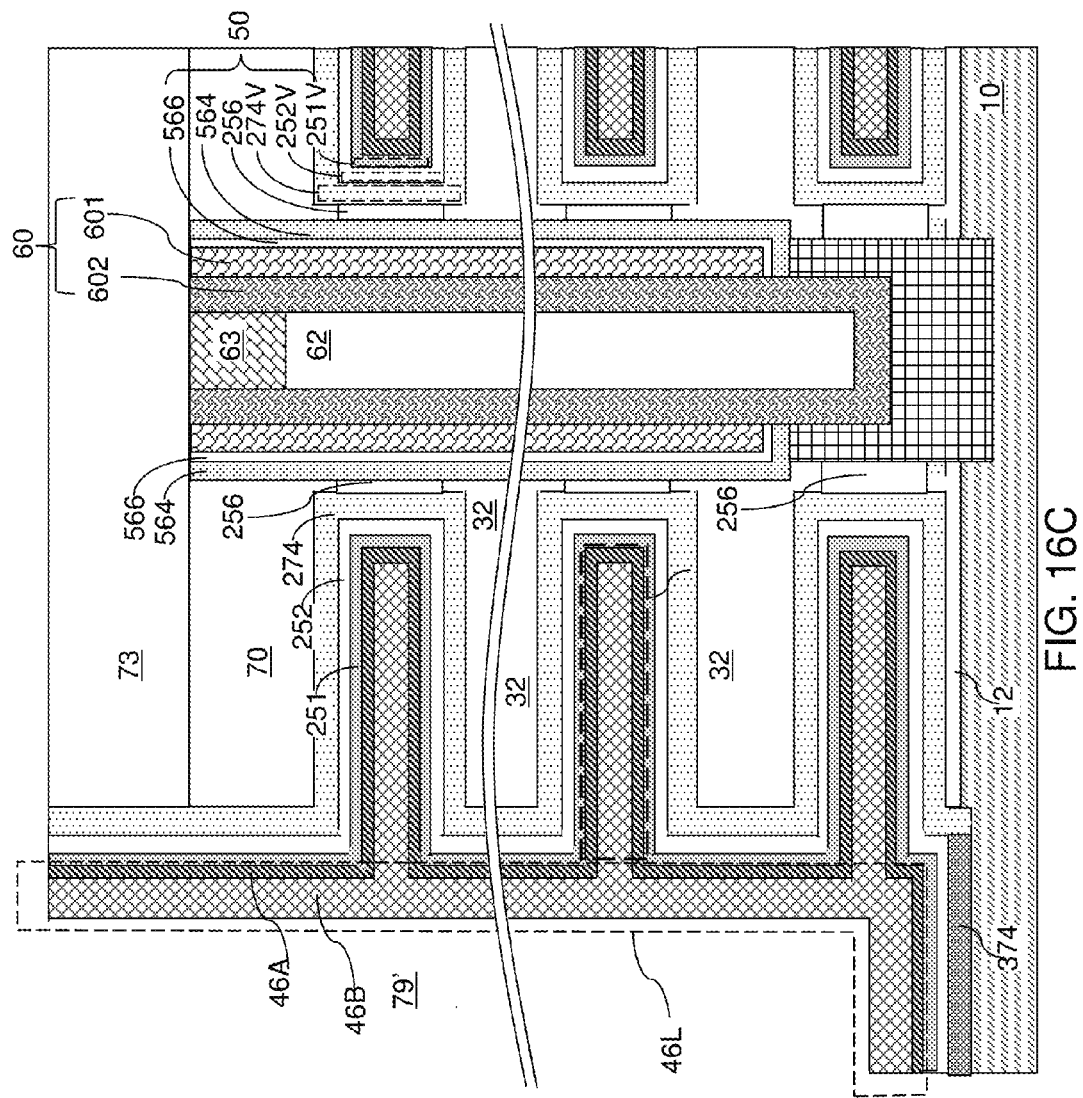

Referring to FIG. 16C, the processing steps of FIG. 13C can be performed to form at least one continuous backside blocking dielectric layer (252, 251) and at least one electrically conductive material layer (46A, 46B). Each continuous portion of the at least one electrically conductive material layer (46A, 46B) that fills a volume of a backside recess 43 constitutes an electrically conductive layer 46. The portions of the at least one electrically conductive material layer (46A, 46B) that do not belong to any of the electrically conductive layers 46 form a single continuous structure that are located within the backside contact trenches 79 or overlies the contact level dielectric layer 73, and are herein collectively referred to as a continuous conductive material layer 46L. A backside cavity 79' is present within each volume of the backside contact trenches 79 that is not filled with the continuous conductive material layer 46L.

Figure 16D:
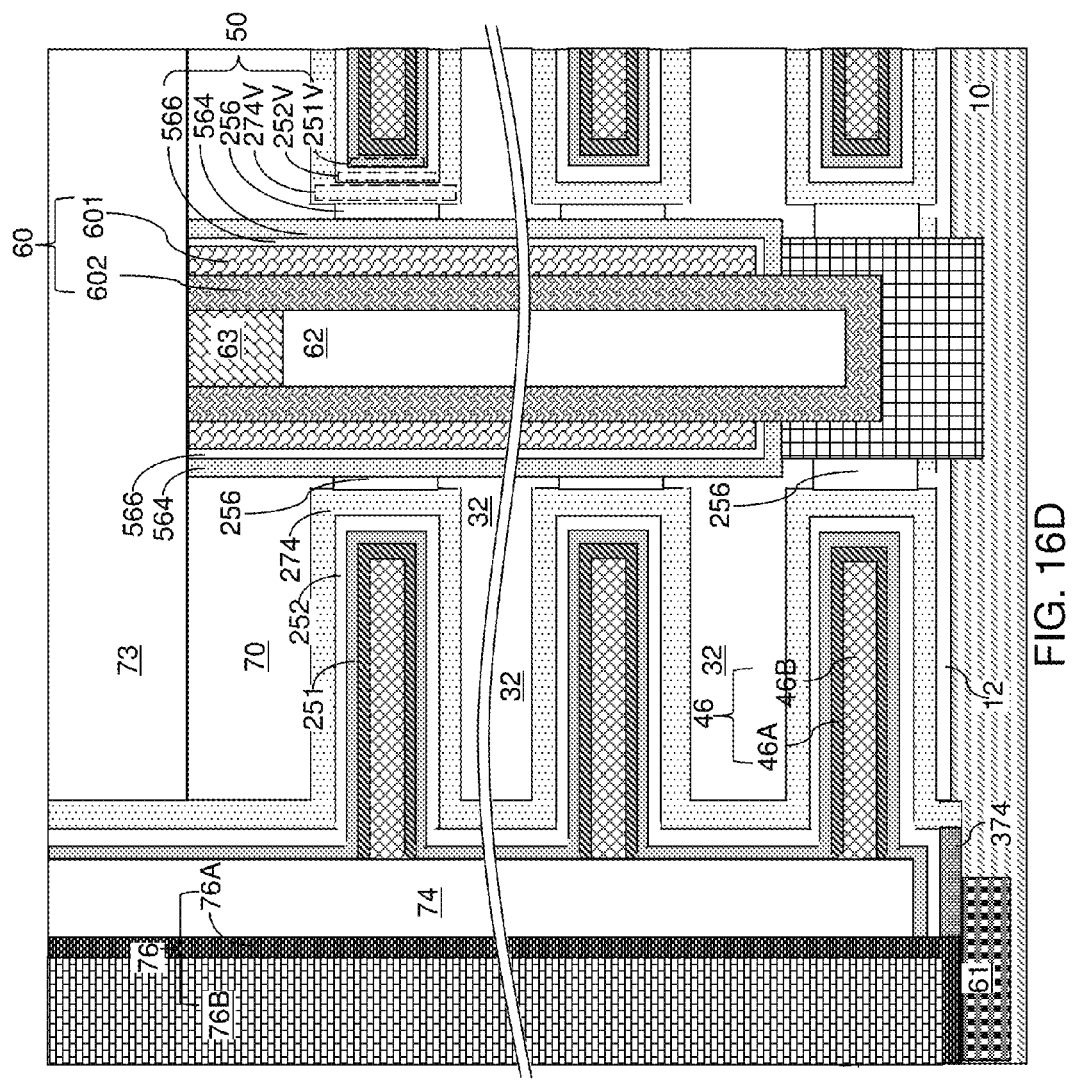

Referring to FIG. 16D, the processing steps of FIG. 9 can be performed to remove the continuous conductive material layer 46L from inside the backside contact trenches 79 and from above the contact level dielectric layer 73. Subsequently, the processing steps of FIG. 10 can be performed to form an insulating spacer 74, a source region 61, and a backside contact via structure 76 within, and underneath, each backside contact trench 79 as in the second embodiment.

In the fourth exemplary structure, the charge trapping material portions 274V are vertical portions of a continuous charge trapping material layer 274 that extends through an alternating stack (32, 46) of insulating layers 32 and electrically conductive layers 46. The continuous charge trapping material layer 274 includes horizontal portions located between each vertically neighboring pair of an electrically conductive layer 46 and an insulating layer 32 within the alternating stack (32, 46). The continuous charge trapping material layer 274 includes additional vertical portions that contact each distal sidewall of the insulating layers 32. In one embodiment, the continuous charge trapping material layer 274 comprises a continuous silicon oxynitride layer. In one embodiment, the tunneling dielectric layer (566, 564, 256) comprises an ONO stack that includes at least one silicon oxide portion (such as the outer tunneling dielectric portions 256), a silicon nitride layer 564, and a silicon oxide layer (such as the inner silicon oxide layer 566) that contacts the vertical semiconductor channel 60.

In the fourth embodiment, the nitridation process converts an outer region of each annular etch stop material portion 253 into the charge trapping material portions 274V. Each remaining inner region of the annular etch stop material portions 253 constitutes an outer tunneling dielectric portion 256 contacting the at least one tunneling dielectric sublayer (such as the silicon nitride layer 564). The at least one tunneling dielectric sublayer (566, 564) and the outer tunneling dielectric portions 256 collectively constitute the tunneling dielectric layer (566, 564, 256). The inner silicon oxide layer 566 within the tunneling dielectric sublayer stack (566, 564) may be formed within a volume entirety within the memory opening 49 by deposition of a dielectric material within the memory opening 49. Alternatively, the inner silicon oxide layer 566 within the tunneling dielectric sublayer stack (566, 564) can be formed outside the volume of the memory opening 49 by oxidation of an inner portion of the silicon nitride layer 564.

The tunneling dielectric layer (566, 564, 256) can include a plurality of discrete silicon oxide portions as embodied as the outer tunneling dielectric portions 256. The outer sidewall of the tunneling dielectric sublayer stack (566, 564) (i.e., the outer sidewall of the silicon nitride layer 564) can include first portions of sidewalls of the tunneling dielectric layer (566, 564, 256) that contact the proximal sidewalls of the insulating layers 32. The outer sidewalls of the outer tunneling dielectric portions 256 can include second portions of the outer sidewall of the tunneling dielectric layer (566, 564, 256) that are located at each level of the electrically conductive layer 46. The outer tunneling dielectric portions 256 do not vertically extend into levels of the insulating layers 32.

In case the tunneling dielectric layer (566, 564, 256) includes an ONO stack, the outer sidewalls of the silicon nitride layer 564 within the ONO stack comprises the first portions of the outer sidewall of the tunneling dielectric layer (566, 564, 256) that contact the proximal sidewalls of the insulating layers 32. The silicon nitride layer 564 within the ONO stack contacts inner sidewalls of each of the plurality of discrete silicon oxide portions, i.e., the outer tunneling dielectric portions 256.

Referring to FIG. 17A, a fifth exemplary structure according to a fifth embodiment of the present disclosure can be the same as the first exemplary structure illustrated in FIG. 3B. The epitaxial pedestals 11 are optional structures which may, or may not, be present.

Referring to FIG. 17B, an isotropic etch process is performed employing an etchant that etches the material of the sacrificial material layers 42 selective to the material of the insulating layers 32. If the sacrificial material layer 42 includes silicon nitride and if the insulating layers 32 include silicon oxide, a wet etch employing phosphoric acid can be employed to selectively etch the sacrificial material layers 42 and to form lateral indentations 149 around each memory opening 49. The lateral indentations 149 are formed around each memory opening 49 by laterally recessing the sacrificial material layers 42 around each memory opening with respect to proximal sidewalls of the insulating layers 32. The lateral etch distance can be in a range from 3 nm to 20 nm, such as from 4 nm to 12 nm, although lesser and greater lateral etch distances can also be employed.

Referring to FIG. 17C, annular etch stop material portions 453 including a silicon-containing semiconductor material can be formed within the lateral indentations 149. The annular etch stop material portions 453 can be formed by conformally depositing the silicon-containing semiconductor material layer, for example, by low pressure chemical vapor deposition or atomic layer deposition, and by anisotropically etching the semiconductor material layer to leave discrete portions 453. The silicon-containing semiconductor material can include silicon or a silicon-containing semiconductor material such as silicon-germanium alloy. The silicon-containing semiconductor material may be amorphous or polycrystalline. In one embodiment, the top surface of each epitaxial pedestal 11 may be collaterally recessed. Each annular etch stop material portion 453 are discrete portions of the silicon-containing semiconductor material. The annular etch stop material portions 453 can have a thickness (as measured along a radial direction) in a range from 3 nm to 20 nm, such as from 4 nm to 12 nm, although lesser and greater lateral etch distances can also be employed.

Referring to FIG. 17D, the processing steps of FIG. 12D can be performed to form a tunneling dielectric layer 556, a vertical semiconductor channel 60, a dielectric core 62, and a drain region 63 within each memory opening 49.

Subsequently, the processing steps of FIGS. 5A and 5B can be performed to form backside contact trenches 79.

Figure 18A:
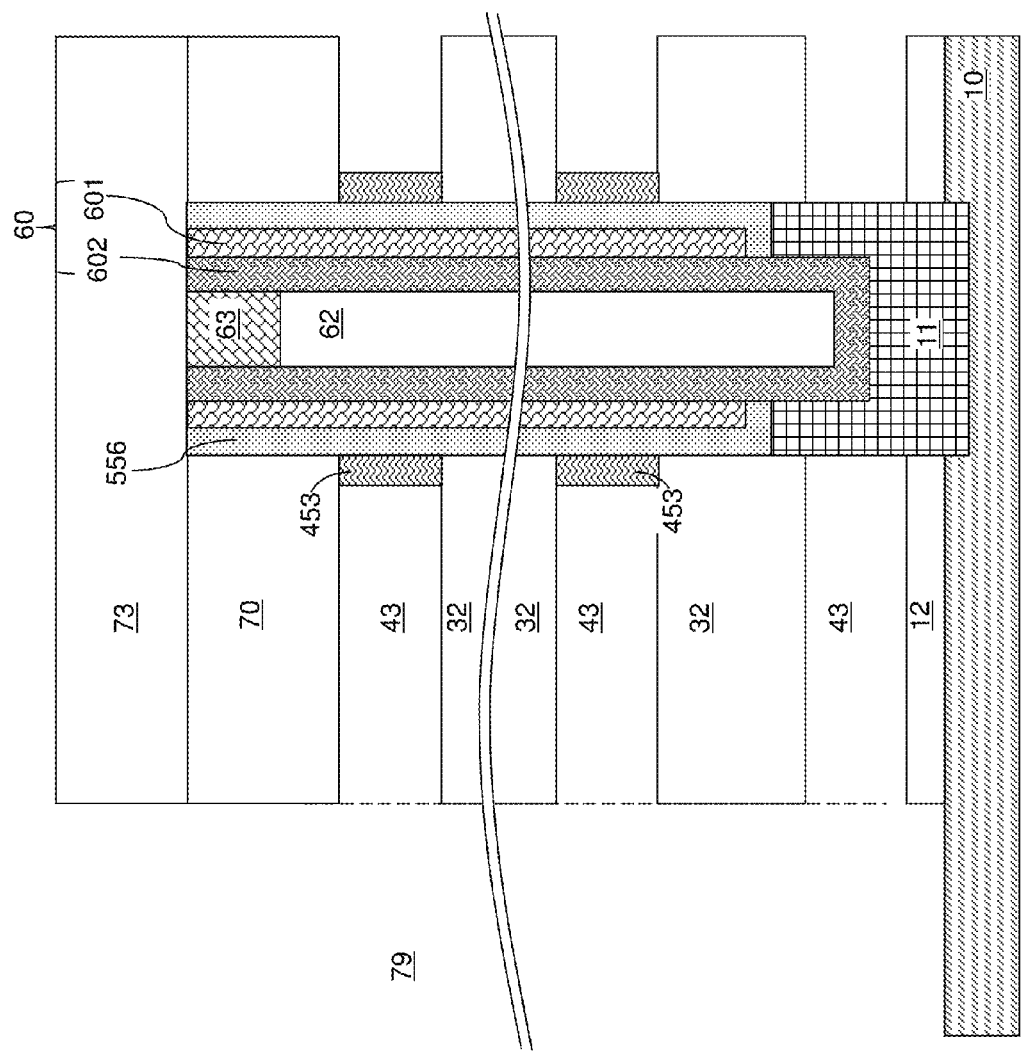
FIGS. 18A-18D are sequential vertical cross-sectional views of a memory opening within the fifth exemplary structure during various processing steps employed to form a continuous charge trapping material layer, continuous backside blocking dielectric layers, and electrically conductive layers according to the fifth embodiment of the present disclosure.

Referring to FIG. 18A, the processing steps of FIG. 6 can be performed to form backside recesses 43. Specifically, the backside recesses 43 are formed by removing the sacrificial material layers 42 selective to the annular etch stop material portions 453, the insulating layers 32, and the semiconductor material layer 10. In one embodiment, the sacrificial material layers 42 can include silicon nitride, the annular etch stop material portions 453 can include amorphous silicon or polysilicon, and the sacrificial material layers 42 can be removed by a wet etch employing phosphoric acid.

Figure 18B:
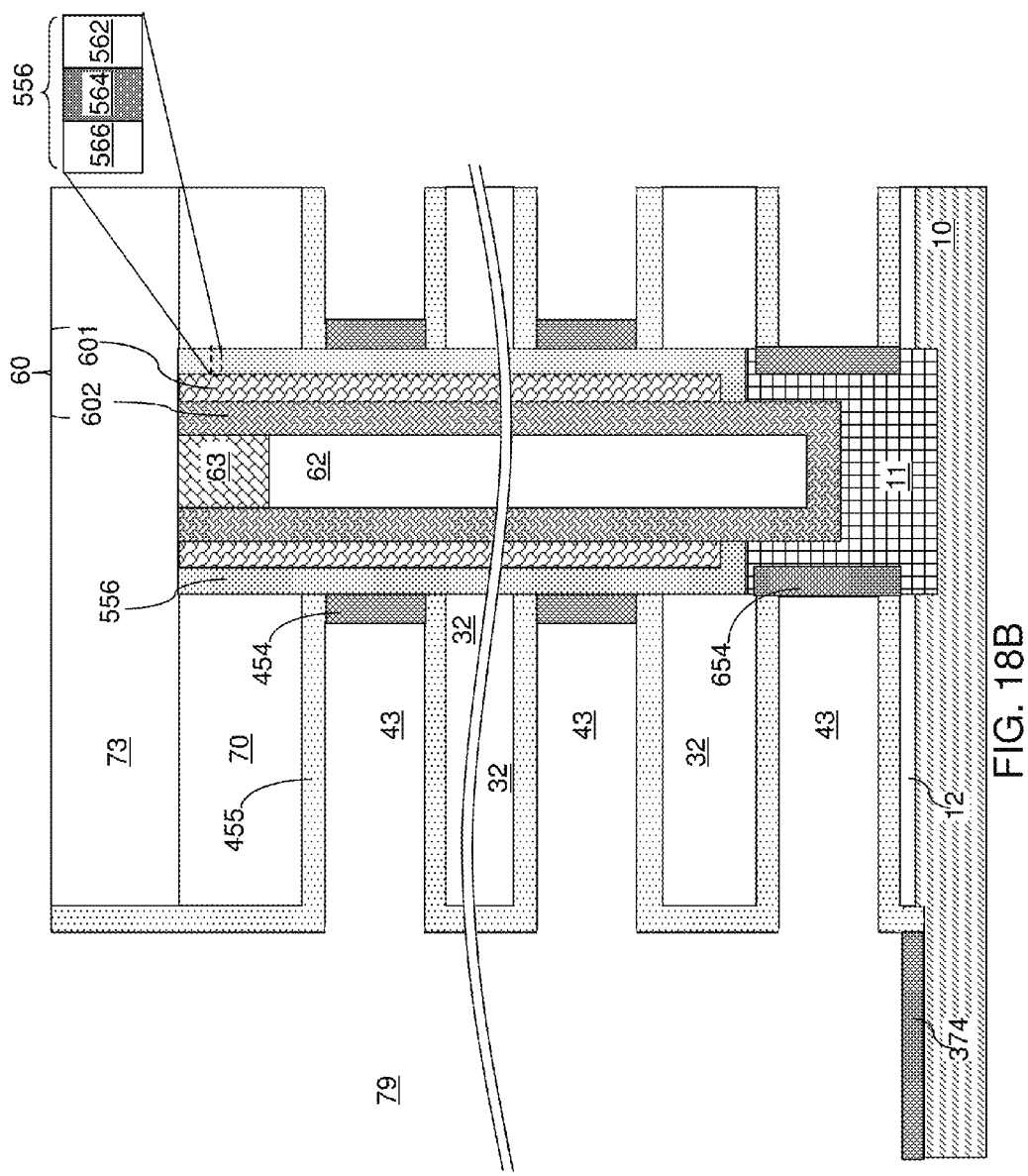

Referring to FIG. 18B, the annular etch stop material portions 453 can be converted into charge trapping material portions 454 including a dielectric compound comprising silicon and nitrogen by a nitridation process. The charge trapping material portions 454 can be formed as discrete silicon nitride portions by nitridation of the annular etch stop material portions 453. If the annular etch stop material portions 453 include silicon, the charge trapping material portions 454 can include silicon nitride. Each charge trapping material portion 454 can be formed as a discrete annular structure located at the level of a respective backside recess 43. An annular silicon nitride spacer 654 can be formed by conversion of a surface portion of each epitaxial pedestal 11 to a silicon nitride portion during the nitridation process.

Physically exposed surfaces of the insulating layers 32, the insulating cap layer 70, the contact level dielectric layer 73, and the gate dielectric layer 12 are nitrided to form silicon oxynitride layers 455. Each silicon oxynitride layer 455 includes silicon oxynitride, and extends between a respective vertically neighboring pair of charge trapping material portions 454 located at a vertically neighboring pair of backside recesses 43, above the topmost charge trapping material portion 454, or on a remaining portion of the gate dielectric layer 12. The silicon oxynitride layers 455 are vertically spaced from one another. Each of the silicon oxynitride layers 455 contacts at least one of the silicon nitride portions 454. A subset of the silicon oxynitride layers 455 can include an upper horizontal portion contacting the tunneling dielectric layer 556, a lower horizontal portion contacting the tunneling dielectric layer 556, and a vertical portion contacting a distal sidewall of a respective insulating layer 32.

The nitridation process can be a thermal nitridation process or a plasma nitridation process. In one embodiment, the process parameters of the nitridation process can be selected such that the entirety of each annular etch stop material portion 453 can be converted into a respective charge trapping material portion 454. Each silicon oxynitride layer 455 can be adjoined to at least one charge trapping material portion 454. If multiple in-process memory stack structures (454, 556, 60) are present within the fifth exemplary structure, each of the silicon oxynitride layers 455 can contact at least as many charge trapping material portions 454 as the number of in-process memory stack structures (454, 556, 60). A tunneling dielectric layer 556 including the at least one tunneling dielectric sublayer (562, 564, 566) contacts each of the charge trapping material portions 454.

Figure 18C:
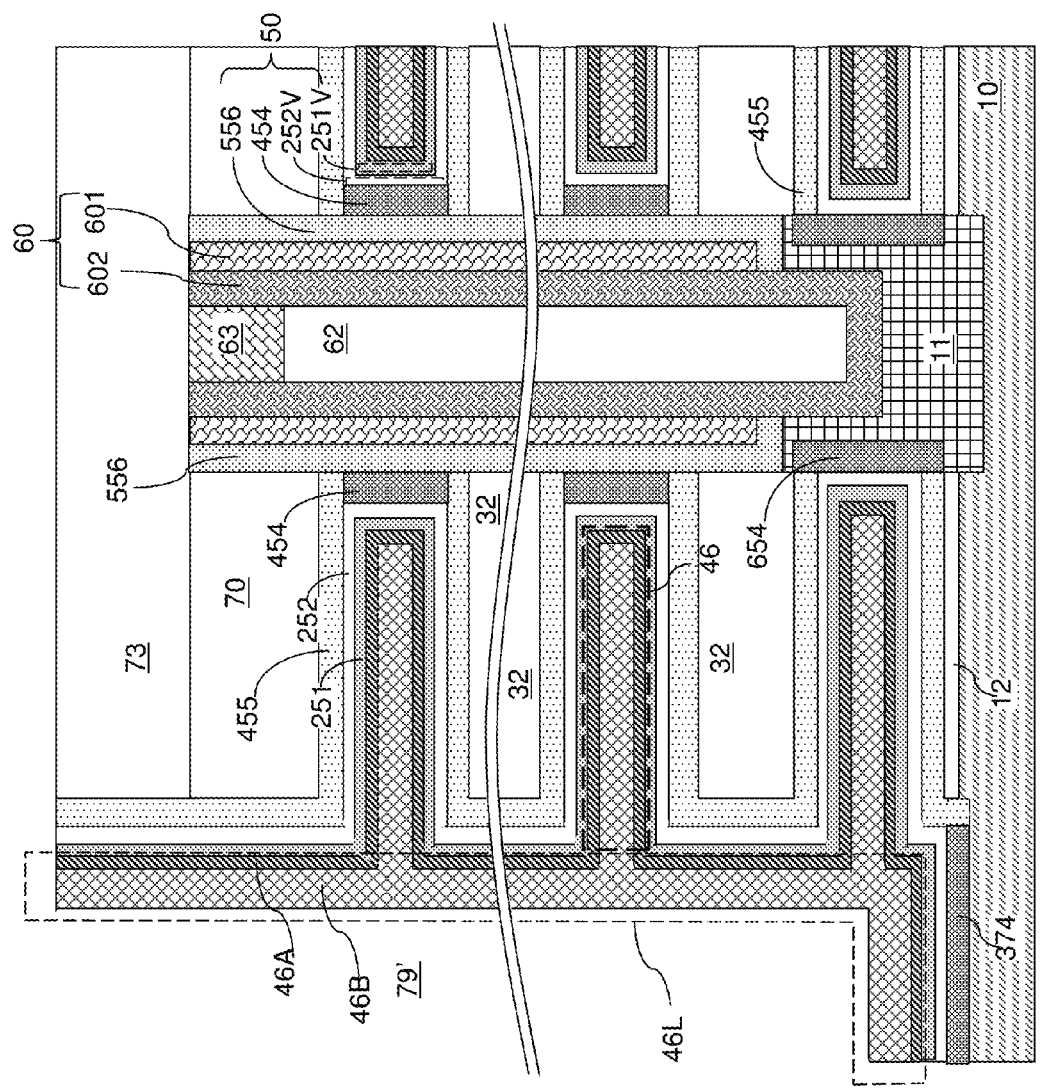

Referring to FIG. 18C, at least one continuous backside blocking dielectric layer (252, 251) can be formed in the backside recesses 43 and the backside contact trenches 79 by at least one conformal deposition process. For example, the at least one continuous backside blocking dielectric layer (252, 251) can include a continuous dielectric silicon compound layer 252 and a continuous dielectric metal oxide layer 251. In one embodiment, the continuous dielectric silicon compound layer 252 can be a silicon oxide layer having a thickness in a range from 1 nm to 6 nm, although lesser and greater thicknesses can also be employed. The continuous dielectric metal oxide layer 251 can be an aluminum oxide layer having a thickness in a range from 1.5 nm to 6 nm, although lesser and greater thicknesses can also be employed. Each of the continuous dielectric silicon compound layer 252 and the continuous dielectric metal oxide layer 251 can have a respective uniform thickness throughout, and can be deposited by a respective conformal deposition process such as chemical vapor deposition (CVD) or atomic layer deposition (ALD). Each of the at least one continuous backside blocking dielectric layer (252, 251) continuously extends from the bottommost insulating layer 32 to the topmost insulating layer 32, and can extend from the gate dielectric layer 12 to the contact level dielectric layer 73.

At least one electrically conductive material layer (46A, 46B) can be subsequently deposited on the at least one continuous backside blocking dielectric layer (252, 251). The at least one electrically conductive material layer (46A, 46B) can include, for example, a conductive metallic liner 46A that includes a conductive metallic nitride (such as TiN, TaN, or WN) and a conductive metal layer 46B that consists essentially of at least one metal. The at least one metal of the conductive metal layer 46B can be a single elemental metal (such as W, Co, Cu, or Al), or can be an intermetallic alloy of at least two elemental metals. Each of the conductive metallic liner 46A and the conductive metal layer 46B can be deposited by a conformal deposition process such as chemical vapor deposition or atomic layer deposition. The thickness of the conductive metallic liner 46A can be in a range from 1 nm to 6 nm, although lesser and greater thicknesses can also be employed. The thickness of the conductive metal layer 46B (as measured over a sidewall of a backside contact trench 79) can be selected such that the entirety of the backside recesses 43 is filled with deposited material layers that include the at least one continuous backside blocking dielectric layer (252, 251) and the at least one electrically conductive material layer (46A, 46B).

Each continuous portion of the at least one electrically conductive material layer (46A, 46B) that fills a volume of a backside recess 43 constitutes an electrically conductive layer 46. The portions of the at least one electrically conductive material layer (46A, 46B) that do not belong to any of the electrically conductive layers 46 form a single continuous structure that are located within the backside contact trenches 79 or overlies the contact level dielectric layer 73, and are herein collectively referred to as a continuous conductive material layer 46L. A backside cavity 79' is present within each volume of the backside contact trenches 79 that is not filled with the continuous conductive material layer 46L.

Around each memory opening 49, a set of a tunneling dielectric layer 556, all charge trapping material portions 454 contacting the tunneling dielectric layer 556, vertical dielectric silicon compound portions 252V (which are vertical portions of the dielectric silicon compound layer 252) that contact the tunneling dielectric layer 556, vertical dielectric metal oxide portions 251V (which are vertical portions of the dielectric metal oxide layer 251) constitutes a memory film 50. Each adjoining set of a memory film 50 and a vertical semiconductor channel 60 constitutes a memory stack structure (50, 60).

Figure 18D:
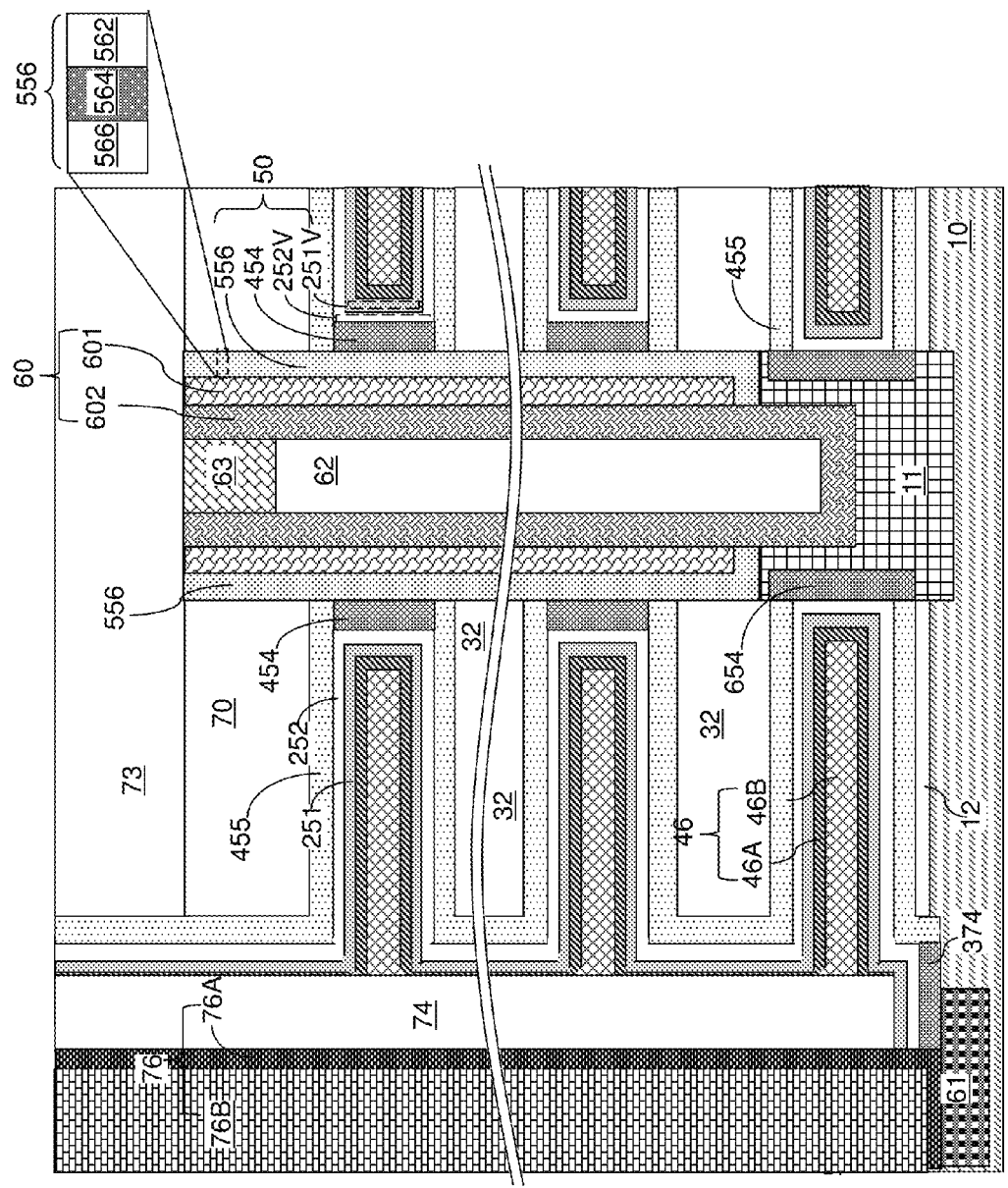

Referring to FIG. 18D, the processing steps of FIG. 9 can be performed to remove the continuous conductive material layer 46L from inside the backside contact trenches 79 and from above the contact level dielectric layer 73. Subsequently, the processing steps of FIG. 10 can be performed. Specifically, an insulating spacer 74 can be formed by deposition of a conformal insulating material layer and an anisotropic etch that removes horizontal portions of the conformal insulating material layer. The anisotropic etch can remove portions of the at least one continuous backside blocking dielectric layer (252, 251) and the semiconductor nitride portions 374 that underlie the backside cavities 79', i.e., within the areas of the openings defined by the insulating spacers 74.

A source region 61 can be formed at the bottom of each backside cavity 79' by implantation of electrical dopants into surface portions of the semiconductor material layer 10 that underlie an opening through the insulating spacer 74. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can underlie a respective insulating spacer 74.

A contact via structure 76 can be formed within each cavity 79'. Each contact via structure 76 can fill a respective cavity 79'. Each contact via structure 76 can be formed inside an insulating spacer 74 located within a respective backside contact trench 79. The contact via structures 76 can be formed by depositing at least one conductive material in each remaining unfilled volume (i.e., the cavities 79') of the backside contact trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof. Alternatively, the portions 76A and 76B may comprise a metal, such as W, and doped polysilicon.

The at least one conductive material can be planarized, for example, by chemical mechanical planarization (CMP). Each remaining continuous portion of the at least one conductive material in the backside contact trenches 79 constitutes a backside contact via structure 76. Each contact via structure 76 can be formed directly on a top surface of a source region 61.

Subsequently, the processing steps of FIG. 11 can be performed to form various additional contact via structures as in the first embodiment.

In the fifth exemplary structure, the charge trapping material portions 454 comprise discrete silicon nitride portions that are located at each level of the electrically conductive layers 46 and do not vertically extend to levels of the insulating layers 32. The silicon oxynitride layers 455 are vertically spaced from one another. A subset of the silicon oxynitride layers 455 contacts at least one of the silicon nitride portions (i.e., the charge trapping material portions 454), and includes an upper horizontal portion contacting the tunneling dielectric layer 556, a lower horizontal portion contacting the tunneling dielectric layer 556, and a vertical portion contacting a distal sidewall of the respective insulating layer 32. Each memory stack structure (50, 60) extends through the alternating stack (32, 46) of the insulating layers 32 and the electrically conductive layers 46, and comprises a tunneling dielectric layer 556 and a vertical semiconductor channel 60. First portions of an outer sidewall of the tunneling dielectric layer 556 (i.e., first portions of the outer silicon oxide layer 562) contact proximal sidewalls of the insulating layers 32. The charge trapping material portions 454 are located at each level of the electrically conductive layers 46, and comprise a dielectric compound including silicon and nitrogen (such as silicon nitride), and contact second portions of the outer sidewall of the tunneling dielectric layer 556 (i.e., second portions of the outer silicon oxide layer 562).

Each of the second through fifth exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a charge trapping material portion (274V or 454) at a level of an electrically conductive layer 46) in a first device level of the array of monolithic three-dimensional NAND strings can be located over another memory cell (as embodied as another charge trapping material portion (274V or 454) at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels extends substantially perpendicular to a top surface of the substrate (9, 10); and a plurality of charge storage elements (comprising charge trapping material portions (274V or 454)). Each charge storage element can be located adjacent to a respective one of the plurality of semiconductor channels.

The charge trapping material portions (274V or 454) are vertically electrically isolated from one another by the insulating layers 32. The charge trapping material portions 274V may comprise silicon oxynitride having at least 15 atomic percent nitrogen, while portion 454 may comprise silicon nitride. Portions of the continuous charge trapping material layer 274 or a silicon oxynitride layer 455 between a vertically neighboring pair of charge trapping material portions (274V or 454) provide a sufficiently high electrical resistance and long path length around the distal side of the insulating layers 32 to effectively eliminate leakage current between vertically neighboring pairs of charge trapping material portions (274V or 454). Thus, interference between vertically neighboring charges stored in the charge trapping material portions (274V or 454) can be eliminated or minimized, and threshold voltages for controlling various operations on the memory elements can be independent of data stored in the charge trapping material portions (274V or 454). Thus, reliability and operability of the three-dimensional memory device can be enhanced by the charge trapping material portions (274V or 454) of the present disclosure.

The charge trapping material portions (274V or 454) (i.e., charge storage regions) are self-segregated. Therefore, no separate etch steps are needed to remove the charge storage material (i.e., silicon nitride or oxynitride) material between each device level adjacent to the insulating layers 32. Furthermore, the charge trapping material portions (274V or 454) do not occupy memory opening 49 volume, thereby permitting a smaller memory opening diameter and higher device density.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate;
   a memory stack structure extending through the alternating stack and comprising a tunneling dielectric layer and a vertical semiconductor channel, wherein first portions of an outer sidewall of the tunneling dielectric layer contact proximal sidewalls of the insulating layers; and charge trapping material portions located at each level of the electrically conductive layers, comprising a dielectric compound including silicon and nitrogen, and contacting second portions of the outer sidewall of the tunneling dielectric layer.

2. The three-dimensional memory device of claim 1, wherein the charge trapping material portions are vertical portions of a continuous charge trapping material layer that extends through the alternating stack, including horizontal portions located between each vertically neighboring pair of an electrically conductive layer and an insulating layer within the alternating stack, and including additional vertical portions that contact each distal sidewall of the insulating layers.

3. The three-dimensional memory device of claim 2, wherein the continuous charge trapping material layer comprises a continuous silicon oxynitride layer.

4. The three-dimensional memory device of claim 3, wherein the tunneling dielectric layer comprises an ONO stack that includes at least one silicon oxide portion, a silicon nitride layer, and a silicon oxide layer that contacts the vertical semiconductor channel.

5. The three-dimensional memory device of claim 4, wherein the at least one silicon oxide portion comprises a continuous silicon oxide layer that includes the outer sidewall of the tunneling dielectric layer and continuously extending through a plurality of layers within the alternating stack.

6. The three-dimensional memory device of claim 4, wherein the at least one silicon oxide portion comprises a plurality of discrete silicon oxide portions that include the second portions of the outer sidewall of the tunneling dielectric layer, are located at each level of the electrically conductive layer, and do not vertically extend into levels of the insulating layers.

7. The three-dimensional memory device of claim 6, wherein:
outer sidewalls of the silicon nitride layer within the ONO stack comprises the first portions of the outer sidewall of the tunneling dielectric layer; and
the silicon nitride layer within the ONO stack contacts inner sidewalls of each of the plurality of discrete silicon oxide portions.

8. The three-dimensional memory device of claim 3, wherein the charge trapping material portions comprise a first silicon oxynitride material, and horizontal portions of the continuous silicon oxynitride layer comprise a second silicon oxynitride material having a lesser average nitrogen concentration than the first silicon oxynitride material.

9. The three-dimensional memory device of claim 1, wherein the charge trapping material portions comprise discrete silicon nitride portions that are located at each level of the electrically conductive layers and do not vertically extend to levels of the insulating layers.

10. The three-dimensional memory device of claim 9, further comprising silicon oxynitride layers that are vertically spaced from one another, wherein a subset of the silicon oxynitride layers contacts at least one of the silicon nitride portions, and includes an upper horizontal portion contacting the tunneling dielectric layer, a lower horizontal portion contacting the tunneling dielectric layer, and a vertical portion contacting a distal sidewall of the respective insulating layer.

11. The three-dimensional memory device of claim 1, further comprising a continuous backside blocking dielectric layer extending through the alternating stack, contacting each of the charge trapping material portions, and located between each vertically neighboring pair of an insulating layer and an electrically conductive layer within the alternating stack.

12. The three-dimensional memory device of claim 1, wherein the alternating stack comprises a terrace region in which each electrically conductive layer other than a topmost electrically conductive layer within the alternating stack laterally extends farther than any overlying electrically conductive layers within the alternating stack, and the terrace region includes stepped surfaces of the alternating stack that continuously extend from a bottommost layer within the alternating stack to a topmost layer within the alternating stack.

13. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

14. A method of forming a three-dimensional memory device, comprising:
forming an alternating stack of insulating layers and sacrificial material layers over a substrate;
forming a memory opening through the alternating stack;
forming a silicon containing material in the memory opening;
forming a memory stack structure comprising at least one tunneling dielectric sublayer of a tunneling dielectric layer and a vertical semiconductor channel over the silicon containing material in the memory opening;
forming backside recesses by removing the sacrificial material layers selective to the silicon containing material;
at least partially converting the silicon containing material into charge trapping material portions including a dielectric compound comprising silicon and nitrogen by a nitridation process through the backside recesses; and forming electrically conductive layers in the backside recesses.

15. The method of claim 14, wherein:
forming the silicon containing material comprises forming annular etch stop material portions which contain silicon at each level of the sacrificial material layers around the memory opening; and
the tunneling dielectric layer further comprises at least one tunneling dielectric portion which contacts each of the charge trapping material portions.

16. The method of claim 15, wherein the nitridation process forms a continuous charge trapping material layer by nitridation of physically exposed surfaces of the insulating layers and the annular etch stop material portions.

17. The method of claim 15, wherein:
the sacrificial material layers comprise silicon nitride layers; and
the annular etch stop material portions are formed by oxidation of inner portions of the silicon nitride layers that are exposed in the memory openings into silicon oxide or silicon oxynitride portions.

18. The method of claim 17, wherein the nitridation process converts an entirety of each annular etch stop material portions into the charge trapping material portions.

19. The method of claim 17, wherein the nitridation process converts an outer region of each annular etch stop material portion into the charge trapping material portions, wherein each remaining inner region of the annular etch stop material portions constitutes an outer tunneling dielectric portion contacting the at least one tunneling dielectric sublayer, wherein the at least one tunneling dielectric sublayer and the outer tunneling dielectric portions collectively constitute the tunneling dielectric layer.

20. The method of claim 17, wherein each layer within the at least one tunneling dielectric sublayer is formed within a volume entirety within the memory opening at least by deposition of a respective material within the memory opening.

21. The method of claim 17, wherein the at least one tunneling dielectric sublayer comprises:
a silicon nitride sublayer formed by nitridation of inner portions of the insulating layers and the annular etch stop material portions; and
a silicon oxide sublayer formed by a process selected from deposition of a silicon oxide material and oxidation of an inner surface region of the silicon nitride layer.

22. The method of claim 15, wherein the nitridation process forms:
discrete silicon nitride portions by nitridation of the annular etch stop material portions; and
silicon oxynitride layers that are vertically spaced from one another, wherein a subset of the silicon oxynitride layers contacts at least one of the silicon nitride portions, and includes an upper horizontal portion contacting the tunneling dielectric layer, a lower horizontal portion contacting the tunneling dielectric layer, and a vertical portion contacting a distal sidewall of a respective insulating layer.

23. The method of claim 15, further comprising:
forming lateral indentations around the memory opening by laterally recessing the sacrificial material layers around the memory opening with respect to proximal sidewalls of the insulating layers; and
depositing a silicon-containing semiconductor material in the lateral indentations, wherein the annular etch stop material portions are discrete portions of the silicon-containing semiconductor material.

24. The method of claim 15, further comprising forming a continuous backside blocking dielectric layer in the backside recesses, wherein the electrically conductive layers are formed on the continuous backside blocking dielectric layer.

25. The method of claim 14, further comprising formed a terrace region by patterning the alternating stack, wherein each sacrificial material layer other than a topmost sacrificial material layer within the alternating stack laterally extends farther than any overlying sacrificial material layer within the alternating stack, and the terrace region includes stepped surfaces of the alternating stack that continuously extend from a bottommost layer within the alternating stack to a topmost layer within the alternating stack.

26. The method of claim 14, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *